(12) United States Patent
Koike et al.

(10) Patent No.: US 11,227,646 B2
(45) Date of Patent: Jan. 18, 2022

(54) MAGNETIC MEMORY

(71) Applicant: Kioxia Corporation, Tokyo (JP)

(72) Inventors: Masahiro Koike, Tokyo (JP); Michael Arnaud Quinsat, Yokohama Kanagawa (JP); Nobuyuki Umetsu, Kawasaki Kanagawa (JP); Tsutomu Nakanishi, Yokohama Kanagawa (JP); Yasuaki Ootera, Yokohama Kanagawa (JP); Tsuyoshi Kondo, Kawasaki Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/018,332

(22) Filed: Sep. 11, 2020

(65) Prior Publication Data
US 2021/0295889 A1    Sep. 23, 2021

(30) Foreign Application Priority Data
Mar. 23, 2020    (JP) .............................. JP2020-050852

(51) Int. Cl.
| | | |
|---|---|---|
| G11C 11/16 | (2006.01) | |
| G11C 5/06 | (2006.01) | |
| H01L 27/22 | (2006.01) | |

(52) U.S. Cl.
CPC ............ G11C 11/1673 (2013.01); G11C 5/06 (2013.01); G11C 11/161 (2013.01); G11C 11/1675 (2013.01); H01L 27/222 (2013.01)

(58) Field of Classification Search
None
See application file for complete search history.

(56) References Cited

U.S. PATENT DOCUMENTS

| | | | |
|---|---|---|---|
| 9,153,340 B2 * | 10/2015 | Morise ................... | G11C 19/02 |
| 9,184,212 B2 | 11/2015 | Morise et al. | |
| 2009/0310241 A1 * | 12/2009 | Lee ........................ | G11C 11/161 |
| | | | 360/55 |
| 2021/0249061 A1 | 8/2021 | Arnaud Quinsat et al. | |

FOREIGN PATENT DOCUMENTS

| | | |
|---|---|---|
| JP | 6172850 B2 | 8/2017 |
| JP | 6184680 B2 | 8/2017 |
| JP | 2021-125642 A | 8/2021 |

* cited by examiner

*Primary Examiner* — James G Norman
(74) *Attorney, Agent, or Firm* — Finnegan, Henderson, Farabow, Garrett & Dunner L.L.P.

(57) ABSTRACT

According to one embodiment, a device includes a member including a first portion having a first dimension in first direction, a second portion spaced from the first portion and having a second dimension in the first direction, a third portion between the first and second portions and having a third dimension in the first direction, and a fourth portion between the first and third portions and having a fourth dimension in the first direction; and a circuit to supply a shift pulse including first and second pulses to the member and move a domain wall in the member. The third dimension is less than the first dimension. The second and fourth dimensions are less than the third dimension. A second value of the second pulse is less than a first value of the first pulse.

19 Claims, 28 Drawing Sheets

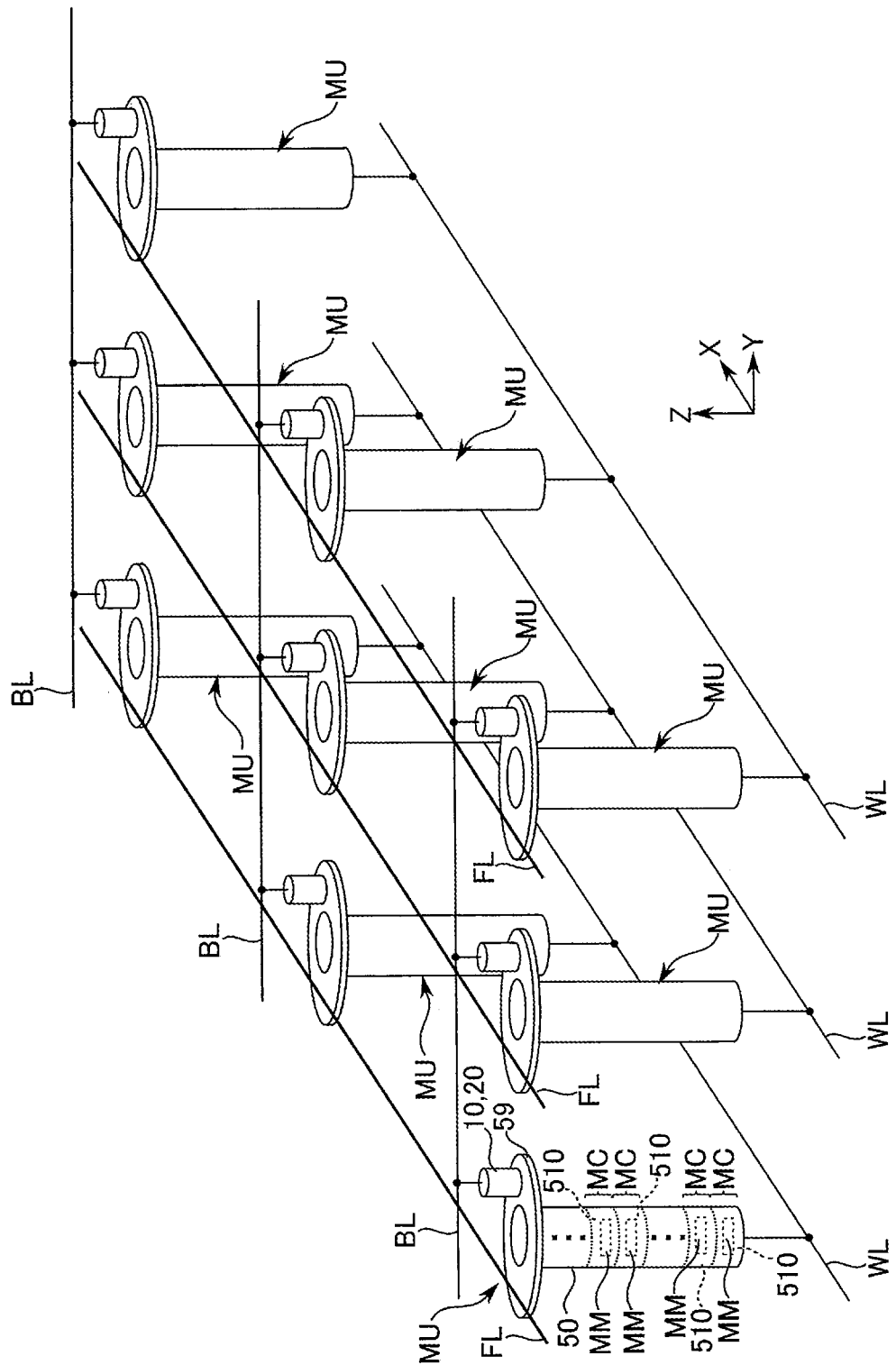
F I G. 2

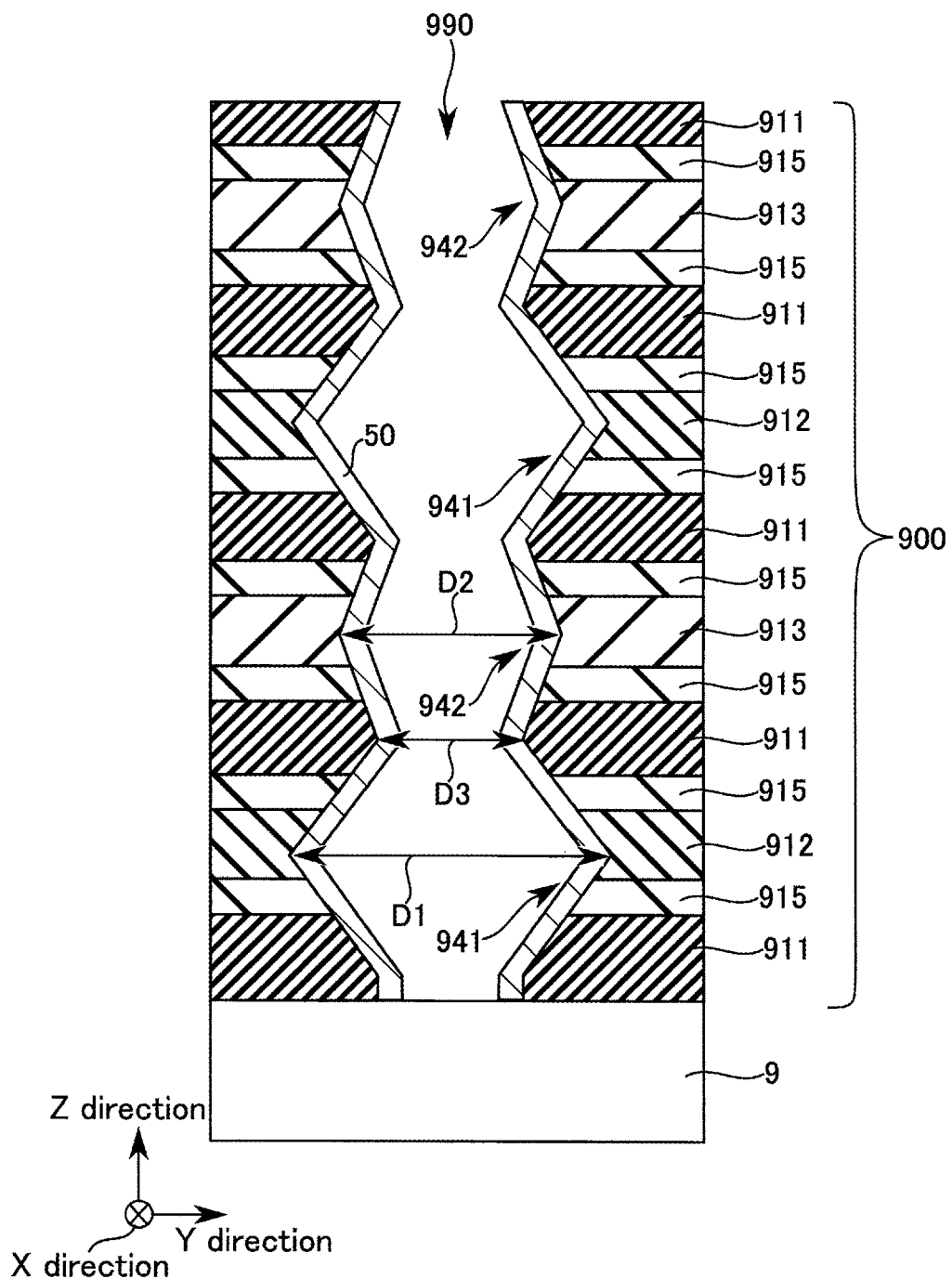
F I G. 9

(a) Prior to shift pulse supply (b) At time of supply of pulse P1

(d) At time of supply of pulse P2

(e) Relaxation period $t_{rx2}$

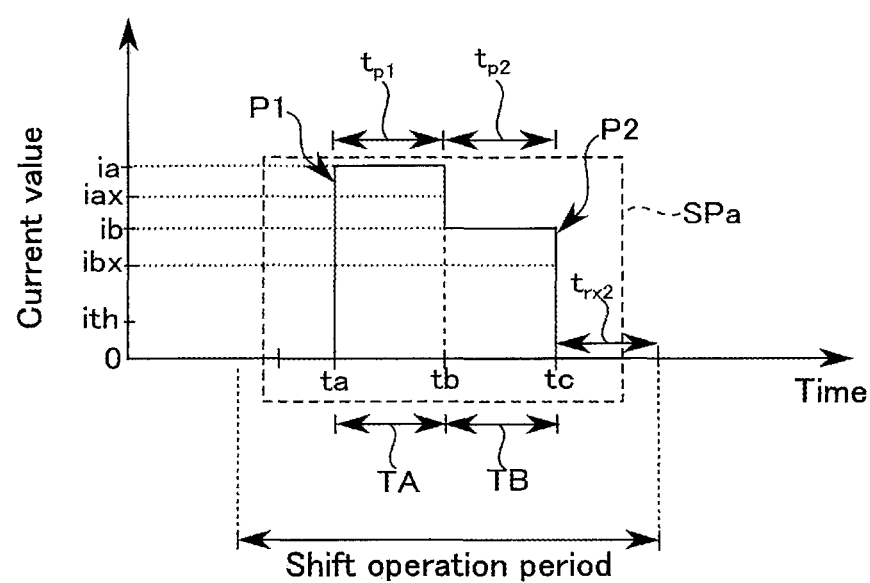
F I G. 20

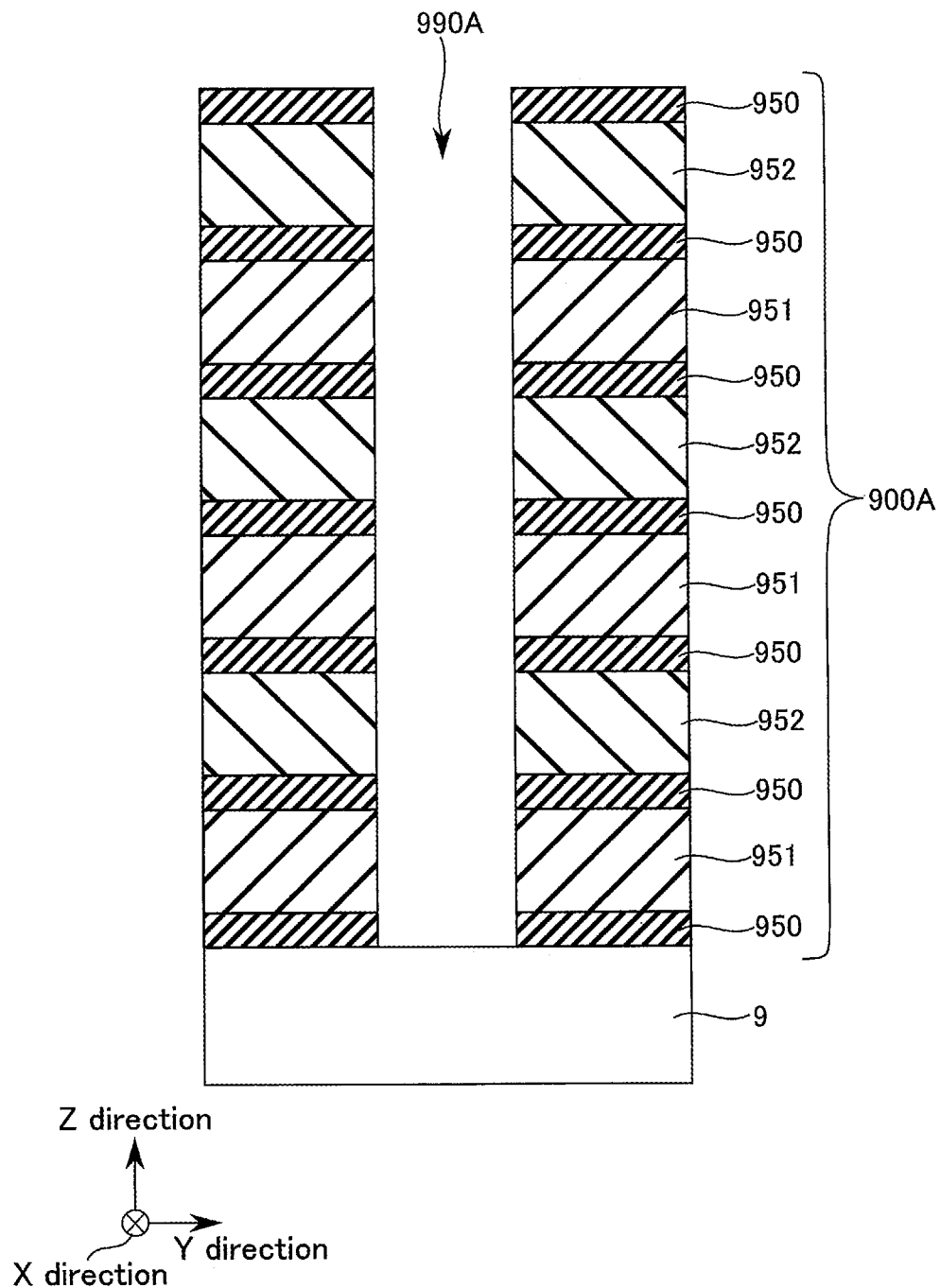
F I G. 22

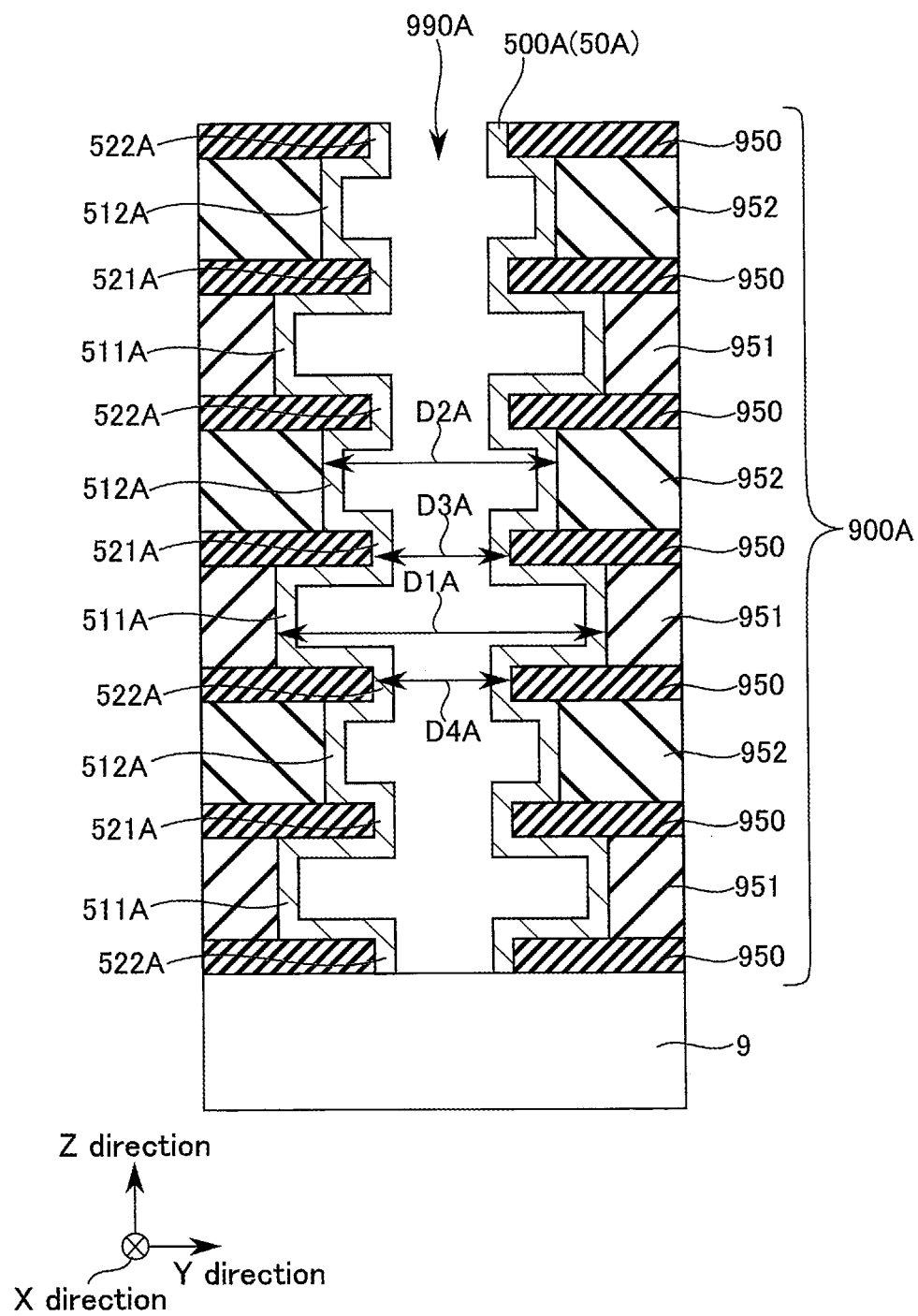
F I G. 24

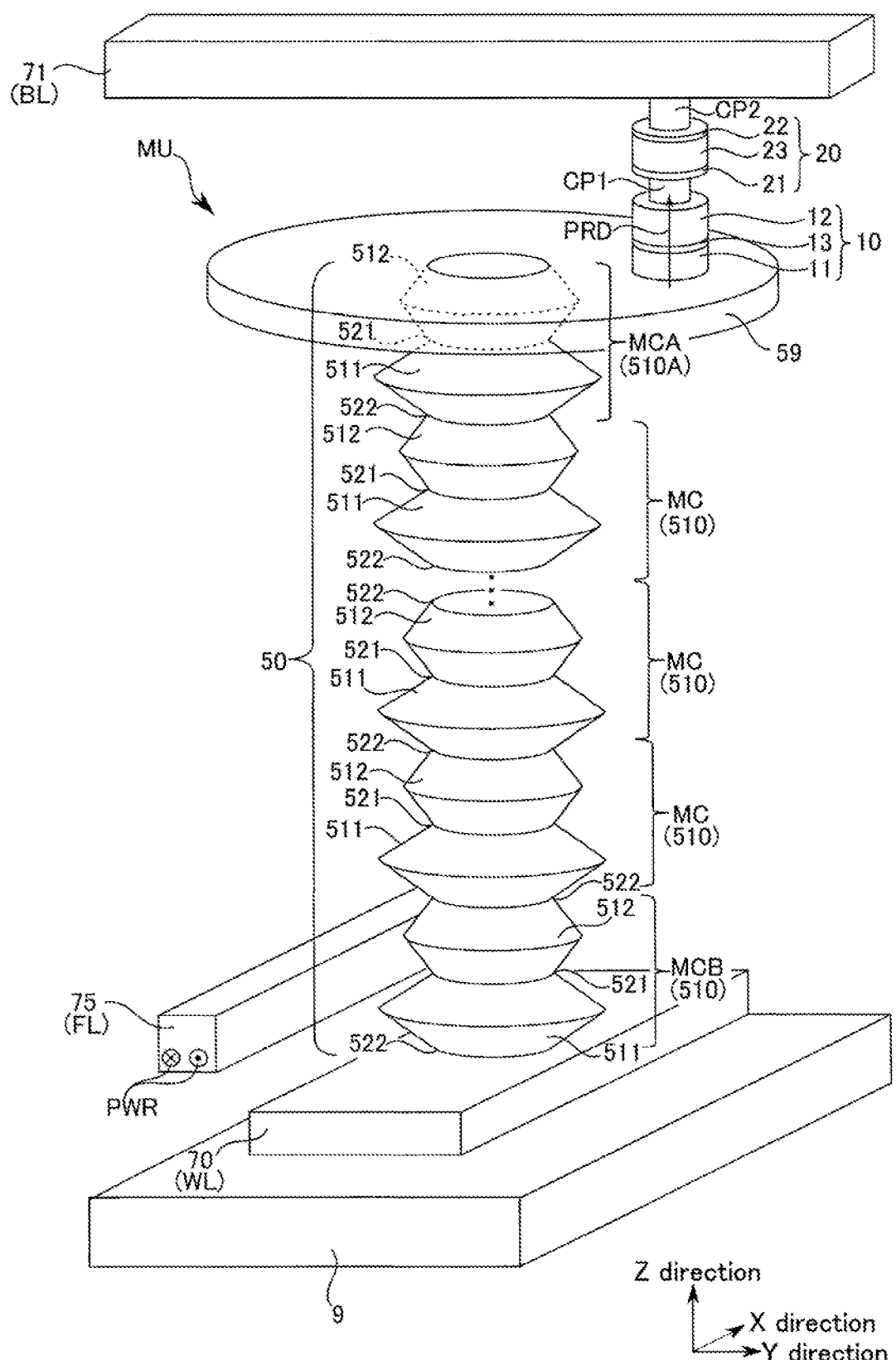
F I G. 27

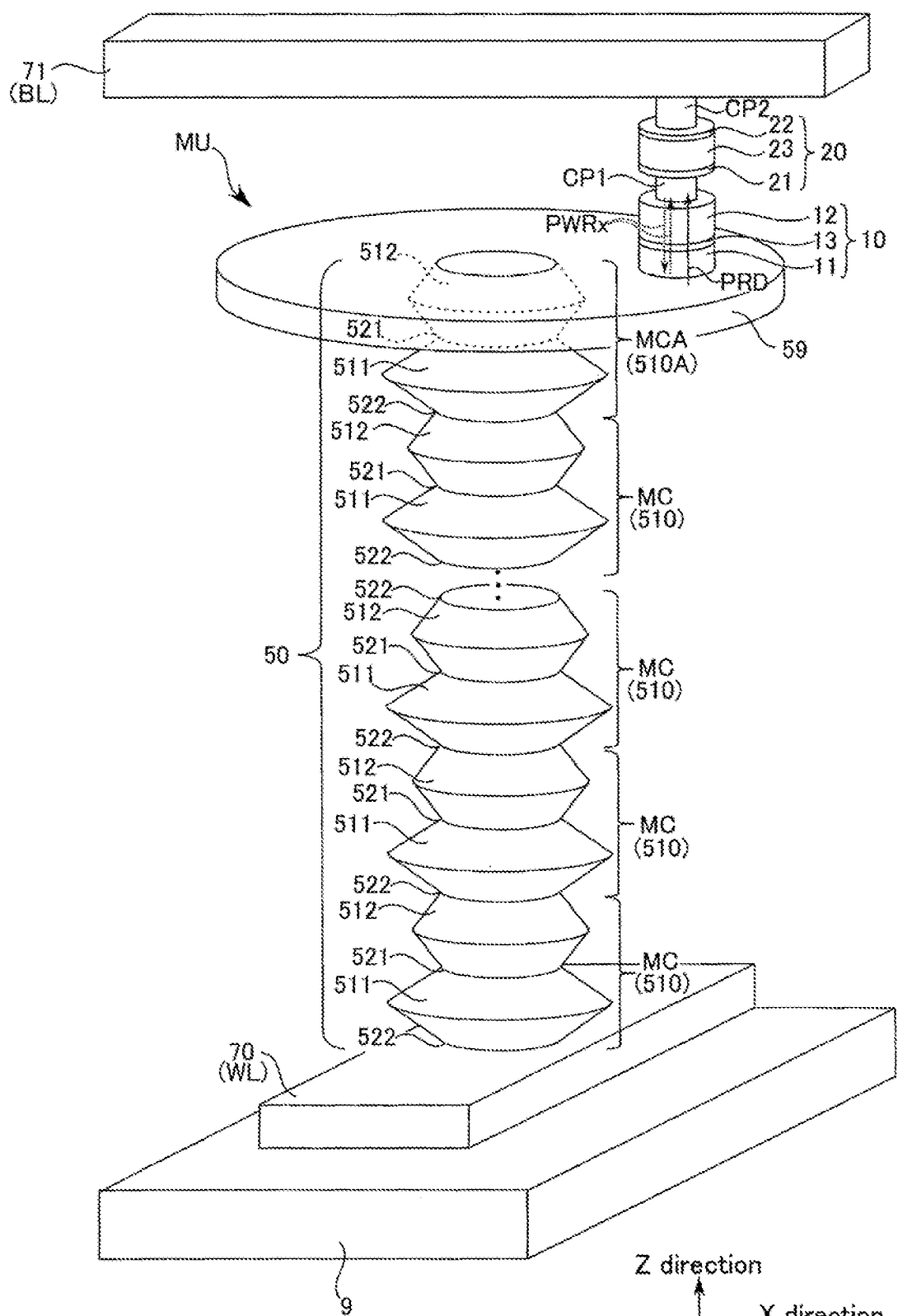
F I G. 28

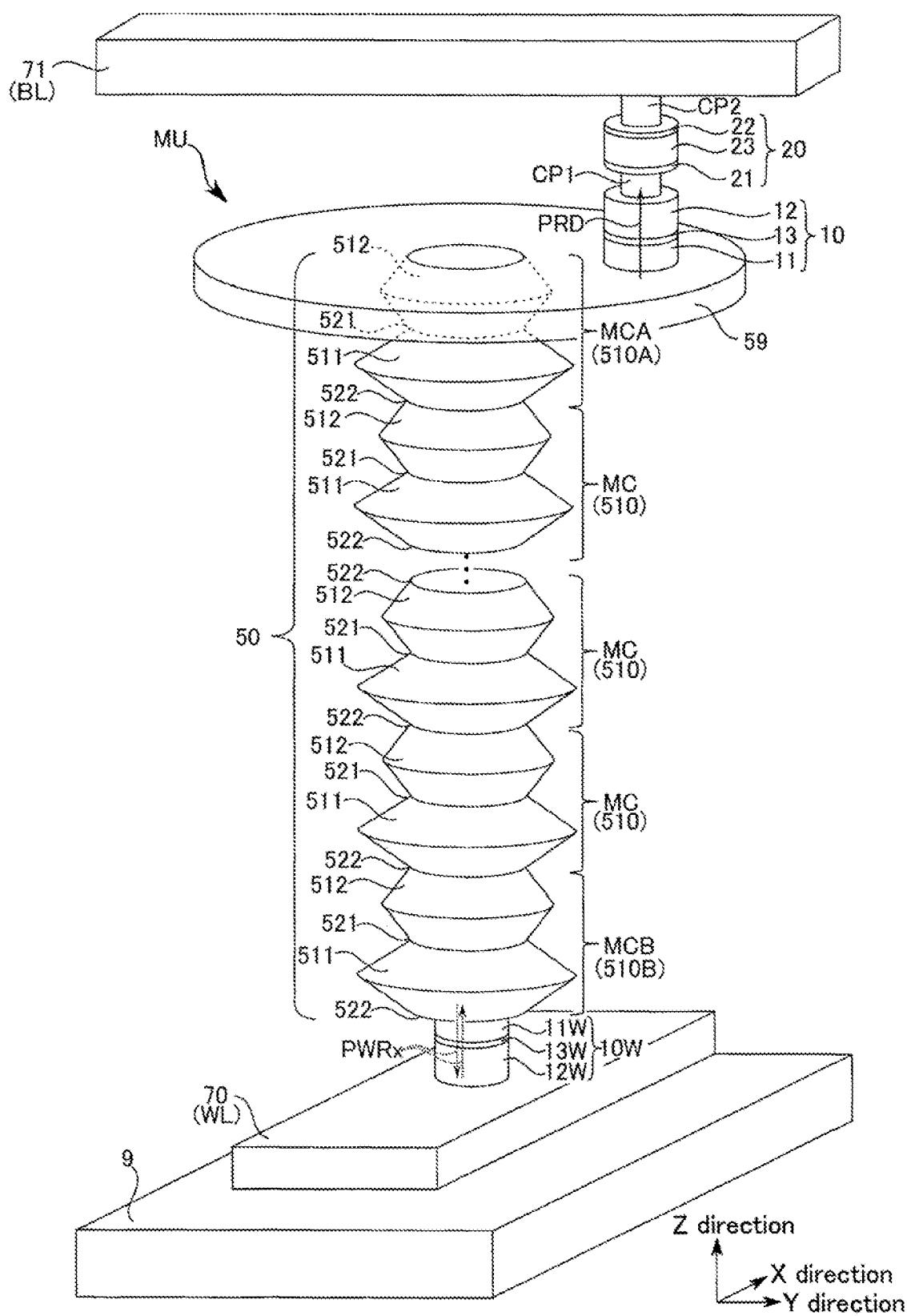
F I G. 29

MAGNETIC MEMORY

CROSS-REFERENCE TO RELATED APPLICATIONS

This application is based upon and claims the benefit of priority from Japanese Patent Application No. 2020-050852, filed Mar. 23, 2020, the entire contents of which are incorporated herein by reference.

FIELD

Embodiments described herein relate generally to a magnetic memory.

BACKGROUND

Research and development of a magnetic memory using a magnetic member has been promoted.

BRIEF DESCRIPTION OF THE DRAWINGS

FIG. 2 is an equivalent circuit diagram of a memory cell array of the magnetic memory of the first embodiment.

FIG. 7, FIG. 8 and FIG. 9 are cross-sectional process views illustrating fabrication steps of the manufacturing method of the magnetic memory of the first embodiment.

FIG. 20 is a view illustrating an example of a magnetic memory of a second embodiment.

FIG. 22, FIG. 23 and FIG. 24 are cross-sectional process views illustrating fabrication steps of a manufacturing method of the magnetic memory of the third embodiment.

FIG. 27, FIG. 28 and FIG. 29 are views illustrating modifications of the magnetic memories of the embodiments.

DETAILED DESCRIPTION

Referring to FIG. 1 to FIG. 29, magnetic memories of embodiments will be described.

In the description below, elements having the same function and structure are denoted by the same reference sign.

In addition, in each embodiment below, when constituent elements (e.g. circuits, interconnects, and various voltages and signals), which are denoted by reference signs ending with numerals/alphabetical characters for distinction, do not need to be distinguished, expressions (reference signs) without such numerals/alphabetical characters at the ends are used.

In general, according to one embodiment, a magnetic device includes a magnetic member including a first portion with a first dimension in a first direction, a second portion spaced from with the first portion in a second direction crossing the first direction and having a second dimension in the first direction, a third portion provided between the first portion and the second portion and having a third dimension in the first direction, and a fourth portion provided between the first portion and the third portion and having a fourth dimension in the first direction; and a circuit configured to supply a shift pulse including a first pulse and a second pulse to the magnetic member, and to move a domain wall in the magnetic member in the second direction, wherein the third dimension is less than the first dimension, and the second dimension and the fourth dimension is less than the third dimension, and the first pulse has a first current value, and the second pulse has a second current value which is less than the first current value.

Embodiments

(1) First Embodiment

Referring to FIG. 1 to FIG. 19, a magnetic memory of a first embodiment and a control method thereof will be described.

(a) Configuration Example

Referring to FIG. 1 to FIG. 4, a configuration example of the magnetic memory of the present embodiment will be described.

(a-1) Entire Configuration

Figure 1:
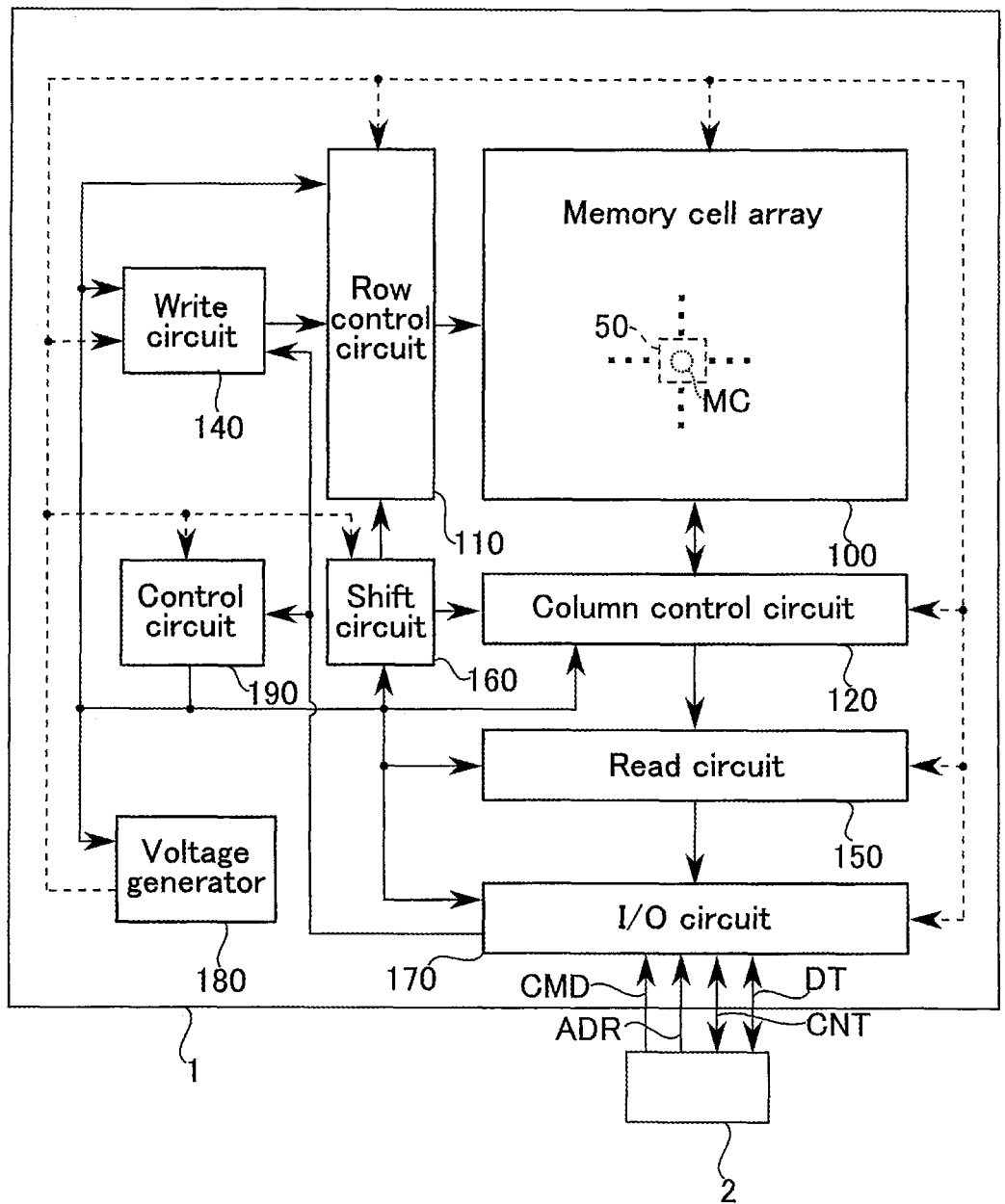
FIG. 1 is a view illustrating a configuration example of a magnetic memory of a first embodiment.

FIG. 1 is a block diagram illustrating a configuration example of the magnetic memory of the present embodiment.

For example, a magnetic memory 1 of the present embodiment is a domain wall memory.

As illustrated in FIG. 1, the domain wall memory (also referred to as "domain wall shift memory") 1 of the embodiment includes a memory cell array (also referred to as "memory area") 100, a row control circuit 110, a column control circuit 120, a write circuit 140, a read circuit 150, a shift circuit 160, an I/O circuit 170, a voltage generator 180, and a control circuit 190.

The memory cell array 100 includes a plurality of magnetic members 50 and a plurality of interconnects. Each magnetic member 50 is connected to a corresponding one or more interconnects (e.g. a word line and a bit line). Data is stored in a memory cell MC in the magnetic member 50.

The row control circuit 110 controls rows of the memory cell array 100. A decoded result (row address) of an address is supplied to the row control circuit 110. The row control circuit 110 sets a row (e.g. a word line), which is based on the decoded result of the address, in a selected state. Hereinafter, the row (or word line) set in the selected state is referred to as "selected row" (or "selected word line"). A row other than the selected row is referred to as "non-selected row" (or "non-selected word line").

For example, the row control circuit 110 includes a multiplexer (a word line selection circuit) and a word line driver.

The column control circuit 120 controls columns of the memory cell array 100. A decoded result (column address) of an address from the control circuit 190 is supplied to the column control circuit 120. The column control circuit 120 sets a column (e.g. at least one bit line), which is based on the decoded result of the address, in a selected state. Hereinafter, the column (or bit line) set in the selected state is referred to as "selected column" (or "selected bit line"). A column other than the selected column is referred to as "non-selected column" (or "non-selected bit line").

The column control circuit 120 includes a multiplexer (a bit line selection circuit) and a bit line driver.

The write circuit (also referred to as "write control circuit" or "write driver") 140 executes various controls for a write operation (write of data). At a time of a write operation, the write circuit 140 supplies a write pulse, which is formed by current and/or voltage, to the memory cell array 100. Thereby, data is written in the memory cell array 100 (in memory cells).

For example, the write circuit 140 is connected to the memory cell array 100 via the row control circuit 110.

The write circuit 140 includes a voltage source and/or current source, a pulse generator, a latch circuit, and the like.

The read circuit (also referred to as "read control circuit" or "read driver") 150 executes various controls for a read operation (read of data). At a time of a read operation, the read circuit 150 supplies a read pulse (e.g. read current) to the memory cell array 100. The read circuit 150 senses a potential or a current value of a bit line BL. Based on the sensed result, data in the magnetic member 50 is read.

For example, the read circuit 150 is connected to the memory cell array 100 via the column control circuit 120.

The read circuit 150 includes a voltage source and/or current source, a pulse generator, a latch circuit, a sense amplifier circuit, and the like.

The shift circuit (also referred to as "shift control circuit" or "shift driver") 160 executes various controls for a shift operation (shift of data). At a time of shift operation, the shift circuit 160 supplies to the memory cell array 100 a pulse (hereinafter referred to as "shift pulse") for moving a domain wall (magnetic domain) in the magnetic member 50.

For example, the shift circuit 160 is connected to the memory cell array 100 via the row control circuit 110 and the column control circuit 120.

The shift circuit 160 includes a voltage source and/or current source, a pulse generator, and the like.

Note that the write circuit 140, read circuit 150 and shift circuit 160 are not limited to mutually independent circuits. For example, the write circuit, read circuit and shift circuit may include common structural elements which are mutually usable, and may be disposed in the domain wall memory 1 as a single integral circuit.

The I/O circuit (input/output circuit) 170 is an interface circuit for transferring various signals.

At a time of a write operation, the I/O circuit 170 transfers, as write data, data DT from an external device (a controller or a host device) 2 to the write circuit 140. At a time of a read operation, the I/O circuit 170 transfers data, which is output from the memory cell array 100 to the read circuit 150, to the external device 2 as read data. The I/O circuit 170 transfers an address ADR and a command CMD from the external device 2 to the control circuit 190. The I/O circuit 170 transfers various control signals CNT between the control circuit 190 and the external device 2.

The voltage generator 180 generates voltages for various operations of the memory cell array 100, by using a power supply voltage which is provided from the external device 2 (or power supply). For example, at a time of a write operation, the voltage generator 180 outputs various voltages, which are generated for the write operation, to the write circuit 140. At a time of a read operation, the voltage generator 180 outputs various voltages, which are generated for the read operation, to the read circuit 150. At a time of a shift operation, the voltage generator 180 outputs various voltages, which are generated for the shift operation, to the shift circuit 160.

The control circuit (also referred to as "state machine", "sequencer" or "internal controller") 190 controls operations of respective circuits in the memory device 1, based on the control signal CNT, address ADR and command CMD.

The control circuit 190 includes, for example, a command decoder, an address decoder, and a latch circuit.

For example, the command CMD is a signal indicative of an operation which the domain wall memory 1 is to execute. For example, the address ADR is a signal indicative of coordinates of at least one memory cell (hereinafter referred to as "selected cell") which is an operation target in the memory cell array 100. The address ADR includes a row address and a column address of a selected cell. For example, the control signal CNT is a signal for controlling an operation timing between the magnetic memory 1 and the external device 2, and an operation timing in the inside of the magnetic memory 1.

(a-2) Memory Cell Array

Figure 3:
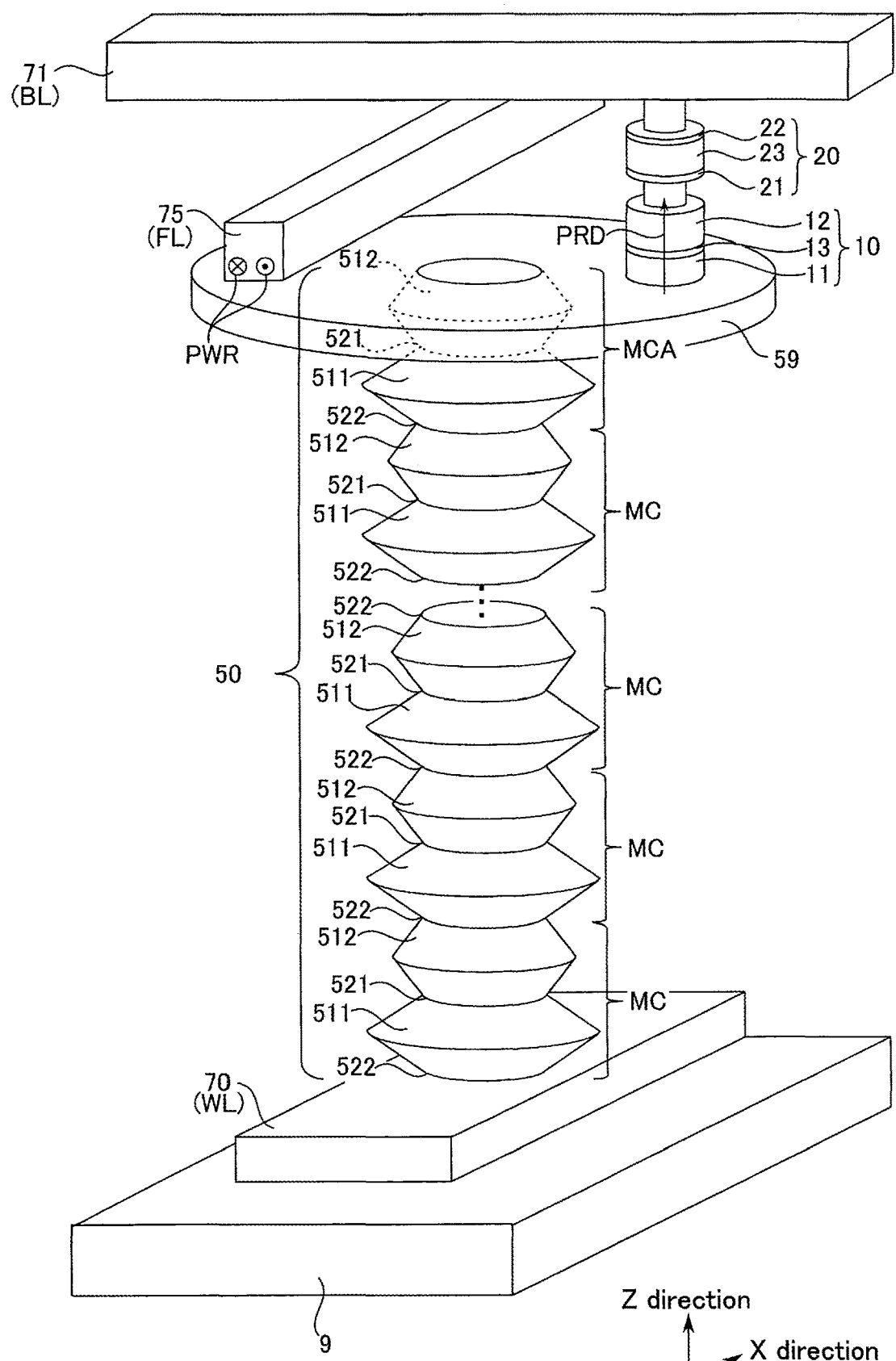
FIG. 3 is a bird's-eye view illustrating a configuration example of a memory cell unit of the magnetic memory of the first embodiment.
Figure 4:
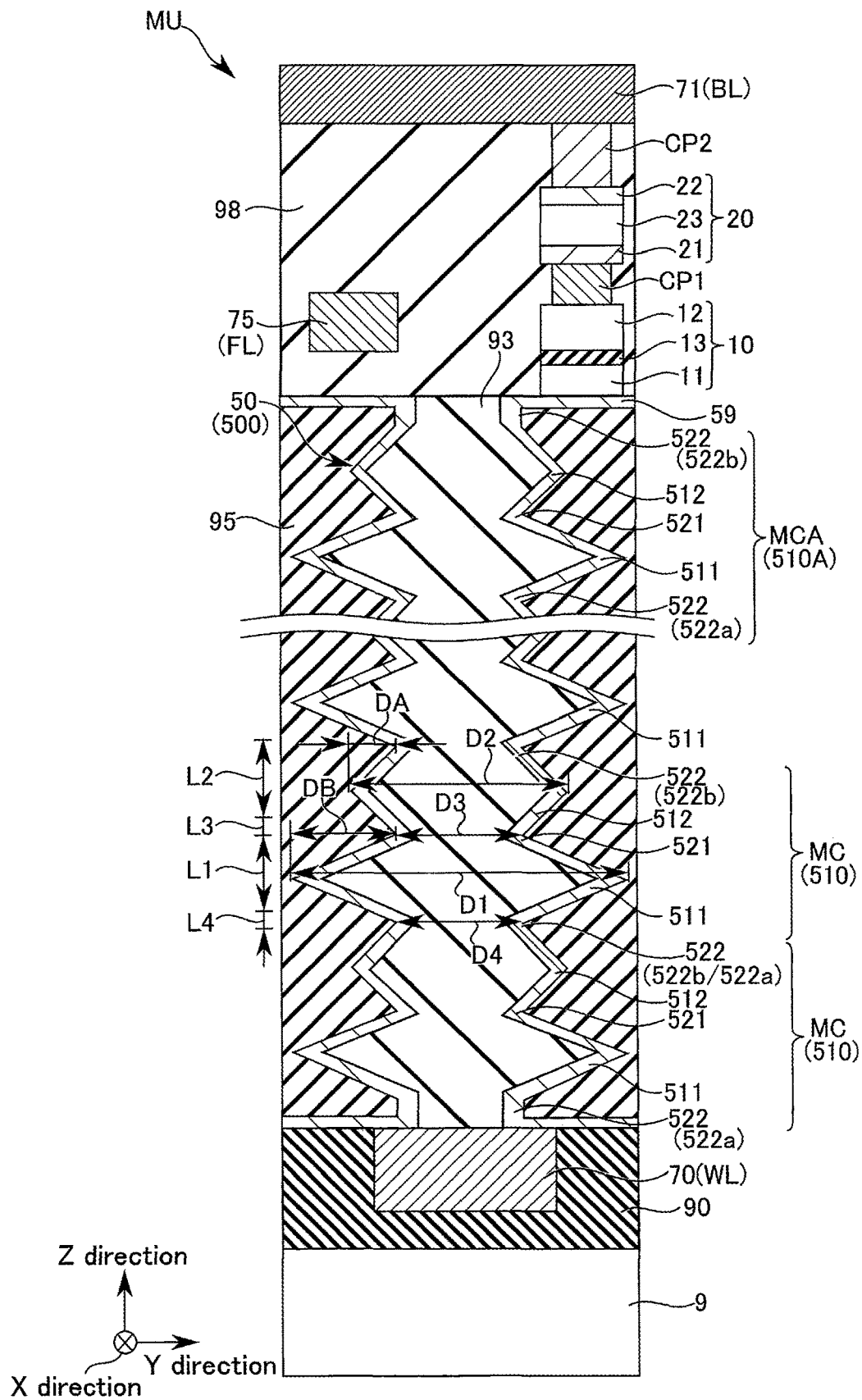
FIG. 4 is a cross-sectional view illustrating a configuration example of the memory cell unit of the magnetic memory of the first embodiment.

Referring to FIG. 2 to FIG. 4, a description will be given of a configuration example of the memory cell array of the domain wall memory of the present embodiment.

FIG. 2 is a schematic view illustrating a configuration example of the memory cell array in the domain wall memory of the present embodiment.

As illustrated in FIG. 2, in the domain wall memory of the embodiment, magnetic members 50 are provided in the memory cell array 100.

The magnetic members 50 are arranged two-dimensionally in the memory cell array 100 on a substrate (not shown). Each magnetic member 50 extends in a direction (Z direction) perpendicular to an upper surface (X-Y plane) of the substrate.

Word lines WL and bit lines BL are provided in the memory cell array 100. The word lines WL are arranged in a Y direction. The word lines WL extend in an X direction. The bit lines BL are arranged in the X direction. The bit lines BL extend in the Y direction. The bit lines BL are provided above the word lines WL in the Z direction.

The magnetic members 50 are provided between the word lines WL and bit lines BL. One end of each magnetic member 50 is connected to the corresponding word line WL. The other end of the magnetic member 50 is connected to the corresponding bit line BL. The magnetic members 50 arranged in the X direction are connected to the same word line WL. The magnetic members 50 arrange in the Y direction are connected to the same bit line BL.

For example, a reproducing element 10 and a switching element 20 are connected between the bit line BL and the magnetic member 50.

The reproducing element 10 is provided between the magnetic member 50 and the switching element 20. The reproducing element 10 is electrically connected to the magnetic member 50 and the switching element 20. For example, the reproducing element 10 is connected to the magnetic member 50 via a magnetic layer 59.

At a time of a read operation of the domain wall memory 1, the reproducing element 10 functions as an element (hereinafter, also referred to as "read element") for reading data in the magnetic member 50.

The switching element 20 is provided between the reproducing element 10 and the bit line BL. The switching element 20 is electrically connected to the reproducing element 10 and the bit line BL.

The switching element 20 is used to control a connection between the magnetic member 50 and the bit line BL. When the switching element 20 is set in the ON state, the magnetic member 50 is electrically connected to the bit line BL. When the switching element 20 is set in the OFF state, the magnetic member 50 is electrically disconnected from the bit line BL.

For example, the ON/OFF of the switching element 20 is controlled by the control of a potential difference between the bit line BL and the word line WL. Thereby, one or more magnetic members, which are operation targets among the magnetic members 50 of the memory cell array 100, are selected (activated).

A conductive layer (interconnect) FL is provided above the magnetic layer 59 in the Z direction. The conductive layer FL extends in the X direction, for example, in a region between the bit line BL and the magnetic layer 59. The conductive layer FL extends over a plurality of magnetic layers 59.

The conductive layer FL is an interconnect for data write (hereinafter, also referred to as "write line" or "field line") by a magnetic field write method at a time of a write operation of the domain wall memory 1. At the time of the write operation by the magnetic field write method, a write pulse (hereinafter, also referred to as "write current") is supplied to the write line FL. By the write current, a magnetic field is generated around the write line FL. The generated magnetic field is applied to the magnetic layer 59. In accordance with the direction of the generated magnetic field, the direction of magnetization MM of the magnetic layer 59 and the magnetic member 50, which is connected to the magnetic layer 59, is set. Thereby, data is written in the magnetic member 50.

The direction of the magnetic field changes in accordance with the direction of a write current in the write line FL. Therefore, the direction, in which the write current flows in the write line FL, is set in accordance with the data to be written.

A plurality of memory cells MC are provided in each magnetic member 50. The memory cells MC are arranged in the Z direction in the magnetic member 50. Thereby, the memory cells MC are arranged three-dimensionally in the memory cell array 100.

Each of the memory cells MC includes a cell region (also referred to as "cell portion" or "data retention portion") 510. The cell region 510 is a region (portion) provided in the magnetic member 50 in a manner to correspond to the memory cell MC. The cell region 510 is a magnetic region (magnetic portion) capable of having magnetization MM.

When the memory cell MC stores data, the cell region 510 has magnetization MM. The data stored in the memory cell MC is associated with the direction of magnetization MM of the cell region 510.

The magnetic member 50 has perpendicular magnetic anisotropy or in-plane magnetic anisotropy. The magnetization easy axis direction of the cell region 510 corresponds to the magnetic anisotropy of the magnetic member 50.

Hereinafter, a structure including at least one or more memory cells MC provided in the magnetic member 50, the reproducing element 10 and the switching element 20 is referred to as "memory cell unit" (or "memory cell string") MU.

(a-3) Memory Cell Unit

FIG. 3 is a schematic bird's-eye view illustrating a configuration example of the memory cell unit in the domain wall memory of the present embodiment. FIG. 4 is a schematic cross-sectional view illustrating a configuration example of the memory cell unit in the domain wall memory of the embodiment.

As illustrated in FIG. 3 and FIG. 4, the magnetic member 50 is provided above a substrate 9 in the Z direction. The magnetic member 50 includes a magnetic layer (hereinafter, also referred to as "domain wall motion layer) 500. The magnetic member 50 extends in the Z direction. For example, the magnetic member 50 has a cylindrical structure. A center axis of the cylindrical magnetic member 50 extends in the Z direction. However, the center axis of the magnetic member 50 may incline with respect to the Z direction.

For example, the magnetic member 50 is interposed between two insulators 93 and 95 in a direction parallel to the upper surface of the substrate 9.

Note that the insulator 93 may not be provided. In this case, a cavity is provided in the magnetic member 50.

For example, the material of the magnetic member 50 is a material including at least one element selected from the group consisting of cobalt (Co), iron (Fe), nickel (Ni), manganese (Mn) and chromium (Cr), and at least one element selected from the group consisting of platinum (Pt), palladium (Pd), iridium (Ir), ruthenium (Ru) and rhodium (Rh). A more concrete example of the material of the magnetic member 50 is CoPt, CoCrPt, FePt, CoPd, or FePd. Note that the material of the magnetic member 50 is not limited to the above-described materials, and may be other magnetic materials.

For example, the magnetic layer constituting the magnetic member 50 may be a stacked film. For example, the magnetic member 50 includes a magnetic film and a nonmagnetic film. The magnetic film is provided between the nonmagnetic film (e.g. a hafnium oxide film) and the insulator 95. However, the magnetic film may be provided between the nonmagnetic film and the insulator 93. The magnetic member 50 may be a magnetic film of a single layer.

For example, when the magnetic member 50 has perpendicular magnetic anisotropy, the magnetization of the magnetic member 50 is directed in a direction from the center of the magnetic member 50 toward an outer periphery of the magnetic member 50, or in a direction from the outer periphery of the magnetic member 50 toward the center of the magnetic member 50.

The cell region 510 corresponding to each memory cell MC is provided in the magnetic member 50. The magnetic member 50 includes memory cells MC. One memory cell MC is provided in one cell region 510.

The magnetic layer 59 is provided on the magnetic member 50 in the Z direction. For example, the magnetic layer 59 has a circular plan-view shape, as viewed in the Z direction. However, the magnetic layer 59 may have a rectangular plan-view shape. For example, a dimension of the magnetic layer 59 in a direction parallel to the surface of the substrate 9 is greater than a dimension D1 of the magnetic member 50 in the direction parallel to the surface of the substrate 9.

The magnetic layer 59 is connected to the magnetic member 50. For example, the magnetic layer 59 is a layer which is continuous with the magnetic member 50.

The magnetization of the magnetic layer 59 changes in accordance with the magnetization of the magnetic member 50. For example, as regards the magnetization easy axis direction of each layer, the direction of magnetization of the magnetic layer 59 is identical to the direction of magnetization of a cell region 510A which is directly connected to the magnetic layer 59. The cell region 510A directly connected to the magnetic layer 59 corresponds to a memory cell MCA which is located closest to the bit line side among the memory cells in the memory cell unit MU.

In the example of FIG. 3, the memory cell MCA functions as a read cell at a time of a read operation, and functions as a write cell at a time of a write operation. The read cell is a memory cell for temporarily storing data from a memory cell of a read target at a time of a read operation. The write cell is a memory cell in which write data is temporarily written at a time of a write operation.

A stacked body including the reproducing element 10 and switching element 20 is provided on the magnetic layer 59.

The reproducing element 10 is a magnetoresistive effect element.

The magnetoresistive effect element 10 is provided on the magnetic layer 59 in the Z direction. For example, the magnetoresistive effect element 10 is disposed in such a position as not to overlap the magnetic member 50 in the Z direction. The magnetoresistive effect element 10 may be disposed in such a position as to overlap the magnetic member 50 in the Z direction. The magnetoresistive effect element 10 is disposed on one end side in the Y direction of the magnetic layer 59.

The magnetoresistive effect element 10 is electrically connected to the magnetic layer 59.

For example, the magnetoresistive effect element 10 includes two magnetic layers 11 and 12 and a nonmagnetic layer 13. The nonmagnetic layer 13 is provided between the two magnetic layers 11 and 12 in the Z direction. The two magnetic layers 11 and 12 and nonmagnetic layer 13 form a magnetic tunnel junction (MTJ). Hereinafter, the magnetoresistive effect element 10 including the magnetic tunnel junction is referred to as "MTJ element". The nonmagnetic layer 13 of the MTJ element 10 is referred to as "tunnel barrier layer".

The magnetic layers 11 and 12 are, for example, ferromagnetic layers including cobalt, iron and boron. The magnetic layer 11, 12 may be a single-layer film, or a multilayer film (e.g. artificial lattice film). The tunnel barrier layer 13 is, for example, an insulating film including magnesium oxide. The tunnel barrier layer 13 may be a single-layer film or a multilayer film.

Each magnetic layer 11, 12 has in-plane magnetic anisotropy or perpendicular magnetic anisotropy.

For example, when the magnetic layer 11, 12 has in-plane magnetic anisotropy, the magnetization easy axis direction of the magnetic layer 11, 12 having in-plane magnetic anisotropy is substantially parallel to a layer surface (film surface) of the magnetic layer. In this case, each magnetic layer 11, 12 has magnetization which is substantially parallel to the layer surface of the magnetic layer 11, 12. The direction of magnetization of the magnetic layer 11, 12 having in-plane magnetic anisotropy is perpendicular to the direction (Z direction) of arrangement of the magnetic layers 11 and 12.

For example, when the magnetic layer 11, 12 has perpendicular magnetic anisotropy, the magnetization easy axis direction of the magnetic layer 11, 12 having perpendicular magnetic anisotropy is substantially perpendicular to the layer surface (film surface) of the magnetic layer. In this case, each magnetic layer 11, 12 has magnetization which is substantially perpendicular to the layer surface of the magnetic layer 11, 12. The direction of magnetization of the magnetic layer 11, 12 having perpendicular magnetic anisotropy is parallel to the direction (Z direction) of arrangement of the magnetic layers 11 and 12.

The direction of magnetization of the magnetic layer 11 is changeable. The direction of magnetization of the magnetic layer 12 is unchangeable (in a fixed state). Hereinafter, the magnetic layer 11 with the changeable magnetization direction is referred to as "storage layer". Hereinafter, the magnetic layer 12 with the unchangeable magnetization direction (in the fixed state) is referred to "reference layer". Note that, in some cases, the storage layer 11 is referred to as "free layer", "magnetization free layer" or "magnetization changeable layer". In some cases, the reference layer 12 is referred to as "pin layer", "pinned layer", "magnetization unchangeable layer" or "magnetization fixed layer".

The magnetization direction of the storage layer 11 and the magnetization direction of the magnetic layer 59 change in interlock with each other. For example, as regards the magnetization easy axis direction of each layer, the magnetization direction of the storage layer 11 is identical to the magnetization direction of the magnetic layer 59.

Note that the magnetic layer 59 may be used as a storage layer of the MTJ element 10. In this case, the nonmagnetic layer 13 is provided on the magnetic layer 59 such that the nonmagnetic layer 13 is in direct contact with the magnetic layer 59, without the magnetic layer 11 being disposed.

In the present embodiment, the wording "the magnetization direction of the reference layer (magnetic layer) is unchangeable" or "the magnetization direction of the reference layer (magnetic layer) is in the fixed state" means that, when current, voltage or magnetic energy (e.g. magnetic field), with which the magnetization direction of the storage layer changes, is supplied to the magnetoresistive effect element 10, the magnetization direction of the reference layer does not change before and after the supply of the current, voltage or magnetic energy.

The switching element 20 is provided above the MTJ element 10 in the Z direction. The switching element 20 is electrically connected to the MTJ element 10 via, for example, a contact plug CP1 (or a conductive layer). The switching element 20 may be directly connected to the MTJ element 10, without another member being interposed.

The switching element 20 includes, for example, two electrodes 21 and 22 and a switching layer 23. The switching layer 23 is provided between the two electrodes 21 and 22. The electrode 21 is provided on the contact plug CP1 in the Z direction. The switching layer 23 is provided on the electrode 21 in the Z direction. The electrode 22 is provided on the switching layer 23 in the Z direction. The material of the switching layer 23 is, for example, a transition metal oxide, or a chalcogenide compound.

The switching element 20 switches an electrical connection between the memory cell unit MU and the bit line BL. As a result, activation/deactivation (selection/non-selection) of the memory cell unit MU can be controlled.

The resistance state of the switching layer 23 changes to a high resistance state or a low resistance state in accordance with a current (or a voltage) supplied to the layer 23.

Thereby, the switching element 20 is set in an ON state (a low resistance state, a conductive state) when a current which is equal to or higher than a threshold current (ON current) of the switching element 20 (or a voltage which is equal to or higher than a threshold voltage) is supplied to the memory cell unit MU. The switching element 20 is set in an OFF state (a high resistance state, a non-conductive state) when a current which is lower than the threshold current of the switching element 20 is supplied to the memory cell unit MU.

The switching element 20 in the OFF state electrically disconnects the memory cell unit MU from the bit line BL.

The switching element 20 in the ON state can pass current through the memory cell MC. The switching element 20 in the ON state supplies the memory cell unit MU with a current flowing from the bit line BL side toward the word line WL side, or a current flowing from the word line WL side toward the bit line BL side, in accordance with a potential difference between the bit line BL and the word line WL. In this manner, the switching element 20 is an element which can pass current through the memory cell unit MU in both directions.

A conductive layer 70 is provided between the magnetic member 50 and the substrate 9. The conductive layer 70 is provided on an insulating layer 90 which covers the upper surface of the substrate 9. For example, the conductive layer 70 is buried in a trench in the insulating layer 90. The conductive layer 70 extends in the X direction. Note that a magnetic layer or a conductive layer may be provided between the conductive layer 70 and the magnetic member 50.

The conductive layer 70 is used as the word line WL. The conductive layer 70 functioning as the word line WL is electrically connected to the row control circuit 110. The activation/deactivation (selection/non-selection) of the word line WL is controlled by the row control circuit 110.

A conductive layer 71 is provided above the switching element 20 in the Z direction. The conductive layer 71 is electrically connected to the switching element 20 via a contact plug CP2. The conductive layer 71 extends in the Y direction.

The conductive layer 71 is used as the bit line BL. The conductive layer 71 functioning as the bit line BL is electrically connected to the column control circuit 120. The activation/deactivation (selection/non-selection) of the bit line BL is controlled by the column control circuit 120.

A conductive layer 75 is provided in an insulating layer 98 between the magnetic layer 59 and the bit line BL. The conductive layer 75 neighbors, in the Y direction, the stacked body including the reproducing element 10 and switching element 20. The conductive layer 75 extends in the X direction.

The conductive layer 75 is used as the write line FL. The conductive layer 75 functioning as the write line FL is electrically connected to, for example, the row control circuit 110 and write circuit 140. The activation/deactivation of the write line 75 is controlled by the row control circuit 110. The supply of a write current PWR to the write line FL is controlled by the write circuit 140.

For example, the domain wall memory including the memory cell unit illustrated in FIG. 3 and FIG. 4 functions as a domain wall shift memory (e.g. a shift register) of an LIFO (Last-in First-out) method.

As illustrated in FIG. 3 and FIG. 4, in the domain wall memory of the present embodiment, the dimension of the magnetic member 50 (e.g. the diameter of the cylindrical magnetic layer) in the direction (X direction or Y direction) parallel to the upper surface of the substrate 9 cyclically varies in the Z direction. The magnetic member 50 is constricted at predetermined intervals (cycles) in the Z direction.

Each memory cell MC includes a plurality of projection (convex) portions 511 and 512 and a plurality of concave portions 521 and 522. The projection portions 511 and 512 and concave portions 521 and 522 are one continuous layer in the magnetic member 50. In the magnetic member 50, the projection portions 511 and 512 are arranged in the Z direction.

One memory cell MC includes a first projection portion 511 and a second projection portion 512. For example, in each memory cell MC, the second projection portion 512 is provided on the upper side (on the bit line BL side) of the first projection portion 511 in the Z direction.

The first projection portion 511 has a first dimension D1 in the direction parallel to the upper surface of the substrate 9 (e.g. in at least one of the X direction and Y direction). For example, the dimension D1 is a maximum dimension of the projection portion 511 in the X direction (or in the Y direction). The dimension D1 corresponds to the diameter of the magnetic member 50 at a position of the projection portion 511. The projection portion 511 has a dimension L1 in the Z direction.

The cross-sectional area of the projection portion 511 is maximum at the position of the dimension D1.

The second projection portion 512 has a second dimension D2 in the direction parallel to the upper surface of the substrate 9 (e.g. in at least one of the X direction and Y direction). For example, the dimension D2 is a maximum dimension of the projection portion 512 in the X direction (or in the Y direction). The dimension D2 corresponds to the diameter of the magnetic member 50 at a position of the projection portion 512. The dimension D2 is less than the dimension D1. The projection portion 512 has a dimension L2 in the Z direction. For example, the dimension L2 is substantially equal to the dimension L1.

The cross-sectional area of the projection portion 512 is maximum at the position of the dimension D2.

The volume of a magnetic portion (magnetic member), which constitutes the first projection portion 511, is greater than the volume of a magnetic portion which constitutes the second projection portion 512.

For example, each projection portion 511, 512 has a hexagonal cross-sectional shape as viewed in the X direction (or Y direction).

Hereinafter, the projection portion 511 is also referred as "large projection portion 511", and the projection portion 512 is also referred to as "small projection portion 512".

The concave portion 521 is provided between the first projection portion (large projection portion) 511 and the second projection portion (small projection portion) 512. The concave portion 521 has a third dimension D3 in the direction parallel to the upper surface of the substrate 9. The dimension D3 is less than the dimension D1 and dimension D2. The dimension D3 corresponds to the diameter (e.g. a minimum diameter of the magnetic member) of the magnetic member 50 at a position of the concave portion 521. The concave portion 521 has a dimension L3 in the Z direction. For example, the dimension L3 is less than the dimension L1 and dimension L2.

For example, a dimension (distance) DB between an apex portion of the projection portion 511 and a bottom portion of the concave portion 521 in the X direction (or Y direction) is defined as a depth of a constriction between the projection portion 511 and the concave portion 521. Note that the apex portion of the projection portion 511 is a portion of the projection portion 511, which has the maximum dimension D1. The bottom portion of the concave portion 521 is a portion having the dimension D3 of the concave portion 521.

For example, a dimension (distance) DA between the projection portion 512 and the concave portion 521 in the X direction (or Y direction) is defined as a depth of a constriction between an apex portion of the projection portion 512 and a bottom portion of the concave portion 521. Note that the apex portion of the projection portion 512 is a portion of the projection portion 512, which has the maximum dimension D2.

The projection portions 511 and 512 and the concave portion 521 are provided between two concaves portions 522 (522a, 522b) in the Z direction.

One concave portion 522a is provided on one end side in the Z direction of the cell region 510. The other concave portion 522b is provided on the other end side in the Z direction of the cell region 510. Each concave portion 522 is provided between two mutually neighboring memory cells MC in the Z direction.

The concave portion 522 has a dimension D4 in the direction (e.g. at least one of the X direction and Y direction) parallel to the upper surface of the substrate 9. The dimension D4 corresponds to the diameter (e.g. minimum diameter) of the magnetic member 50 at a position of the concave portion 522.

The dimension D4 is less than the dimension D1 and dimension D2. For example, the dimension D4 is substantially equal to the dimension D3. The concave portion 521 has a dimension L4 in the Z direction. For example, the dimension L4 is substantially equal to the dimension L3.

In the present embodiment, a domain wall is retained in the concave portion 522 in accordance with the state of magnetization (magnetic domain) of mutually neighboring memory cells MC (projection portions 511 and 512). Hereinafter, the concave portion 522 is also referred to as "domain wall retention portion 522" (or "domain wall existence region 522").

In two mutually neighboring memory cells MC, the concave portion 522 between one memory cell MC and the other memory cell MC functions as a domain wall retention portion of the one memory cell MC. One end of the other memory cell MC functions as a domain wall retention portion of the one memory cell MC, and the other end of the other memory cell MC functions as a domain wall retention portion of the other memory cell MC.

In this manner, each concave portion 522 is shared by two memory cells MC which neighbor in the Z direction. Each concave portion 522 is used as the domain wall retention portion of one of the two memory cells MC which share the concave portion 522. The concave portion 522 is disposed at a boundary of the mutually neighboring memory cells MC.

One projection portion 511, one projection portion 512 and one concave portion 521 are, at least, provided in one cell region 510.

A structure including at least the projection portions 511 and 512 and concave portion 521 forms a region of one cycle in the magnetic member 50 having a cyclic constriction structure. The structure of one cycle is used as one memory cell MC.

In the present embodiment, each of the projection portions 511 and 512 includes a portion having a certain dimension in the magnetic member 50, and a region of a certain size centering on the portion having this dimension. In the present embodiment, each of the concave portions (hereinafter, also referred to as "constriction portions" or "constriction regions") 521 and 522 includes a portion having a certain dimension in the magnetic member 50, and a region of a certain size centering on the portion having this dimension.

In the present embodiment, the dimensions of the respective portions in the cylindrical magnetic member 50 are set with reference to a plane on the outer peripheral side (outer wall side) of the magnetic member 50. However, if the large/small relationship of dimensions of the respective portions of the magnetic member in the present embodiment is satisfied, the dimensions of the respective portions may be defined with reference to a plane on the inner peripheral side (inner wall side) of the magnetic member 50.

Note that the magnetic member 50 may include a portion of a fixed dimension (a region with an invariable dimension) in a direction crossing the direction of motion of the domain wall in the projection portion 511, 512 and the concave portion 521, 522.

In the domain wall memory 1 of the present embodiment, the shift of data in the memory cell unit MU is executed by a shift operation on the domain wall in the magnetic member 50.

As will be described later, in the domain wall memory of the present embodiment, a domain wall retained in a certain memory cell MC is moved (shifted) to another memory cell MC by a shift pulse (e.g. a current pulse) supplied to the magnetic member 50. In one example of the operation sequence of the domain wall memory, the domain wall is shifted by one cycle (one memory cell) by one-time supply of a shift pulse. In accordance with the shift of a domain wall DW between memory cells MC, magnetic domains in the memory cells MC move.

In the domain wall memory of the present embodiment, the concave portion (constriction portion) 521 is provided in each memory cell MC.

In the memory cell MC, the large projection portion 511 and small projection portion 512 are arranged in the extending direction of the magnetic member 50, with the concave portion 521 being interposed. The dimension D1 of the large projection portion 511 in the parallel direction to the upper surface of the substrate 9 is greater than the dimension D2 of the small projection portion 512 in the parallel direction to the upper surface of the substrate 9. For example, in the memory cell MC, with respect to the direction of motion of the domain wall, the large projection portion 511 is located on the source-of-motion side of the domain wall, and the small projection portion 512 is located on the destination-of-motion side of the domain wall.

For example, a domain wall exists in a concave portion 522a on one side of a certain cell region 510 (a domain wall retention portion 522a of a certain memory cell).

In the domain wall memory of the present embodiment, this domain wall is shifted into a concave portion 522b on the other side of the cell region 510 (a domain wall retention portion 522b of the neighboring cell) via the concave portion 521 (and projection portions 511 and 512), by using a shift pulse which includes two pulses.

Note that, in the present embodiment, there is a case in which the domain wall is located in the concave portion 521 in a temporary state at the time of the shift operation (the shift of data).

The volume of the first projection portion (large projection portion) 511 having the first dimension D1 is greater than the volume of the second projection portion (small projection portion) 512 having the second dimension D2. Thus, the energy for the domain wall to move in the first projection portion 511 is greater than the energy for the domain wall to move in the second projection portion 512.

In the magnetic member 50, compared to the second portion (small projection portion) 512, the first projection portion 511 functions as a stopper (barrier) of motion of the domain wall, with respect to the shift current of a certain current value at the time of the shift operation.

Thereby, the domain wall memory of the present embodiment can suppress excessive motion of the domain wall between the memory cells. Therefore, the domain wall memory of the present embodiment can decrease an error of the position of the domain wall which is moved by the shift operation to a target position.

Therefore, the domain wall memory of the present embodiment can suppress a shift error of the domain wall.

Note that, in the domain wall memory of the present embodiment, each of the projection portion 511 and projection portion 512 in the magnetic member 50 has a substantially symmetric shape with respect to the direction of motion of the domain wall (here, in the Z direction), with the position having the maximum dimension of each portion 511, 512 being set as the center. In addition, in the present embodiment, the projection portions 511 and projection portions 512 are alternately arranged in the magnetic member 50 in the direction of motion of the domain wall.

Therefore, in the domain wall memory of the present embodiment, when the domain wall is shifted from one end side (e.g. word line side) of the magnetic member 50 to the other end side (e.g. bit line side) of the magnetic member 50, or when the domain wall is shifted from the other end side of the magnetic member 50 to the one end side of the magnetic member 50, in response to a predetermined shift pulse which is supplied, it is possible to suppress a variance in shift amount (motion distance) of the domain wall due to asymmetry in shape of each projection portion.

Furthermore, in the domain wall memory of the present embodiment, the pulse shape of the shift pulse in the case where the domain wall is moved from the one end side of the magnetic member 50 to the other end side (e.g. bit line side) of the magnetic member 50 can be made substantially identical to the pulse shape of the shift pulse in the case where the domain wall is moved from the other end side of the magnetic member 50 to the one end side of the magnetic member 50.

(b) Manufacturing Method

Referring to FIG. 5 to FIG. 9, a manufacturing method of the magnetic memory of the present embodiment will be described.

FIG. 5 to FIG. 9 are cross-sectional process views illustrating fabrication steps of the manufacturing method of the magnetic memory (e.g. domain wall memory) of the present embodiment.

Figure 5:
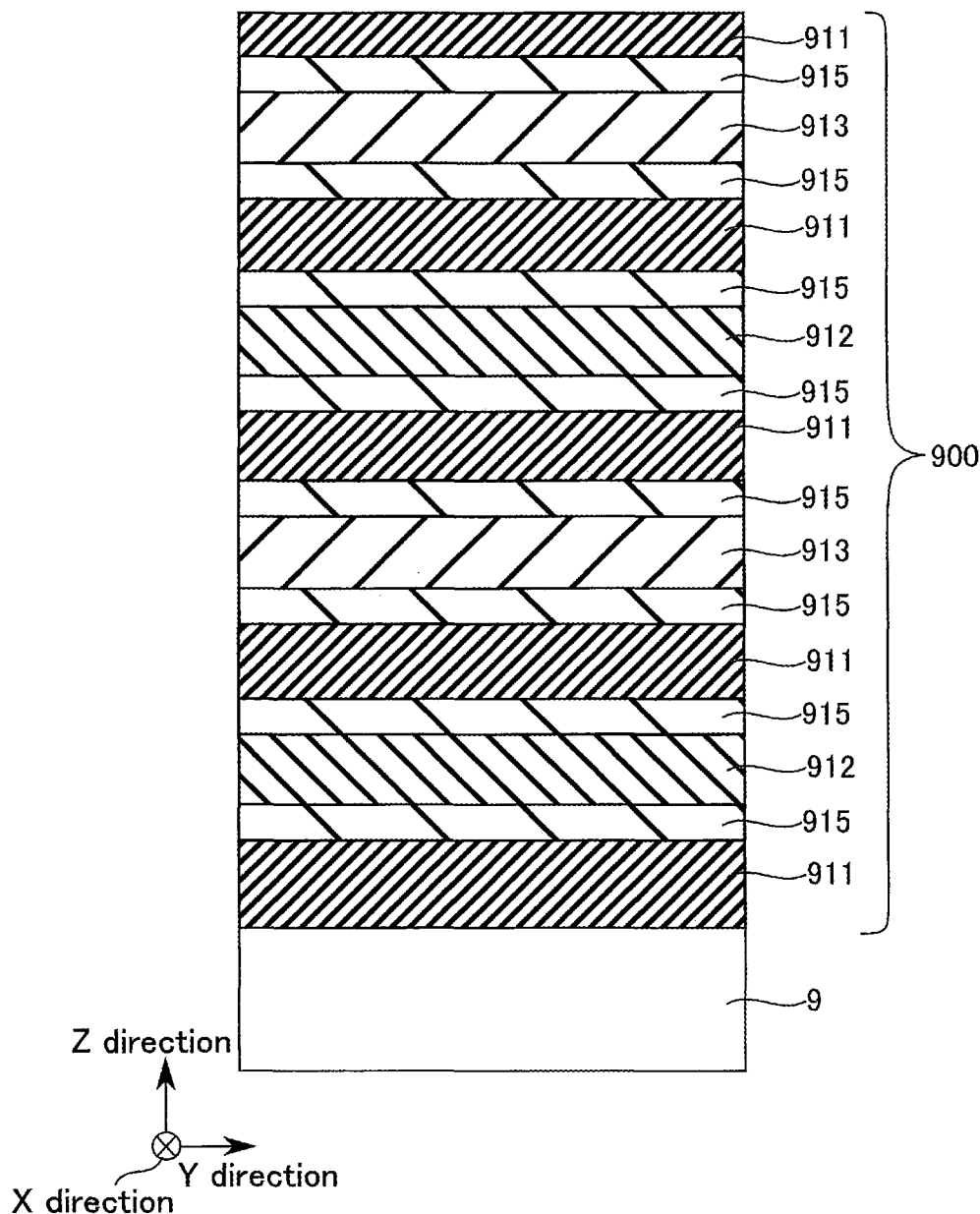
FIG. 5 is a cross-sectional process view illustrating a fabrication step of a manufacturing method of the magnetic memory of the first embodiment.

As illustrated in FIG. 5, a plurality of layers 911, 912, 913 and 915 are formed on the upper surface of the substrate 9 at predetermined cycles (arrangement). For example, before forming the layers 911, 912, 913 and 915, interconnects (not shown) having a predetermined pattern are formed in an insulating layer (not shown) on the substrate 9 or on an insulating layer on the substrate 9.

For example, a hafnium oxide layer (also referred to as "hafnia layer") ($HfO_2$ layer) 911 is formed on the substrate 9. A silicon oxide layer ($SiO_2$ layer) 912 is formed above the $HfO_2$ layer 911 in the Z direction. Further, a hafnium oxide layer 911 is formed above silicon oxide layer 912. Besides, a hafnium silicon oxide layer (also referred to as "hafnium silicate layer") ($HfSiO_4$ layer) 913 is formed above the hafnium oxide layer 911 in the Z direction.

In addition, a $HfO_2$ layer 911 is formed on the $HfSiO_4$ layer 913. Further, a $SiO_2$ layer 912 is formed above the $HfSiO_4$ layer 913 via the $HfO_2$ layer 911. In this manner, the $SiO_2$ layer 912 and the $HfSiO_4$ layer 913 are alternately formed in the Z direction, with the $HfO_2$ layer 911 being interposed.

In the present embodiment, the layers 911, 912 and 913 are formed such that the concentrations of constituent elements in the layers 911, 912 and 913 vary in the Z direction.

Thus, intermediate layers (hereinafter, also referred to as "concentration modulation layers") 915 are provided between the layers 911, 912 and 913. The intermediate layer 915 is a region where the concentrations of constituent elements in layers gradually vary from a central portion of one layer toward a central portion of the other layer. Between two layers, the concentration of a certain constituent element of one layer has a maximum value at a central portion of the one layer, and gradually decreases in the intermediate layer 915 toward a central portion of the other layer.

Figure 6:
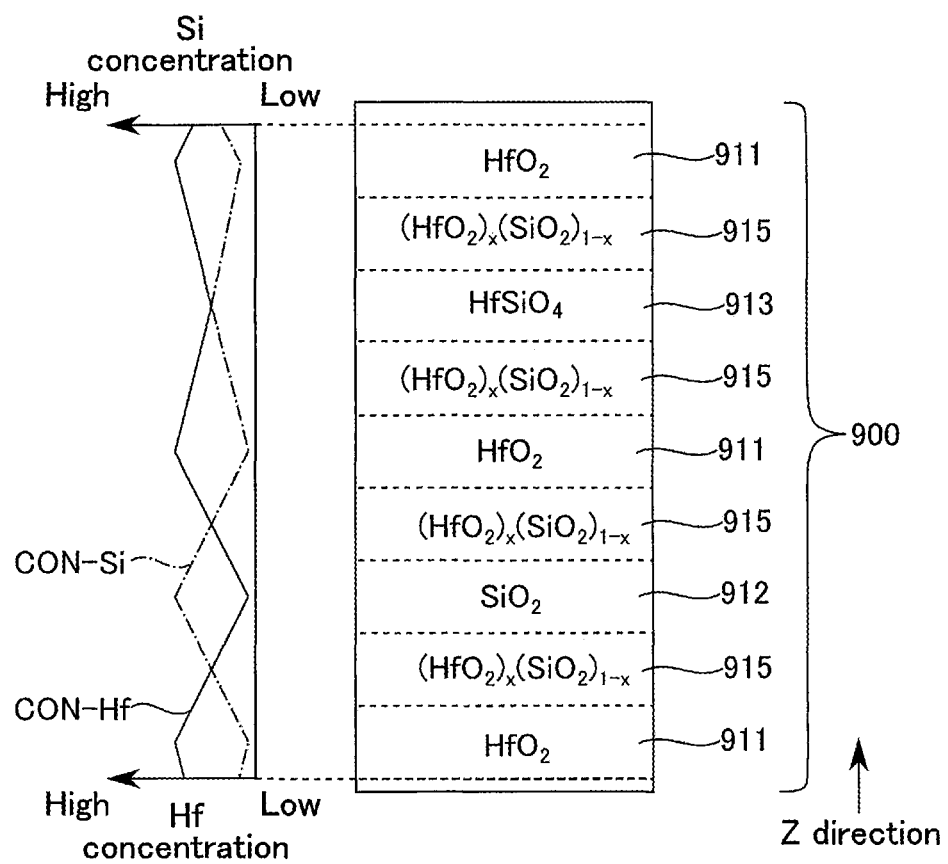
FIG. 6 is a view for explaining the manufacturing method of the magnetic memory of the first embodiment.

FIG. 6 is a schematic view for explaining variations of the concentrations of constituent elements in a stacked body.

FIG. 6 illustrates a variation (line CON-Hf) of the concentration of Hf and a variation (line CON-Si) of the concentration of Si in a stacked body 900.

As illustrated in FIG. 6, the concentration of Hf is highest in a central portion of the $HfO_2$ layer 911 and gradually lowers toward the $SiO_2$ layer 912. The concentration of Si is highest in a central portion of the $SiO_2$ layer 912 and gradually lowers toward the $HfO_2$ layer 911.

From the $HfO_2$ layer 911 toward the intermediate layer 915, the Hf element is replaced with the Si element. From the $SiO_2$ layer 912 toward the intermediate layer 915, the Si element is replaced with the Hf element.

The region 915 between the central portion of the $HfO_2$ layer 911 and the central portion of the $SiO_2$ layer 912 becomes an oxide region including Hf and Si. As a result, the intermediate layer 915 is formed between the $HfO_2$ layer 911 and the $SiO_2$ layer 912. The intermediate layer 915 is a $(HfO_2)_x(SiO_2)_{1-x}$ layer ($0<x<1$). The Hf concentration in the intermediate layer 915 is lower than the Hf concentration in the central portion of the $HfO_2$ layer 911, and is higher than the Hf concentration in the central portion of the $SiO_2$ layer 912. The Si concentration in the intermediate layer 915 is lower than the Si concentration in the central portion of the $SiO_2$ layer 912, and is higher than the Si concentration in the $HfO_2$ layer 911.

In accordance with the variation of the concentrations of the constituent elements in the Z direction, the properties of the layers 911, 912 and 915 vary in the Z direction.

Note that when the Hf concentration and Si concentration vary with gradients between the layers in the stacked body 900, there may be a case in which boundaries (interfaces) between the layers 911, 912 and 915 are not clear as in FIG. 6.

Between the $HfO_2$ layer 911 and $HfSiO_4$ layer 913, the Hf element is replaced with the Si element from the $HfO_2$ layer 911 toward the intermediate layer 915. The Si element is replaced with the Hf element from the $HfSiO_4$ layer 913 toward the intermediate layer 915.

Between the central portion of the $HfO_2$ layer 911 and the central portion of the $HfSiO_2$ layer 913, the Hf concentration of the intermediate layer 915 is lower than the Hf concentration in the central portion of the $HfO_2$ layer 911 and is higher than the concentration in the central portion of the $HfSiO_4$ layer 913. The Si concentration of the intermediate layer 915 is lower than the concentration in the central portion of the HfSiO₄ layer 913.

In accordance with the variation of the concentrations of the constituent elements in the Z direction, the properties of the layers 911, 913 and 915 vary in the Z direction.

Note that when the Hf concentration and Si concentration in the layers vary with gradients between the layers in the stacked body 900, there may be a case in which boundaries (interfaces) between the layers 911, 913 and 915 are not clear.

In this manner, the HfO₂ layers (HfO₂ regions) 911, SiO₂ layers (SiO₂ regions) 912, HfSiO₄ layers (HfSiO₄ regions) 913 and intermediate layers ((HfO₂)$_x$(SiO₂)$_{1-x}$ regions) 915 are formed in the stacked body 900 such that the concentration distribution of Hf and the concentration distribution of Si in the stacked body 900 vary with gradients in the Z direction.

In the present embodiment, the example is illustrated in which the stacked body 900 is formed by using the layers including Hf and the layers including Si. However, as materials of the layers that form the stacked body 900, use may be made of other insulators, for example, oxynitrides, silicates and aluminates, such as a nitride of silicon (also referred to as "silicon nitride" (SiN), silicon oxynitride (SiON), zirconium-silicon oxide (zirconium silicate) (Zr-SiO), hafnium-aluminum oxide (hafnium aluminate) (HfAlO), and hafnium-silicon oxynitride (HfSiON).

Figure 7:
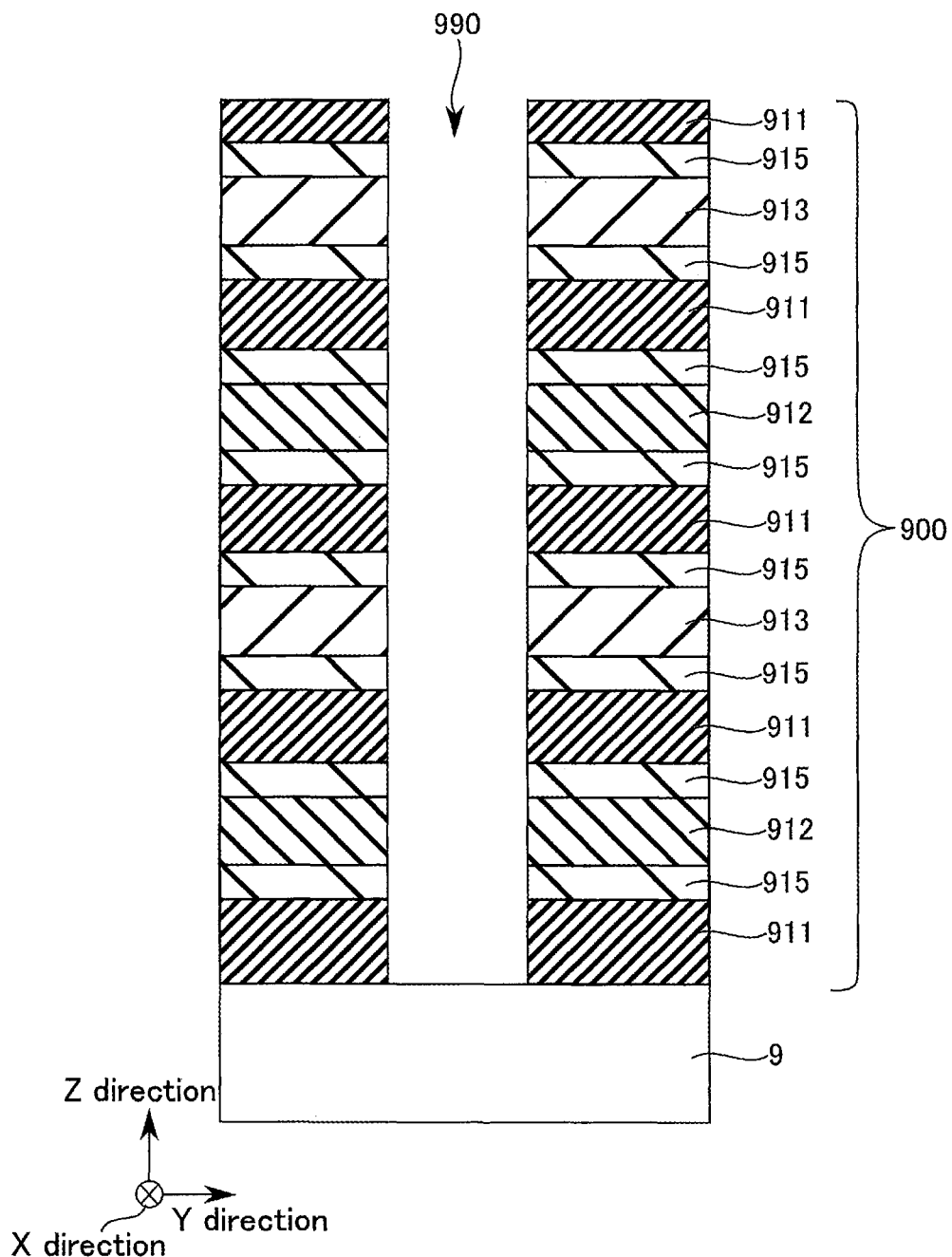

As illustrated in FIG. 7, a hole 990 is formed in the stacked body 900 by lithography and anisotropic etching (e.g. reactive etching). The hole 990 extends in the Z direction in the stacked body 900. A bottom portion of the hole 990 reaches the upper surface of the substrate 9.

Side surfaces of the layers 911, 912, 913 and 915 are exposed in the hole 990. Interconnects (not shown) on the substrate 9 are exposed via the hole 990. Note that each layer has a substantially uniform thickness in the layer, and layer surface of each layer is parallel to the upper surface of the substrate.

For example, the plan-view shape of the hole 990 as viewed in the Z direction is circular (or elliptic). In this case, the hole 990 has a cylindrical structure. Note that the plan-view shape of the hole 990 as viewed in the Z direction may be rectangular.

Thereafter, isotropic etching (e.g. wet etching) is performed on the stacked body 900.

Figure 8:
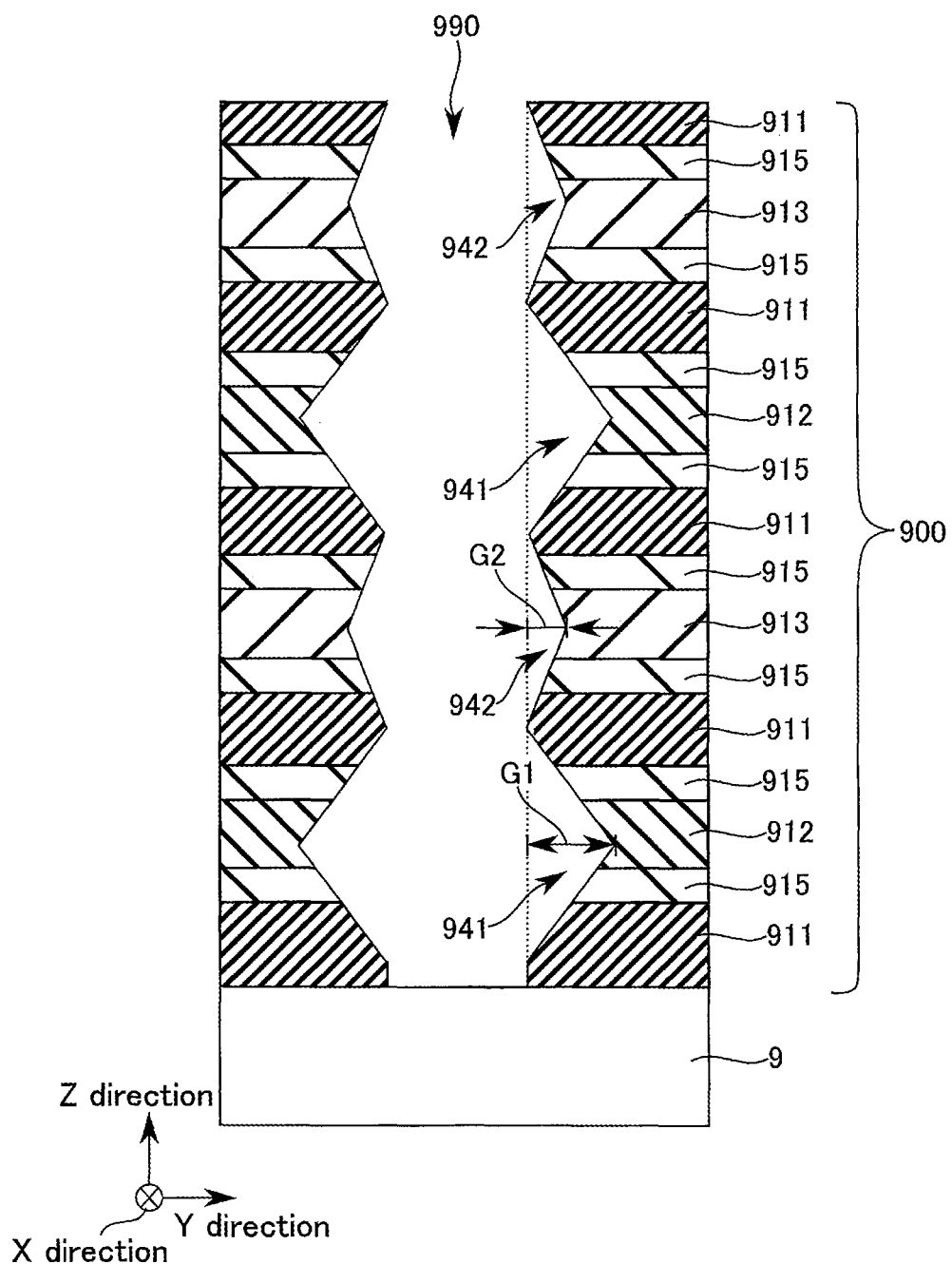

As illustrated in FIG. 8, the side surfaces of the layers 911, 912, 913 and 915 in the hole 990 retreat in a parallel direction to the upper surface of the substrate 9 by the isotropic etching.

The condition for the isotropic etching is set such that a large etching selectivity can be secured between the layer 911 including hafnium and the layer 912 including silicon.

For example, wet etching is performed by using hydrofluoric acid as an etching solution.

In this case, the etching amount (etching rate) of each layer 911, 912, 913 and 915 varies depending on the Si concentration in the layer. Thus, the etching amount of the SiO₂ layer 912 is greater than the etching amount of the HfO₂ layer 911. The etching amount of each of the HfSiO₄ layer 913 and the intermediate layer 915 is less than the etching amount of the SiO₂ layer and is greater than the etching amount of the HfO₂ layer.

Therefore, in the hole 990 in the stacked body 900, the side surface of the SiO₂ layer 912, the side surface of the HfSiO₄ layer 913 and the side surface of the intermediate layer 915 retreat in the parallel direction to the upper surface of the substrate 9, compared to the side surface of the HfO₂ layer 911.

Thereby, a recess 941 is formed at the position of the SiO₂ layer 912 (and intermediate layer 915), and a recess 942 is formed at the position of the HfSiO₄ layer 913 (and intermediate layer 915).

A depth G1 of the recess 941 in the parallel direction to the upper surfaced of the substrate 9 is greater than a depth G2 of the recess 942 in the parallel direction to the upper surface of the substrate 9.

In this manner, the recesses 941 and 942 with different depths are formed in the stacked body 900. As a result, a hole having a cyclically constricted structure in the Z direction (a hole having an opening dimension varying in the Z direction) is formed in the stacked body 900.

For example, as described above, when the SiO₂ layer, HfO₂ layer and HfSiO₂ layer are formed such that the Si concentrations and Hf concentrations thereof vary with gradients, the cross-sectional shape of the recess 941, 942 becomes triangular.

As illustrated in FIG. 9, in the hole 990, a magnetic layer 500 is formed on a side surface of the stacked body 900. The magnetic layer 500 covers the side surfaces of the layers 911, 912, 913 and 915 of the stacked body 900 in the hole 990, along the shapes of the recesses 941 and 942.

Thereby, the magnetic member 50 extending in the Z direction is formed in the stacked body 900. The magnetic member 50 includes the projection portions 511 and 512 and the concave portions 521 and 522. The magnetic member 50 has a cylindrical shape.

The projection portion 511 of the magnetic member 50 is formed in the recess 941. The projection portion 512 is formed in the recess 942. The concave portion 521, 522 is formed in a region between the recess 941 and recess 942 in the Z direction.

The magnetic member 50 is constricted in accordance with the shapes of the recesses 941 and 942. The dimension in the Y direction of the magnetic member 50 at the position of the recess 941 is greater than the dimension in the Y direction of the magnetic member 50 at the position of the recess 942.

As described above, the magnetic member 50 having the constriction structure is formed above the substrate 9.

Thereafter, the reproducing element, switching element and various interconnects are formed above the magnetic member 50. Thereby, the memory cell unit in the domain wall memory of the present embodiment is formed.

By the above manufacturing method, the domain wall memory of the present embodiment is formed.

Note that the hole with the constriction structure, which forms the magnetic member 50, may be formed by using anodic oxidation of a metal (e.g. aluminum).

(c) Operation Example

Referring to FIG. 10 to FIG. 19, an operation example of the domain wall memory of the present embodiment will be described.

(c-1) Outline of Shift Operation

Figure 10:
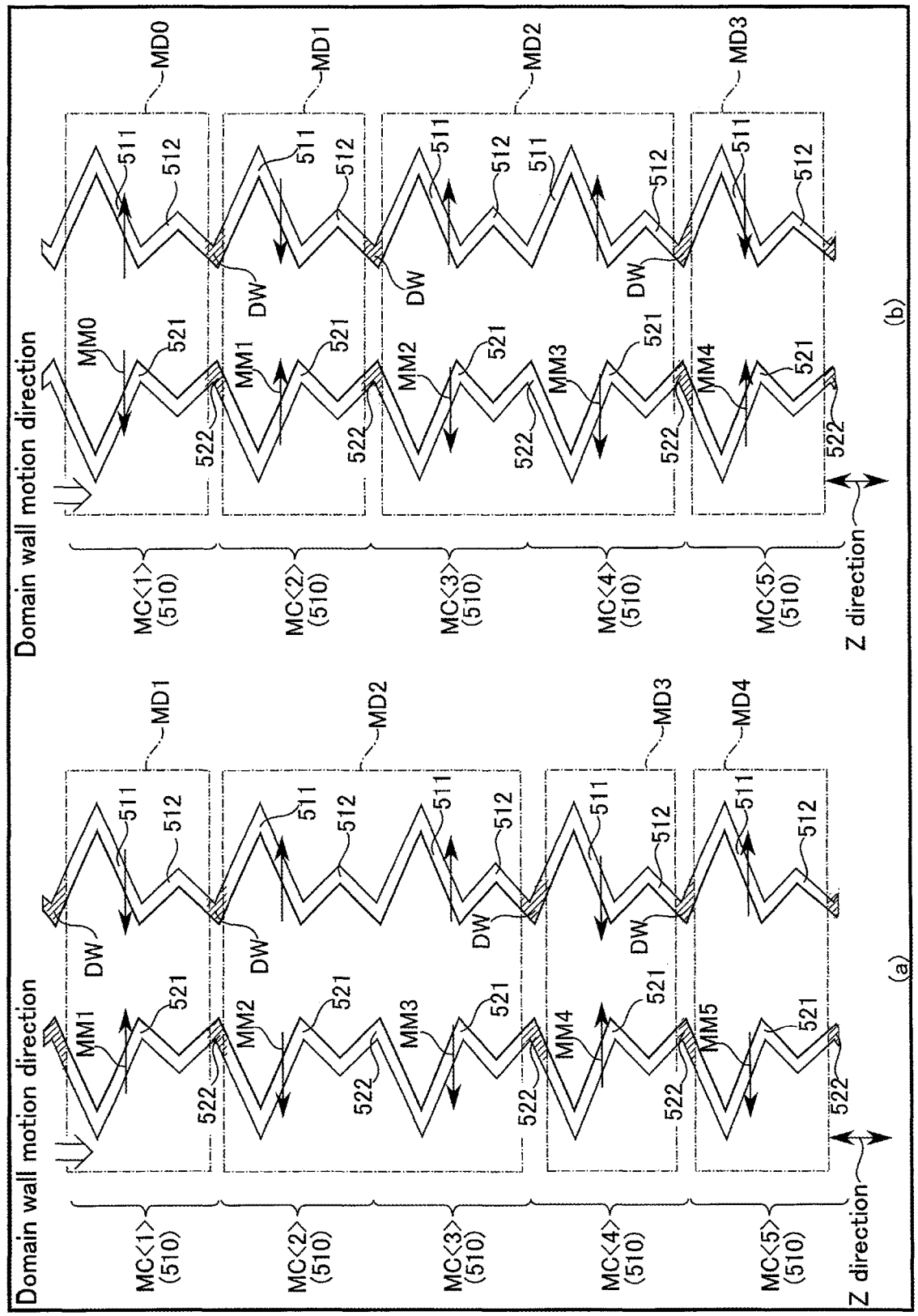
FIG. 10 is a view for explaining an operation example of the magnetic memory of the first embodiment.

FIG. 10 is a schematic diagram for explaining a shift operation of the domain wall memory of the present embodiment.

As illustrated in part (a) of FIG. 10, before supplying a shift pulse SP that is used in a shift operation, the memory cells MC (MC<1> to MC<5>) have magnetizations (magnetic domains) MM1, MM2, MM3, MM4 and MM5 corresponding to stored data.

In the example of FIG. 10, the magnetic member 50 has perpendicular magnetic anisotropy. For example, a magnetization, which is directed to the outside (outer peripheral side) of the cylindrical magnetic member 50, is associated with first data (one of "0" data and "1" data), and a magnetization, which is directed to the inside (center axis side) of the cylindrical magnetic member 50, is associated with second data (the other of "0" data and "1" data).

When the magnetization directions of two mutually neighboring memory cells MC are different (i.e. when mutually neighboring memory cells MC store different data), a domain wall DW is disposed in the concave portion 522 between the mutually neighboring memory cells.

The cell regions (magnetic portions) 510 corresponding to two mutually neighboring memory cells MC with different magnetization directions have magnetic domains MD (MD1, MD2, MD3, and MD4) separated by the domain wall DW.

When the magnetization directions of two mutually neighboring memory cells MC are identical (i.e. when mutually neighboring memory cells MC store identical data), a domain wall DW is not formed in the concave portion 522 between the two cell regions 510 corresponding to the mutually neighboring memory cells MC.

The mutually neighboring cell regions 510 with the identical magnetization direction have one magnetic domain MD which is continuous between the two cell regions 510. Note that there is a case in which one magnetic domain MD is formed to include three or more consecutive cell regions 510, depending on the arrangement of "1" and "0" of data stored in the memory cell unit.

For example, when the memory cells MC<2> and MC<3> store identical data (magnetization MM2 and MM3), one magnetic domain MD2 is formed to include two consecutive cell regions 510 in which the memory cells MC<2> and MC<3> are provided.

For example, when the data (magnetization MM4) of the memory cell MC<4> is different from the data (magnetization MM3) of the memory cell MC<3> and the data (magnetization MM5) of the memory cell MC<5>, domain walls DW are formed between the cell region 510, in which the memory cell MC<4> is provided, and the cell region 510, in which the memory cell MC<3> is provided, and between the cell region 510, in which the memory cell MC<4> is provided, and the cell region 510, in which the memory cell MC<5> is provided. Thus, magnetic domains MD2, MD3 and MD4, which are separated by the domain walls DW, are formed in the cell region 510 of the memory cell MC<3>, the cell region 510 of the memory cell MC<4> and the cell region 510 of the memory cell MC<5>, respectively.

The magnetic domain MD1 of the memory cell MC<1> is separated by the domain wall DW from the magnetic domain MD2 in the cell regions 510 of the memory cells MC<2> and MC<3>.

For example, in the magnetic member in the magnetic domain state of the example of part (a) of FIG. 10, a shift pulse SP is supplied to the magnetic member 50. Note that the direction of motion of electrons (e⁻) is opposite to the direction of motion of the shift pulse SP that is an electric current.

As illustrated in part (b) of FIG. 10, at the time of the shift operation, the shift pulse SP flows in the magnetic member 50. In the present example, electrons (e⁻) move in a direction from the memory cell MC<1> toward the memory cell MC<5>.

When the shift pulse SP is supplied to the magnetic member 50, all domain walls DW in the magnetic member 50 are substantially simultaneously moved in the magnetic member 50 by the shift pulse SP. In the present example, the direction of motion of the domain wall DW agrees with the direction of motion of electrons.

For example, the motion of the domain wall DW in the shift operation is due to STT (Spin transfer torque) and/or SOT (Spin orbit torque) occurring in the magnetic member.

In accordance with the motion of the domain wall DW, the magnetization (magnetic domain) MD in the cell region 510 moves.

Thereby, data shifts in the magnetic member 50 in the memory cell unit MU. For example, the magnetic domain MD1 of the cell region 510 in the memory cell MC<1> prior to the shift operation moves to the cell region 510 in the memory cell MC<2> by the shift operation. A magnetic domain MD0 (magnetization MM0) of a neighboring memory cell moves to the cell region 510 in the memory cell MC<1>.

In this manner, the magnetic domain MD is shifted by one memory cell (by one bit) by the motion of the domain wall DW.

In the present embodiment, the shift operation (motion of the domain wall/magnetic domain) is executed by the supply of a pulse (e.g. a current pulse) to the magnetic member 50 in such a manner that the domain wall DW is located in the concave portion 522 of the magnetic member 50 of the constriction structure. At the time of the shift operation, the domain wall DW moves in two steps to the concave portion 522 via the concave portion 521.

In the magnetic member 50 of the constriction structure, the domain wall DW can exist more stably in the magnetic region with a small volume (e.g. the concave portion in this embodiment), than in the magnetic region with a large volume (e.g. the projection portion in this embodiment).

Therefore, there is a tendency that the domain wall DW, which is moved by the shift operation, is located in the concave portion 521, 522 (and in a region near the concave portion 521, 522), compared to the projection portion 511, 512.

As a result, when the magnetic member 50 of the constriction structure is used, the controllability of the position of the domain wall DW in the magnetic member 50 can be enhanced.

As will be described below, in the domain wall memory of the present embodiment, the shift pulse SP includes a plurality of pulses. Thereby, the domain wall DW is moved in the memory cell unit MU such that the domain wall DW is located in the concave portion (domain wall retention portion) 522 of the memory cell MC via the concave portion 521.

In the present embodiment, an example is illustrated in which the domain wall moves in the magnetic member along the direction of motion of electrons by the shift pulse SP at the time of the shift operation.

Note that the direction of motion of the domain wall at the time of the pulse operation can be controlled by the material of the magnetic member, the material of a conductive member stacked on the magnetic member, the position of the conductive member relative to the magnetic member, and manufacturing conditions. When a conductive member is stacked on the magnetic member, for example, platinum (Pt), tungsten (W), tantalum (Ta), etc. can be used as the material of the conductive member. However, the materials of the conductive member are not limited to these.

In the present embodiment, the magnetic member 50 may have in-plane magnetic anisotropy. In this case, the magnetization easy axis direction of the magnetic member 50 is parallel to the Z direction. When the magnetic member 50 has the in-plane magnetic anisotropy, for example, magnetic layers with in-plane magnetic anisotropy may be used for the magnetic layers 11 and 12 of the MTJ element 10.

(c-2) Shift Pulse

Figure 11:
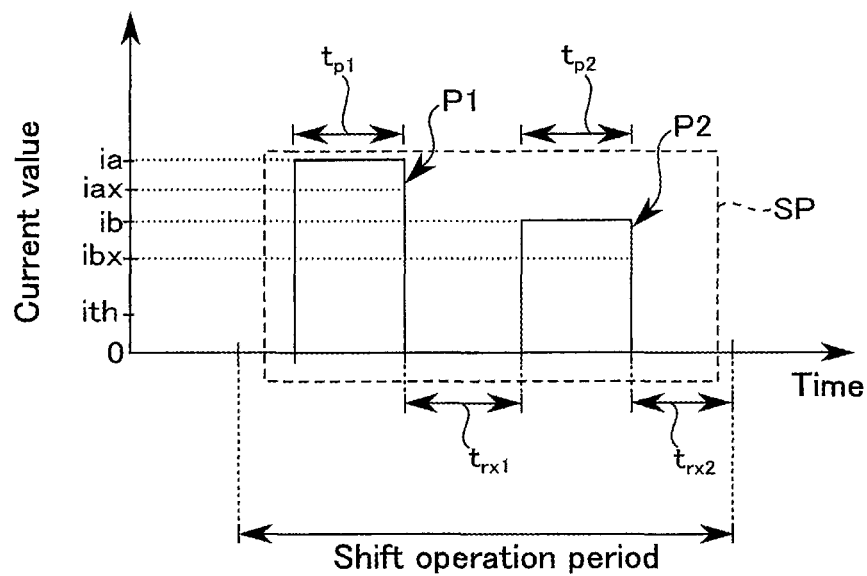
FIG. 11 and FIG. 12 are views illustrating pulse waveforms used in the operation of the magnetic memory of the first embodiment.

FIG. 11 is a waveform diagram illustrating a shift pulse used in the shift operation of the domain wall memory of the present embodiment. The abscissa axis of FIG. 11 corresponds to time, and the ordinate axis of FIG. 11 corresponds to an absolute value of a current value.

As illustrated in FIG. 11, in the shift operation of the domain wall memory of the present embodiment, the shift pulse SP is supplied during a period (hereinafter referred to as "shift operation period") TS of the shift operation.

The shift pulse (hereinafter, also referred to as "shift current") SP is, for example, a current pulse.

In the present embodiment, the shift current SP includes a first pulse P1 and a second pulse P2. By the pulses P1 and P2 which are supplied, the energy for moving the domain wall is applied to the domain wall in the magnetic member.

The first pulse P1 has a current value ia. The first pulse P1 has a pulse width $t_{p1}$. The second pulse P2 has a current value ib. The second pulse P2 has a pulse width $t_{p2}$.

The current value ia is equal to or greater than a current value iax. The current value iax is a current value of a critical current for moving the domain wall DW from the concave portion 522 to the concave portion 521 via the projection portion 511.

The current value ib is equal to or greater than a current value ibx. The current value ibx is a current value of a critical current for moving the domain wall DW from the concave portion 521 to the concave portion 522 via the projection portion 512.

The current values iax and ibx are higher than a threshold (hereinafter, also referred to as "domain wall shift threshold") ith of motion (shift) of the domain wall in the magnetic member 50 of the constriction structure.

The domain wall shift threshold in the magnetic member 50 of the constriction structure is indicative of a current value at which the domain wall begins to move (shift) by the function of energy due to SOT and/or STT by current (electrons).

For example, the domain wall shift threshold ith in the magnetic member 50 of the constriction structure can be calculated by a product of a minimum value of a cross-sectional area (e.g. a cross-sectional area of the concave portion 522 as viewed in the Z direction) of the cell region 510 in the Z direction and a critical current density for the shift of the domain wall. The critical current density for the shift of the domain wall in the magnetic member varies depending on the material of the magnetic member and the structure of the magnetic member.

Here, it is assumed that the cross-sectional area at the position of the concave portion 522 (or concave portion 521) in the magnetic member 50 is a minimum value of the cross-sectional area of the cell region 510 (magnetic member 50). When a current of the current value ith is supplied to the magnetic member, the domain wall in the concave portion 522 shifts toward the projection portion 511 (or projection portion 512). However, since the current value ith is less than the current values iax and ibx, the domain wall cannot move beyond the apex portion of the projection portion 511 even if the domain wall shifts to a region between the apex portion of the projection portion 511 (a portion with a maximum cross-sectional area of the projection portion 511) and the concave portion 522. Therefore, before and after the supply of the current of the current value ith to the magnetic member, the position of the domain wall DW in the concave portion 522 does not substantially change. When the cross-sectional area of the concave portion 521 is greater than the cross-sectional area of the concave portion 522, even if the current of the current value ith is supplied to the magnetic member 50, a domain wall that may exist in the concave portion 521 does not move (shift).

When the current value of the current supplied to the magnetic member 50 is less than the domain wall shift threshold ith, no motion (shift) of the domain wall occurs in the magnetic member 50.

For example, the magnitude of the pulse width $t_{p2}$ is substantially equal to the magnitude of the pulse width $t_{p1}$. However, the magnitude of the pulse width $t_{p2}$ may be different from the magnitude of the pulse width $t_{p1}$.

For example, each pulse width ($t_{p1}$ and $t_{p2}$) is a value based on a full width at half maximum of each pulse (P1 and P2). However, if the standard for defining the magnitude of the pulse width is common to two pulses, the pulse width $t_{p1}$ and $t_{p2}$ may be defined based on a standard other than the full width at half maximum.

In the present embodiment, as regards the pulse P1 of the shift current SP, the pulse width $t_{p1}$ of the pulse P1 has a magnitude based on a period during which the domain wall in the domain wall retention portion 522 of a certain memory cell moves into the projection portion 512 (or concave portion 521, 522) of a memory cell MC neighboring by one cycle, when the shift current of a certain current value ia is supplied.

As regards the pulse P2 of the shift current SP, the pulse width $t_{p2}$ of the pulse P2 has a value based on a period during which the domain wall in the domain wall retention portion 521 moves to the concave portion (domain wall retention portion) 522 of the memory cell MC (or a region between the apex portion of the projection portion 512 of a certain memory cell MC<k> and the apex portion of the projection portion 511 of another memory cell MC<k+1>).

Note that the apex portion of the projection portion 511 corresponds to a portion with the maximum dimension D1 in the projection portion 511. The apex portion of the projection portion 512 corresponds to a portion with the maximum dimension D2 in the projection portion 512.

For example, the pulse width (the time of motion of the domain wall DW) $t_{p1}$ of the pulse P1 is set in accordance with a time for the motion over a dimension which is equal to or greater than the dimension L1 in the Z direction from the concave portion (the domain wall retention portion of the memory cell MC) 522 to the concave portion 521 in the direction of motion of the domain wall (the dimension of the projection portion 511 in the direction of motion of the domain wall DW), and which is less than a dimension "L1+L2" from the concave portion 522 to the concave portion 522 in the direction of motion of the domain wall, when the shift current of a certain current value is ia supplied. Note that the dimension L3 (L4) in the Z direction of the concave portion 521 (522) is set to be sufficiently smaller than the dimension L1 (L2). Here, the dimensions L3 and L4 are approximated to zero.

It is preferable that the distance of motion of the domain wall at a time when the pulse P1 of the pulse width $t_{p1}$ is supplied is a value approximated to a distance to a substantially middle position between two projection portions 511 which neighbor in the direction of motion of the domain wall.

For example, it is preferable that when the shape of a projection portion 511 is configured to be symmetric in the left-and-right direction (symmetric in the up-and-down direction) with respect to the direction of motion of the domain wall, the distance of motion of the domain wall at the time of supply of the pulse P1 is approximated to a distance "L1+L2/2" [to a middle position between the position of L1/2 of the projection portion 511 and the position (L1/2+L1+L2) of a projection portion 511 which neighbors in the direction of motion of the domain wall, with the projection portion 512 being interposed].

The velocity of motion of the domain wall DW between the concave portions 522 and 521 can be calculated by using the time of motion of the domain wall DW (the pulse width of the pulse) and the distance L1 between the two concave portions 522 and 521. Note that, here, the actual length of the magnetic portion, which functions as the projection portion 511 (or projection portion 512), is approximated to the dimension L1 in the Z direction of the projection portion 511 (or the dimension L2 in the Z direction of the projection portion 512).

Preferably, the current values ia and ib have a relationship of a mathematical expression (eq1) below.

$$ia > A_L Jc > ib > A_S Jc \quad (eq1)$$

Here, the maximum value of the cross-sectional area of the projection portion (large projection portion) 511 is indicated by "$A_L$", and the maximum value of the cross-sectional area of the projection portion (small projection portion) 512 is indicated by "$A_S$". In addition, the critical current density for moving the domain wall is indicated by "Jc".

In the expression (eq1), "$A_L Jc$" corresponds to the current value iax, and "$A_S Jc$" corresponds to the current value ibx.

For example, a motion velocity $v_{DW}$ of the domain wall can be expressed by the following equation (eq2).

$$v_{DW} = C \times ((J/Jc)^2 - 1)^{1/2} \quad (eq2)$$

Here, "C" is a proportionality factor, and "J" is a current density of current used in the shift. The current density in the pulse P1 of the current value ia is indicated by "Ja". The current density in the pulse P2 of the current value ib is indicated by "Jb".

At a time when a current Iz with a certain current value is being supplied to the magnetic member 50, the current density J is expressed by the following equation (eq3).

$$J = Iz/A(z) \quad (eq3)$$

Here, "A(z)" is indicative of a cross-sectional area at a position (z) in the Z direction in the magnetic member 50. Note that the current value of the pulse current Iz is constant without depending on the position in the magnetic member 50.

The motion distance "L" of the domain wall is expressed as follows.

$$L = v_{DW} \times t_p = C \times ((Iz/(A(z) \times Jc))^2 - 1)^{1/2} \times tp$$

Note that "tp" is the pulse width of the current Iz.

In this manner, the motion distance L of the domain wall is controlled in accordance with the current value of the pulses P1 and P2, which serves as the current Iz, and the pulse width tp of the pulses P1 and P2.

In the present embodiment, as regards the pulse P2 of the shift current SP, when the pulse P2 of the current value ib is supplied to the magnetic member 50, the magnitude of the current ib (and the magnitude of the pulse width $t_{p2}$) is set such that the domain wall DW in the concave portion 521, 522 of a certain memory cell MC<k> does not shift into a neighboring memory cell MC<k+1>.

In the present embodiment, the two pulses P1 and P2 of the shift current SP have mutually different current values ia and ib.

For example, a period (hereinafter, also referred to as "relaxation period") $t_{rx1}$ is provided between the first pulse P1 and the second pulse P2. The relaxation period $t_{rx1}$ corresponds to a time until magnetization enters an equilibrium state. In the relaxation period $t_{rx1}$ with the magnetization entering the equilibrium state, the magnetic state of the shifted domain wall DW stabilizes.

A certain period (relaxation period) $t_{rx2}$ is provided from the stop of the supply of the second pulse P2 to the terminal end of the shift operation (the start of the next supply of the shift current SP). In the relaxation period $t_{rx2}$ after the supply of the second pulse P2, the magnetic state of the domain wall moved by the pulse P2 is stabilized.

Figure 12:
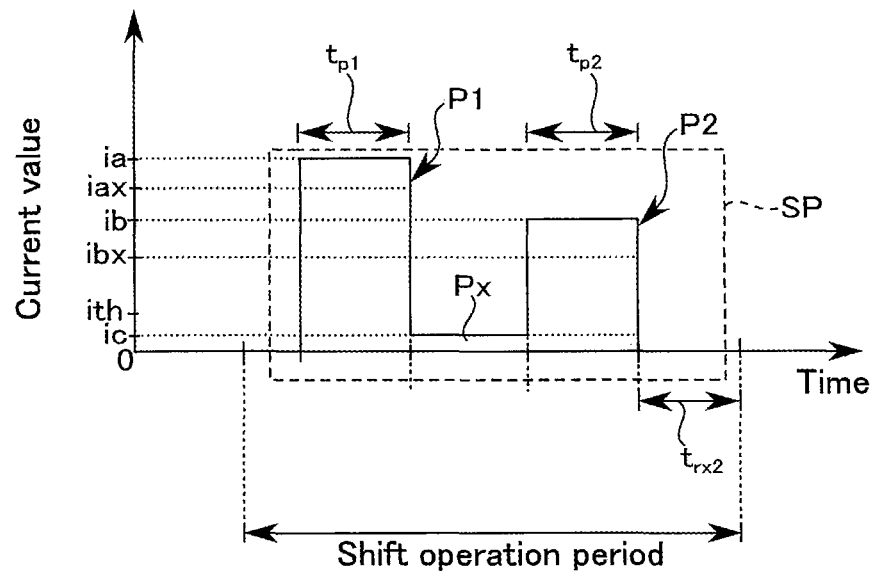

FIG. 12 is a waveform diagram illustrating a modification of the shift current of the domain wall memory of the present embodiment.

As illustrated in FIG. 12, if the current value of the shift current SP is less than the domain wall shift threshold ith, the current value of the shift current SP may have a value ic which is greater than 0, in the period (relaxation period) between the two pulses P1 and P2.

The current value ic is greater than 0 and less than the domain wall shift threshold ith.

In this case, the two pulses P1 and P2 of the shift current have a continuous pulse shape with a current value of 0 or more.

The domain wall memory of the present embodiment can shift the domain wall, in two motion steps, to a predetermined position (target position) in the magnetic member 50 having the constriction structure, by the shift current SP including the two pulses P1 and P2 with different current values, as illustrated in FIG. 11 and FIG. 12.

(c-3) Mechanism

Referring to FIG. 13 to FIG. 17, a mechanism of the shift operation in the domain wall memory of the present embodiment will be described.

FIG. 13 to FIG. 17 are schematic views illustrating states of motion of the domain wall at the time of the shift operation in the domain wall memory of the present embodiment. FIG. 13 to FIG. 17 illustrate distributions of existence probability of the domain wall (DW) in the magnetic member. Note that FIG. 13 also illustrates, for the purpose of clearer description, the transition of the variation of the cross-sectional area of the magnetic member in relation to the position in the magnetic member of the constriction structure.

Note that the cross-sectional area at a certain position in the magnetic member has a correlation with the volume of the domain wall at that position in the magnetic member. Therefore, based on the width of the domain wall and the cross-sectional area of the magnetic member in relation to the position in the magnetic member, the magnitude of the volume of the magnetic member in relation to the position in the magnetic member can equivalently be calculated.

Figure 13:
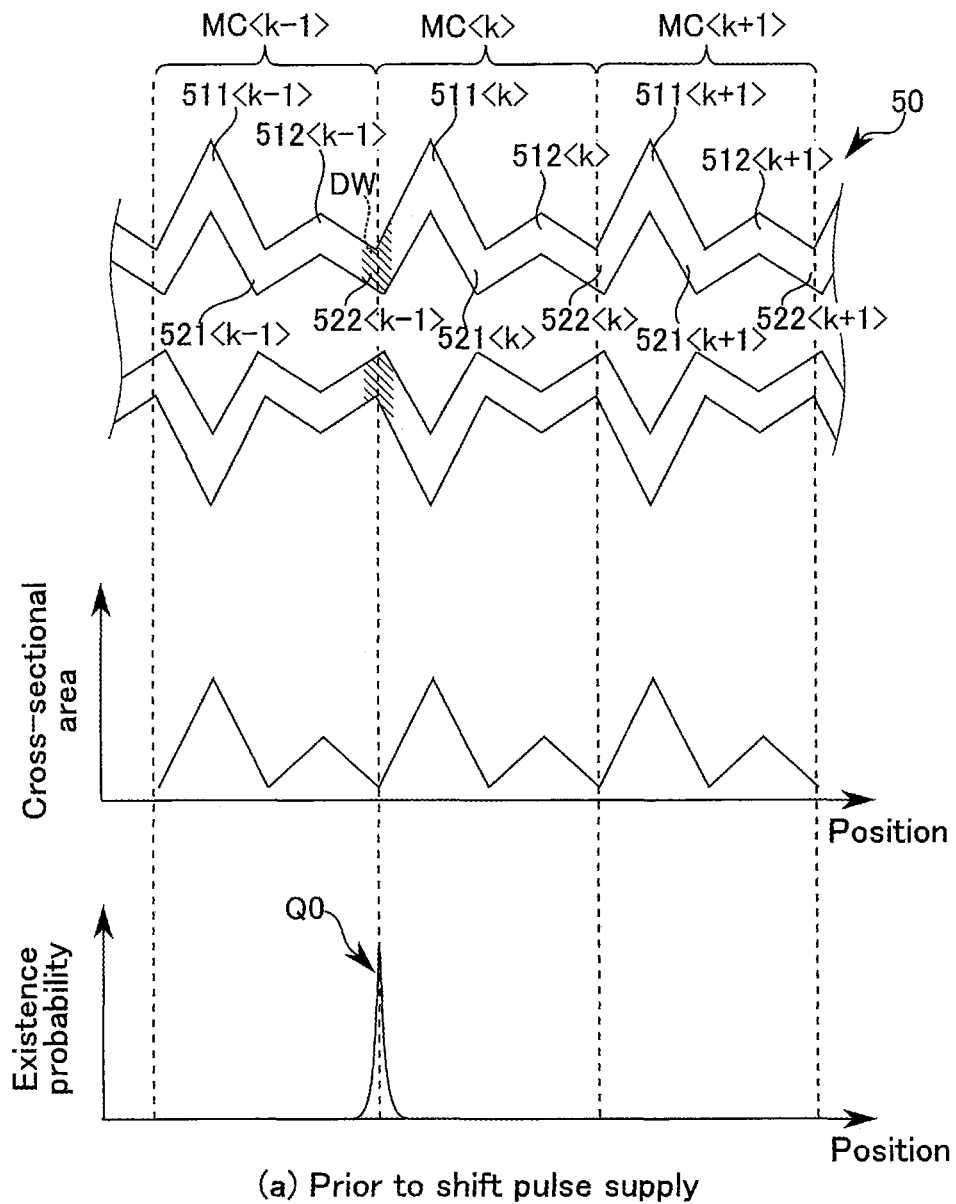
FIG. 13, FIG. 14, FIG. 15, FIG. 16, FIG. 17, FIG. 18 and FIG. 19 are views for explaining an operation example of the magnetic memory of the first embodiment.

In the example illustrated in FIG. 13, prior to the supply of the shift current, the domain wall DW is retained in a memory cell MC<k−1>. The domain wall DW is disposed in a concave portion 522<k<1> of the memory cell MC<k−1> or a region near the concave portion 522<k−1> with a certain existence probability Q0.

When the domain wall DW is moved from the memory cell MC<k−1> to a memory cell MC<k>, the shift current SP including two pulses P1 and P2 is supplied to the magnetic member 50.

Figure 14:
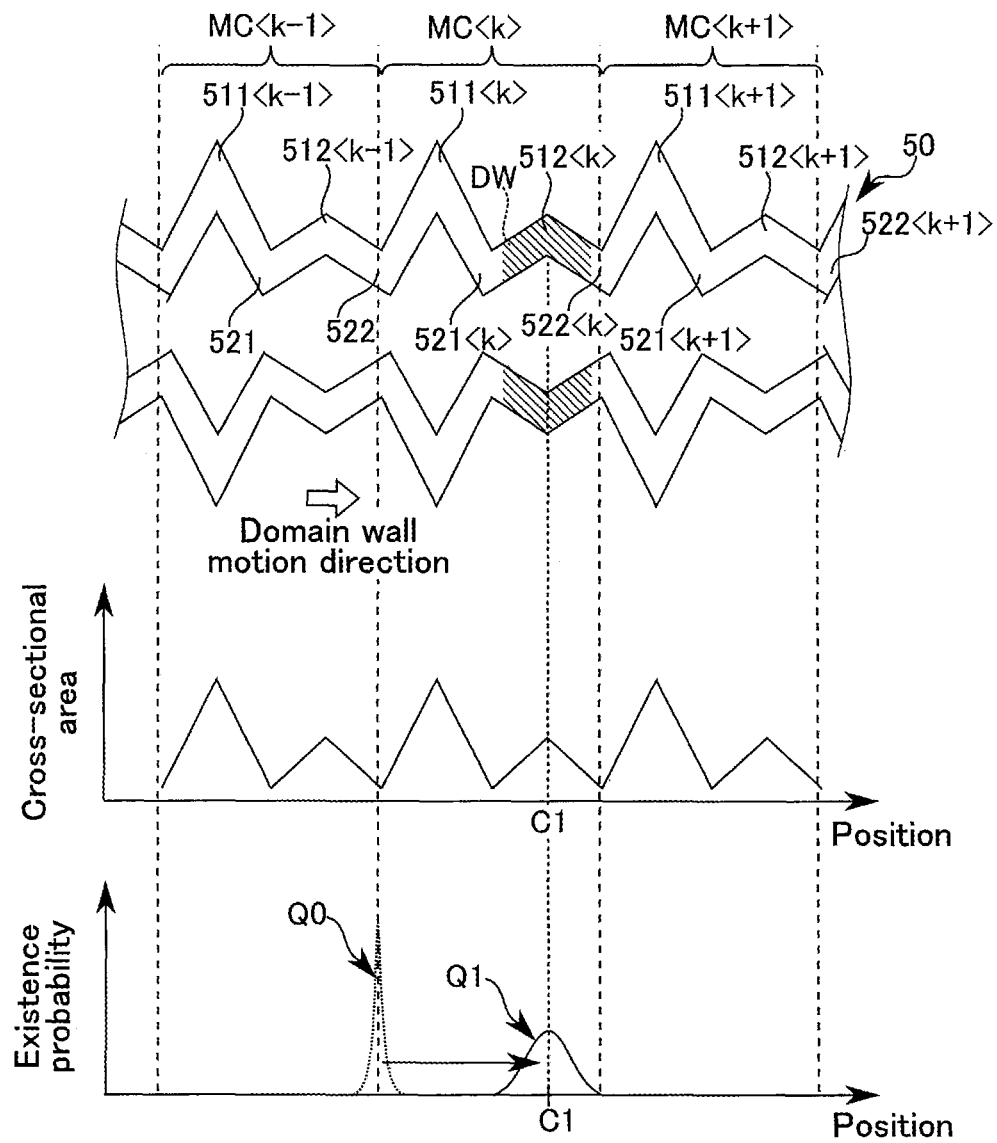

As illustrated in FIG. 14, the first pulse P1 having a current value ia (ia>iax) is supplied to the magnetic member 50. The pulse P1 has a pulse width $t_{p1}$. Thereby, a current corresponding to the current value ia flows in the magnetic member 50 during a period corresponding to the pulse width $t_{p1}$.

By the supplied pulse P1, the domain wall DW in the concave portion 522 moves from the memory cell MC<k−1> into the neighboring memory cell MC<k>. For example, the domain wall DW moves along the direction of motion of electrons.

In the memory cell MC<k>, the domain wall DW moves into a projection portion 512<k> via a projection portion 511<k> by the pulse P1.

Preferably, the current value ia and pulse width $t_{p1}$ of the pulse P1 are set such that the domain wall DW moves to an intermediate position (e.g. a position C1) between the projection portion 511<k> and a projection portion 511<k+1>.

Due to a variance in motion amount of the domain wall DW with respect to the supplied pulse P1 and a variance in magnetic characteristics of respective portions in the magnetic member 50, a distribution Q1 of the existence probability of the domain wall DW in the region from the projection portion 511<k> to the projection portion 511<k+1> is wider than a distribution Q0. A standard deviation σ of the existence probability distribution of the domain wall and a motion distance L of the domain wall vary while keeping the relation of $\sigma^2/L$ substantially constant, when a motion velocity v of the domain wall is assumed to be constant.

After the supply of the pulse P1, the shift operation temporarily enters a standby state during a period (relaxation period) $t_{rx1}$ from the stop of supply of the pulse P1 to the start of supply of the pulse P2. In the magnetic member 50, the magnetic state of the projection portion 511, 512 and concave portion 521, 522 transitions into a relaxation state (equilibrium state) by the stop of supply of the pulse P1.

Figure 15:
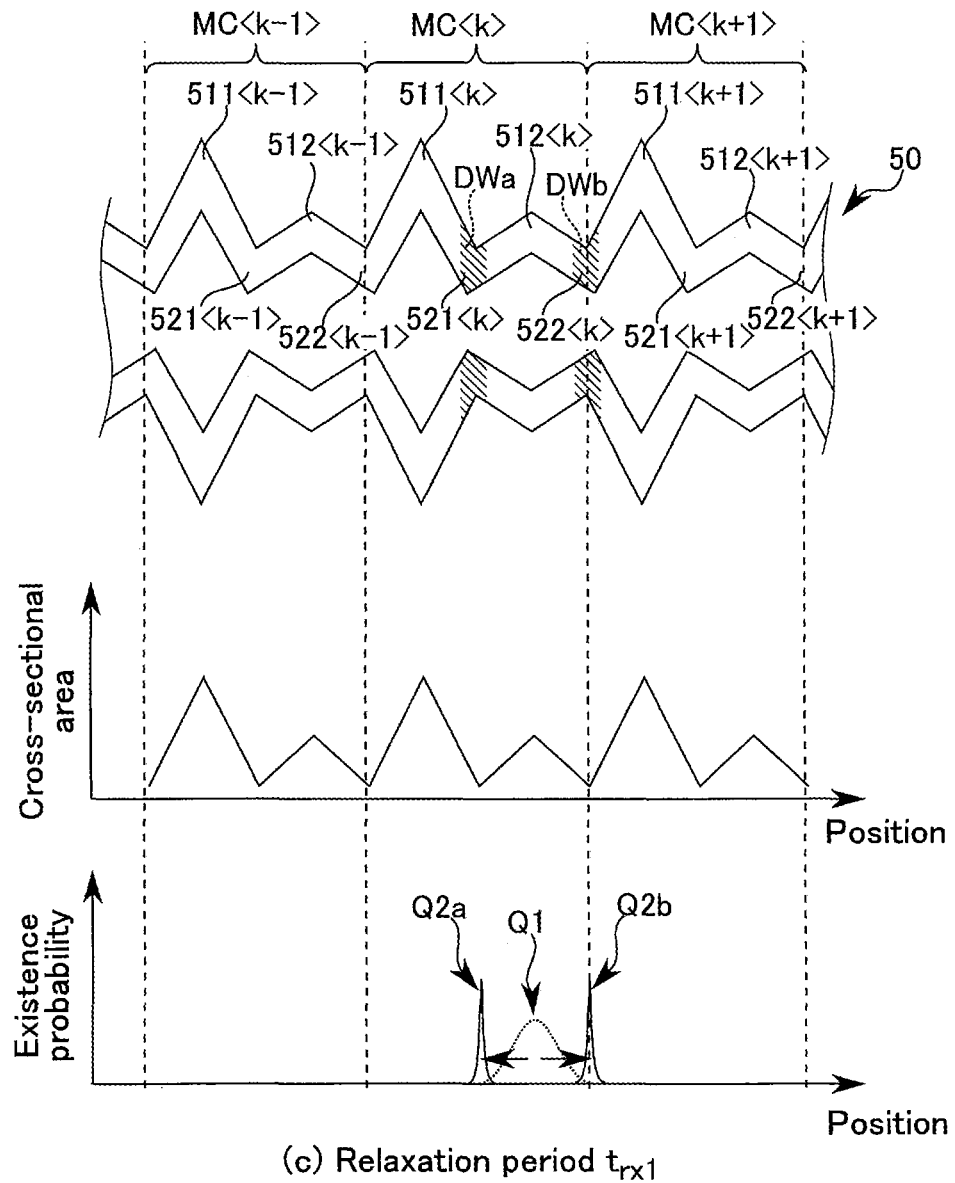

As illustrated in FIG. 15, during the relaxation period $t_{rx1}$ after the supply of the pulse P1, the moved domain wall moves to a portion with a smaller volume (a portion with a smaller dimension) in the magnetic member 50 from the portion where the domain wall currently exists, such that the domain wall enters a stabler energy state.

Therefore, domain walls DWa and DWb in the memory cell MC<k> shift from the projection portion 512<k> to concave portion 521<k> or from the projection portion 512<k> to concave portion 522<k>.

As a result, during the relaxation period $t_{rx1}$, the existence probability (distributions Q2a and Q2b) of the domain walls DWa and DWb in the memory cell MC<k> increases in a region near the boundary between the projection portion 512<k> and concave portion 521<k> or in a region near the boundary between the projection portion 512<k> and concave portion 522<k>.

Figure 16:
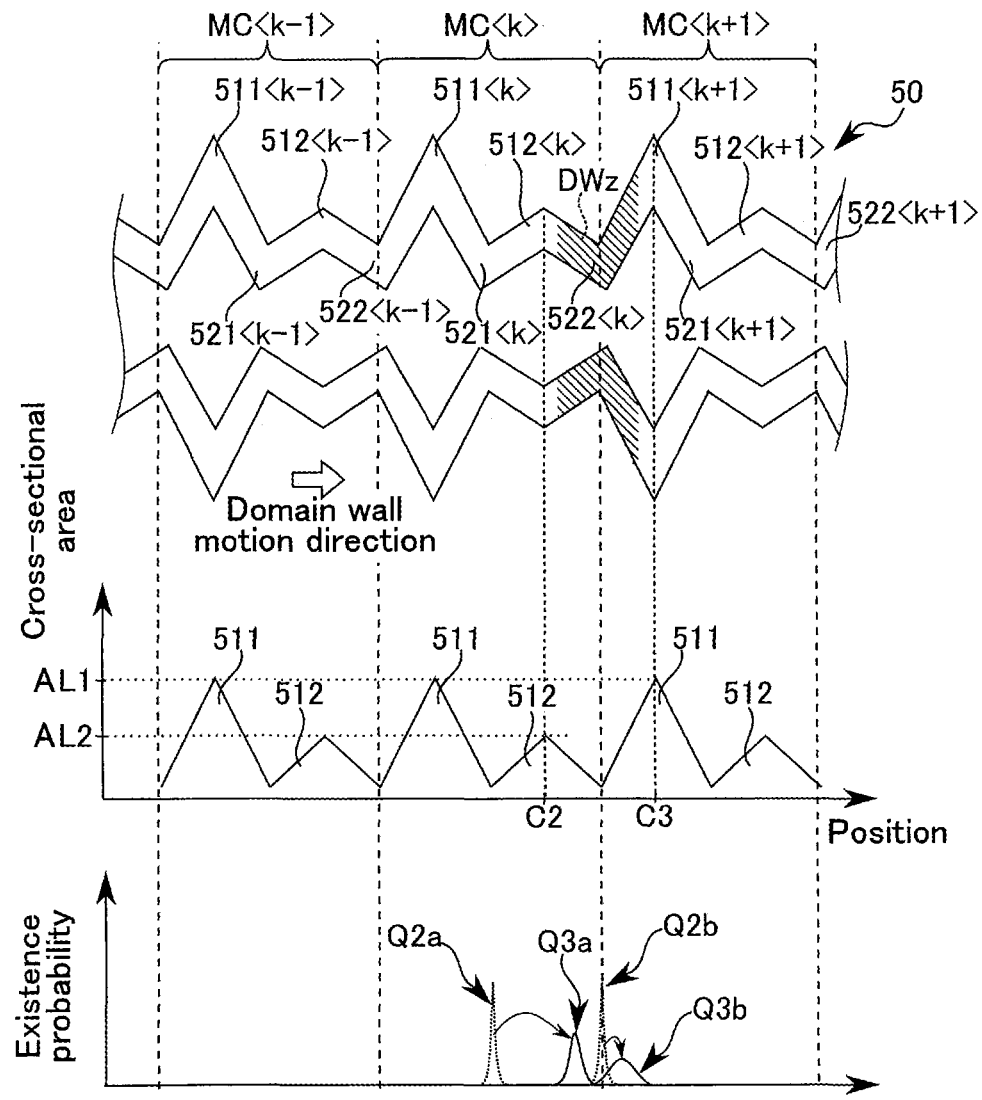

As illustrated in FIG. 16, after the passage of the relaxation period $t_{rx1}$ the pulse P2 having a current value ib (iax>ib>ibx) is supplied to the magnetic member 50. The current value ib of the pulse P2 is set to a current value which is equal to or greater than such a current value that the domain wall DWa can move beyond a portion (a position with the dimension D2) having a maximum value VL2 of the volume (a maximum cross-section AL2) in the projection portion 512. The pulse P2 has a pulse width $t_{p2}$. Thereby, a current corresponding to the current value ib flows in the magnetic member 50 during a period corresponding to the pulse width $t_{p2}$.

As described with reference to FIG. 15, at the time of the start of the supply of the pulse P2, the domain wall DW exists in the region near the concave portion 521<k> or the region near the concave portion 522<k>.

When the domain wall DW exists in the concave portion 521<k>, the domain wall DWa in the concave portion 521<k> moves beyond the projection portion 512<k> into the concave portion 522<k> by the energy due to the pulse P2 with the current value ib.

The current value ib of the pulse P2 is set to such a current value (e.g. a value less than the current value ia) that the domain wall DWb does not move beyond a portion (a position with the dimension D1) having a maximum value VL1 of the volume (a maximum cross-section AL1) in the projection portion 511. The energy (e.g. spin torque), which the domain wall in the concave portion 521<k> receives from the pulse P2, is the energy by which the domain wall DWb can move into the projection portion 512<k>, but is less than the energy by which the domain wall DWb can move into the concave portion 521<k+1> via the projection portion 511<k+1>.

Therefore, even if the energy due to the pulse P2 is applied to a domain wall which may exist in the concave portion 521<k>, the domain wall DWb can move beyond the projection portion 512<k> but cannot move beyond the projection portion 511<k+1>.

When a domain wall exists in the concave portion 522<k>, the domain wall DWb in the concave portion 522<k> receives the pulse P2 of the current value ib. The current value ib of the pulse P2 is set to such a current value (e.g. a value less than the current value ia) that the domain wall DWb does not move beyond a portion (a position with the dimension D1) C3 having the maximum value VL1 of the volume in the projection portion 511. The energy (e.g. spin torque), which the domain wall DWb in the concave portion 522<k> receives from the pulse P2, is less than the energy with which the domain wall DWb moves into the concave portion 521<k+1> via the projection portion 511<k+1>.

Therefore, even if the energy due to the pulse P2 is applied to the domain wall DWb which may exist in the concave portion 522<k>, the domain wall DWb does not move beyond the projection portion 511<k+1>.

Accordingly, a domain wall DWz at the time when the pulse P2 is supplied is located in the region between the position (the portion with the dimension D2) C2 having the maximum value of the volume (the maximum cross-section) of the projection portion 512<k> and the position (the portion with the dimension D1) C3 having the maximum value of the volume (the maximum cross-section) of the projection portion 511<k+1>.

After the stop of supply of the pulse P2, the magnetic state of the magnetic member 50 enters an equilibrium state (relaxation state).

In a relaxation period $t_{rx2}$ after the supply of the pulse P2, the domain wall DW moves, for example, by an internal magnetic field occurring in the magnetic member of the constriction structure, to a portion (a portion with a smaller dimension) having a smaller volume than the volume of the portion where the domain wall is currently disposed in the magnetic member 50, in such a manner that the domain wall DW enters a stabler energy state.

Figure 17:
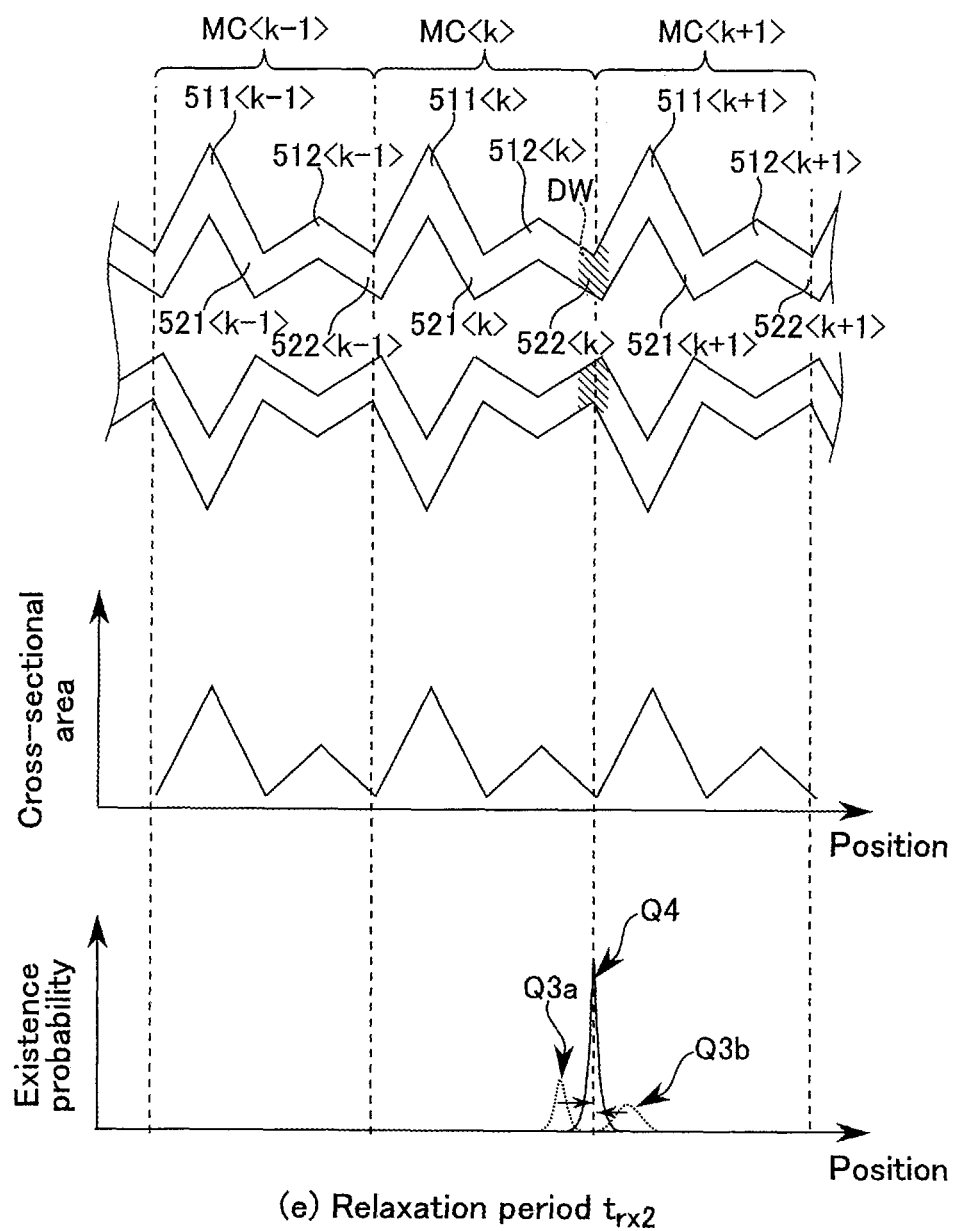

Therefore, as illustrated in FIG. 17, the domain wall, which may exist between the concave portion 522<k> and the projection portion 512<k>, stabilizes in the concave portion 522<k>.

The domain wall, which may exist between the concave portion 522<k> and the projection portion 511<k+1>, moves to the concave portion 522<k>. During the relaxation period $t_{rx2}$ after the supply of the pulse P2, the domain wall, which may exist between the concave portion 522<k> and the projection portion 511<k+1>, shifts to the concave portion 522<k> side.

In this manner, the domain wall, which is shifted by the shift current SP (pulse P2) from the concave portion 522<k> of a certain memory cell MC<k> to the projection portion 511<k+1> side of a neighboring memory cell MC<k+1>, moves back into the concave portion 522<k>.

For the stabilization of energy, the domain wall in the projection portion 512<k> shifts to the concave portion 522<k> side having a smaller volume (a smaller cross-section area).

As a result, during the relaxation period $t_{rx2}$, an existence probability distribution Q4 of the domain wall DW exhibits a high existence probability in the concave portion (the domain wall retention portion) 522<k> between the memory cell MC<k> and the memory cell MC<k+1>.

In this manner, the domain wall memory 1 of the present embodiment executes the shift operation by supplying the shift current SP including pulses P1 and P2 with different current values to the magnetic member including projection portions with different dimensions.

In a certain domain wall memory, a shift pulse including one pulse is supplied to a memory cell in which one projection portion is provided, and the domain wall is moved to a target position by one-time shift.

Compared to a domain wall shift method of a certain domain wall memory, the domain wall memory 1 of the present embodiment can increase the existence probability of the domain wall in the concave portion 522 functioning as the domain wall retention portion of the memory cell MC.

As described above, the standard deviation σ of the existence probability distribution of the domain wall and the motion distance L vary such that the relation of $\sigma^2/L$ is kept substantially constant. Compared to the method of moving the domain wall by one-time shift as in a certain domain wall memory, in the domain wall memory of the present embodiment, the position of the domain wall is stabilized in a first concave portion by first-time domain wall shift (the variance of the domain wall position is decreased), and then the domain wall is shifted to the target position by second-time domain wall shift. Thereby, the motion distance of the domain wall by each one-time domain wall shift becomes shorter. Thus, in the present embodiment, the variance of the existence probability distribution of the domain wall decreases. Therefore, in the domain wall memory of the present embodiment, the variance of the position of the domain wall in the magnetic member (and in the memory cell) can be decreased.

As a result, the domain wall memory of the present embodiment can suppress the occurrence of a shift error of the domain wall.

(c-4) Operation Sequence

Figure 18:
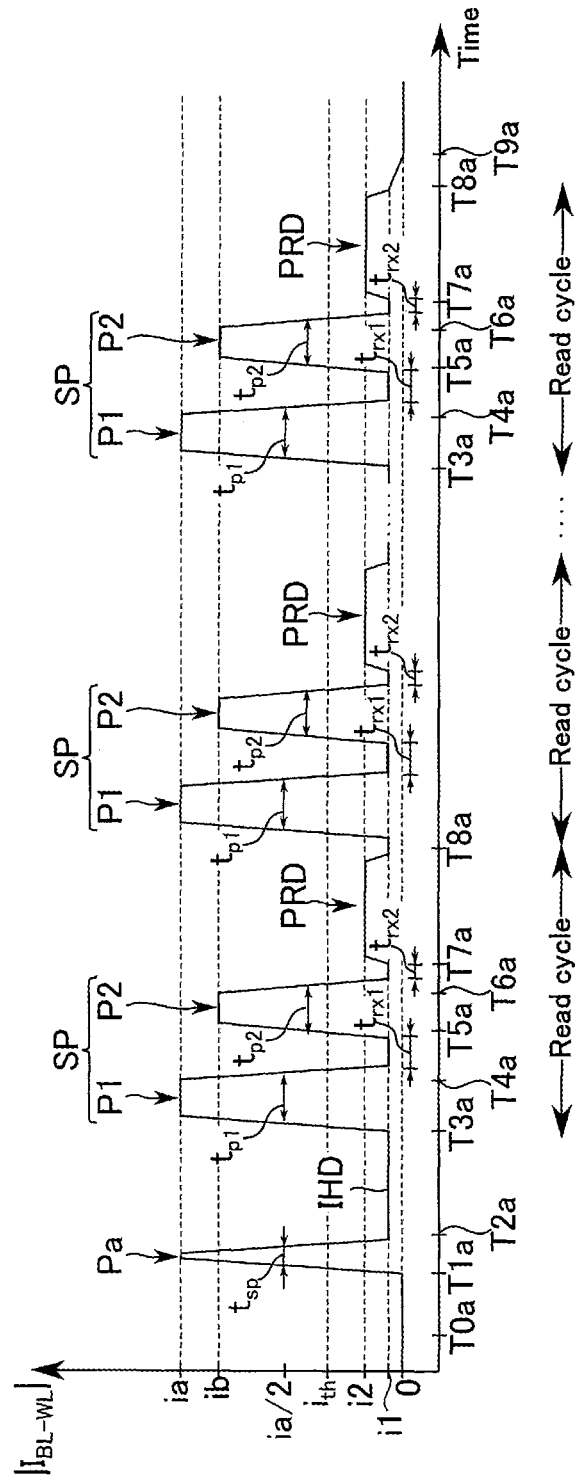
Figure 19:
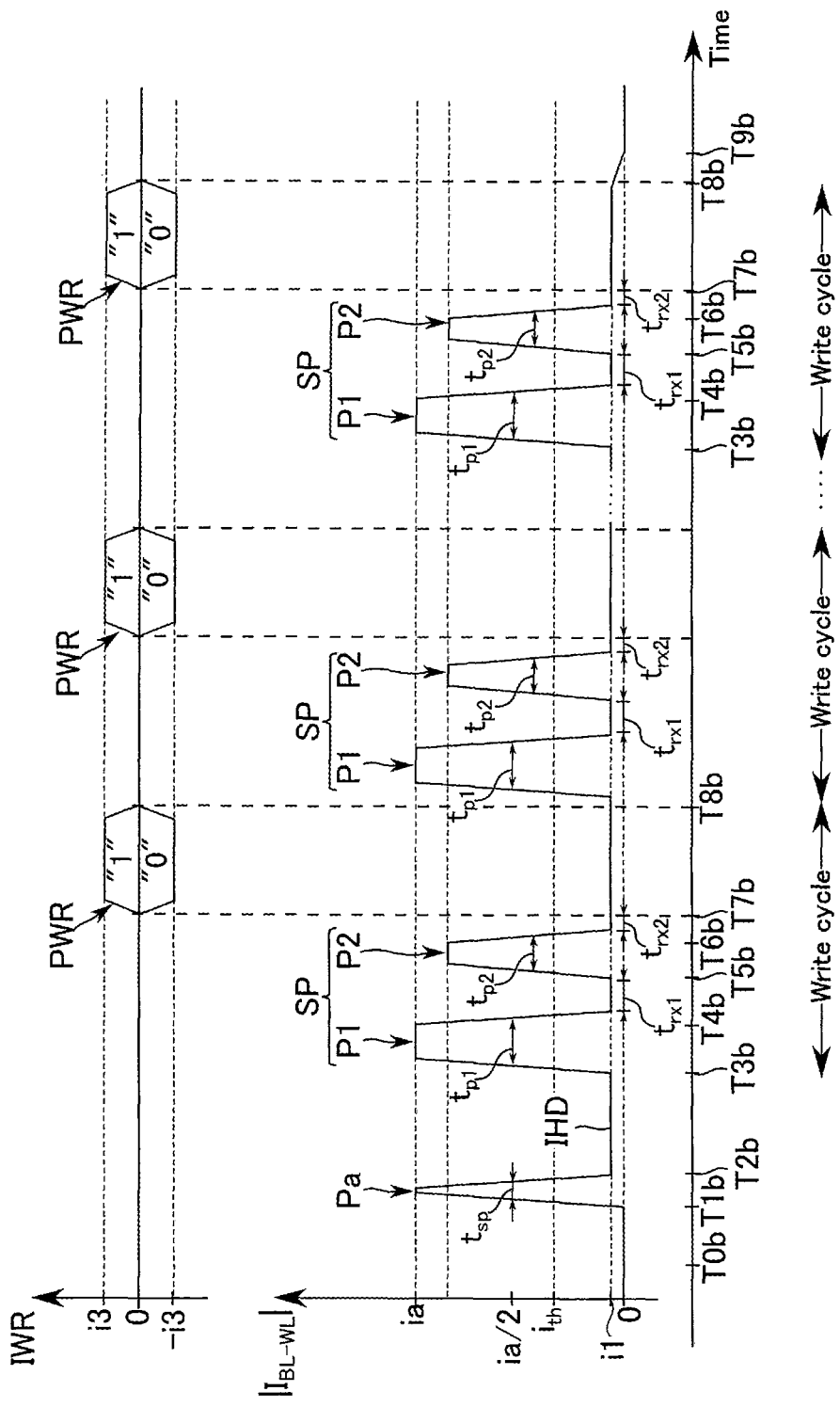

Referring to FIG. 18 and FIG. 19, an operation sequence including a shift operation of the domain wall memory of the present embodiment will be described. The shift operation using the shift pulse of the domain wall memory of the present embodiment is applicable to an operation sequence including a read operation, and to an operation sequence including a write operation.

[Read Sequence]

FIG. 18 is a timing chart illustrating an example of an operation sequence including a shift operation and a read operation in the domain wall memory of the present embodiment.

The abscissa axis of FIG. 18 corresponds to time (time instant), and the ordinate axis of FIG. 18 corresponds to the current value of current ($I_{BL-WL}$) flowing between the bit line and word line. In FIG. 18, the current value is indicated by an absolute value. It should be noted that the polarity of the current $I_{BL-WL}$ in a case where the current $I_{BL-WL}$ flows from the bit line to the word line is different from the polarity of the current $I_{BL-WL}$ in a case where the current $I_{BL-WL}$ flows from the word line to the bit line.

<Time Instant T0a>

The external device (e.g. a host device or a controller) 2 sends a command and an address (hereinafter referred to as "selection address") of a target of an operation to the domain wall memory 1 of the present embodiment. At a time when a read operation is instructed, the external device sends a read command to the domain wall memory 1.

The domain wall memory 1 receives the read command and the selection address.

At time instant T0a, based on the read command, the domain wall memory 1 starts a read operation of data in a memory cell unit (hereinafter referred to as "selected memory cell unit") corresponding to the selection address. For example, by the read command, the data in memory cells MC in the selected memory cell unit are successively read.

<Time Instants T1a and T2a>

As illustrated in FIG. 18, at time instant Tia, switching current (also referred to as "switching pulse" or "spike current") Pa is supplied to the selected memory cell unit as a current $|I_{BL-WL}|$ flowing between a selected bit line and a selected word line in accordance with the selection address. In the memory cell unit to which the switching current Pa is supplied, the switching element 20 is turned on. The selected memory cell unit is electrically connected to the bit line BL via the switching element 20 which is in the ON state.

Thereby, the selected memory cell unit MU is set in an active state (selected state).

For example, the switching current Pa has a current value ia. However, the current value of the switching current Pa may be a value different from the current value ia. When the current value of the switching current Pa is set to be equal to the current value of the shift pulse SP, the circuit configuration of the domain wall memory can be simplified.

A pulse width $t_{sp}$ of the switching pulse Pa is less than the pulse width $t_{p1}$, $t_{p2}$ of the pulse P1, P2 of the shift current SP. Therefore, even if the switching current Pa flows into the magnetic member 50, there occurs no substantial motion of the domain wall due to the switching current Pa.

After the supply of the switching current Pa (e.g. at time instant T2a), a hold current IHD is supplied to the selected memory cell unit as the current $|I_{BL-WL}|$. The hold current IHD has a current value i1 which can keep the ON state of the switching element 20. The current value i1 is lower than the current value ia of the switching current Pa and the domain wall shift threshold ith.

Thereby, the selected memory cell unit is set in a conductive state to the selected bit line BL via the switching element 20 which is in the ON state.

<Time Instants T3a and T4a>

After the selected memory cell unit is set in the active state, the supply of the shift current SP (the shift operation) in a first cycle is started. The shift circuit 160 supplies the shift current SP to the selected memory cell unit.

For example, by the shift operation of the read sequence, the magnetic domain (magnetization) is shifted by one bit from a memory cell on the lower end side (word line side) of the selected memory cell unit MU to a memory cell MC on the upper end side (bit line side) of the selected memory cell unit.

At time instant T3a, the first pulse (main pulse) P1 of the shift current SP is supplied to the magnetic member 50 by the shift circuit 160. The pulse P1 has a current value ia. The first pulse P1 has a pulse width $t_{p1}$. Note that the pulse width $t_{p1}$ is a full width at half maximum of the pulse P1.

The current pulse P1 with the current value ia flows in the magnetic member 50 during a period corresponding to the pulse width $t_{p1}$. Thereby, all domain walls in the magnetic member 50 move. For example, the domain wall DW shifts from the concave portion 522<k−1> of a certain memory cell MC<k−1> in the magnetic member 50 into an immediately adjacent memory cell MC<k> (see, e.g. FIG. 13 and FIG. 14).

For example, the pulse P1 is supplied to the magnetic member 50 of the memory cell unit MU such that the pulse P1 flows from the bit line BL side toward the word line WL side. The domain wall moves in a direction of the motion of electrons due to the supply of the pulse P1.

In the present embodiment, the domain wall moves from the word line WL side toward the bit line BL side in the direction of motion of electrons. In this case, one or more domain walls in the magnetic member 50 shift substantially simultaneously from the word line WL side toward the bit line BL side.

By the supply of the pulse P1, the domain wall DW is disposed in the concave portion 521<k> and concave portion 522<k> in the memory cell MC<k> at the destination of motion. In the concave portion 521<k> and concave portion 522<k>, the domain wall DW may exist in the magnetic member 50 with the distribution Q1 of the existence probability illustrated in FIG. 14.

After the passage of the period corresponding to the pulse width $t_{p1}$ from the start of supply of the pulse P1 (for example, at time instant T4a), the shift circuit 160 lowers the current value of the supplied current $|I_{BL-WL}|$ from the current value is to the current value i1.

Thereby, the supply of the pulse P1 is stopped. By the supply of the current IHD with the current value i1, the switching element 20 keeps the ON state.

During the relaxation period $t_{rx1}$ after the stop of supply of the pulse P1, the domain wall of a certain memory cell MC<k> may exist in the magnetic member 50 with the existence probability Q2a, Q2b illustrated in FIG. 15, by the relaxation of the domain wall by the constriction structure (projection portion 511, 512 and concave portion 521, 522) of the magnetic member 50.

Note that, in the present embodiment, the hold current IHD flows in the magnetic member 50 during the relaxation period $t_{rx1}$, $t_{rx2}$.

By the supply of the hold current IHD, a stray magnetic field due to the hold current IHD, or a weak domain wall driving force due to the hold current IHD, occurs in the magnetic member 50. The stray magnetic field due to the hold current IHD is added to an effective magnetic field due to the constriction region (concave portion). Thereby, the relaxation period $t_{rx1}$, $t_{rx2}$ is shortened. As a result, the speed of the memory operation in the domain wall memory can be increased.

<Time Instants T5a and T6a>

At time instant T5a after the passage of the relaxation period $t_{rx1}$ from the stop of supply of the pulse P1, the second pulse P2 of the shift current SP is supplied from the selected bit line BL to the magnetic member 50 by the shift circuit 160. The pulse P2 has a current value ib which is less than the current value ia. The pulse P2 has a pulse width $t_{p2}$. Note that the pulse width $t_{p2}$ is a full width at half maximum of the pulse P2.

By the supply of the pulse P2, the domain wall DW shifts into a region near the concave portion 522<k> of a certain memory cell MC<k> (see, e.g. FIG. 16).

Thereby, the domain wall DW may exist in a region between the apex portion of the projection portion 512 of a certain memory cell MC<k> and the apex portion of the projection portion 511<k+1> of the memory cell MC<k+1> in a manner to have the existence probability distribution Q3a, Q3b illustrated in FIG. 16.

After the passage of the period corresponding to the pulse width $t_{p2}$ from the start of supply of the pulse P2 (for example, at time instant T6a), the shift circuit 160 lowers the current value of the supplied current $|I_{BL-WL}|$ from the current value ib to the current value i1.

Thereby, the supply of the pulse P2 is stopped. By the hold current IHD, the switching element 20 keeps the ON state.

The magnetic domain (magnetization), which is shifted into the read cell MCA (cell region 510A) in the shift operation, affects the magnetization of the storage layer 11 of the MTJ element 10 via the magnetic layer 59. The direction of magnetization of the storage layer 11 is set to agree with the direction of magnetization in the read cell MCA.

In this manner, the shift operation of the first cycle in the read sequence is completed.

For example, a certain period (relaxation period) t rx2 passes from the stop of supply of the pulse P2. In the relaxation period $t_{rx2}$, the existence probability of the position of the domain wall DW stabilizes in the concave portion 522 of the memory cell which retains the domain wall DW, as indicated by the distribution Q4 in FIG. 17.

In this manner, in the present embodiment, the variance of the position of the domain wall after the supply of the shift current is suppressed.

<Time Instants T7a and T8a>

In the first read cycle, after the shift operation, the read circuit 150 executes a read operation.

At time instant T7a after the passage of the relaxation period $t_{rx2}$, the read circuit 150 supplies a read current (read pulse) PRD to the selected memory cell unit MU.

A current value i2 of the read current PRD is less than a magnetization reversal threshold of the storage layer 11 and the domain wall shift threshold ith of the magnetic member 50. The current value i2 is greater than the current value i1. For example, the read current PRD flows in a direction from the word line WL toward the bit line BL.

The current value of the current flowing in the bit line BL and the potential of the bit line BL vary in accordance with the magnetization alignment state of the reference layer 12 and storage layer 11 in the MTJ element 10.

The read circuit 150 senses the current value of the current flowing in the bit line BL, or the potential of the bit line BL.

Based on the sensed result, the read circuit 150 determines the data in the read cell MCA.

Thereby, in the first read cycle, data is read.

At time instant T8a, the read circuit 150 lowers the current value of the supplied current $|I_{BL-WL}|$ from the current value i2 to the current value i1.

Thus, the first read cycle is completed.

Following the first read cycle, a second read cycle is executed.

Like the first read cycle, a shift operation in the second read cycle is executed. By the motion of the domain wall by the shift operation, the data is shifted into the read cell MCA.

When the domain wall DW is moved by the shift operation using the shift current SP in the present embodiment, the variance of the position of the domain wall DW in the concave portion 522 is small. Therefore, in the shift operation of the second read cycle, the variance of the position of the shifted domain wall DW becomes small. As a result, in the domain wall memory of the present embodiment, the shift error in the read sequence is reduced.

After the shift operation, a read operation in the second read cycle is executed on the read cell MCA which stores the shifted data.

In this manner, in the read sequence, the shift operation and the read operation are repeatedly executed.

<Time Instant T9a>

After a predetermined number of read cycles are executed, the read circuit 150 stops, at time instant T9a, the supply of the current $|I_{BL-WL}|$ to the selected memory cell unit. The current value of the current $|I_{BL-WL}|$ is set to zero. Thereby, the switching element 20 is set in the OFF state.

As a result, the selected memory cell unit is set in an inactive state (non-selected state, OFF state).

The read data is sent from the read circuit 150 to the I/O circuit 170 at a predetermined timing. Thereby, the data is transferred from the domain wall memory 1 to the external device 2.

As described above, in the domain wall memory of the present embodiment, the read sequence is completed.

[Write Sequence]

FIG. 19 is a timing chart illustrating an example of an operation sequence (write sequence) including a shift operation and a write operation in the domain wall memory of the present embodiment.

The abscissa axis of FIG. 19 corresponds to time (time instant), and the ordinate axis of FIG. 19 corresponds to the current value (absolute value) of current ($|I_{BL-WL}|$) flowing between the bit line and word line. In FIG. 19, a current (write current PWR) flowing in the write line is illustrated. The write current PWR has a positive polarity (positive current value) or a negative polarity (negative current value) in accordance with the direction of flow in the write line FL.

<Time Instants T0b, T1b, and T2b>

The external device 2 sends a write command, an address of a target of data write, and data (write data) to be written in the memory cell array 100, to the domain wall memory 1 of the present embodiment.

The domain wall memory 1 receives the write command, the selection address and the write data, for example, at time instant T0b.

Based on the write command, the domain wall memory 1 starts a data write sequence in a memory cell unit (selected memory cell unit) corresponding to the selection address. The write data is transferred from the I/O circuit 170 to the write circuit 140.

For example, by the write command, data is successively written in memory cells in the selected memory cell unit.

As illustrated in FIG. 19, substantially similarly as in the read sequence, at time instant T1b, a switching current Pa is supplied to the selected bit line BL. Thereby, the selected memory cell unit MU is electrically connected to the bit line BL via the switching element 20 which is in the ON state.

After the supply of the switching current Pa (e.g. at time instant T2b), the current value of the current supplied to the selected memory cell unit MU is set to the current value i1 of the hold current IHD of the switching element 20.

<Time Instants T3b and T4b>

After the selected memory cell unit MU is set in the active state, a shift operation of a first cycle in the write sequence is started. The shift circuit 160 supplies the shift current SP to the selected memory cell unit MU.

The shift current SP of the shift operation in the write sequence is substantially the same as the shift current SP of the shift operation in the read sequence. However, in the write operation of the domain wall memory of the LIFO method, the shift current SP is supplied to the selected memory cell unit MU, for example, such that the shift current SP flows from the word line WL to the bit line BL. In this case, electrons due to the shift current SP move from the bit line BL toward the word line WL. In the present embodiment, the domain wall moves from the bit line BL side toward the word line WL side in the direction of motion of electrons.

At time instant T3b, the pulse P1 of the shift current SP is supplied to the selected memory cell unit. The pulse P1 has a current value ia. The pulse P1 has a pulse width $t_{p1}$.

The pulse P1 is supplied to the magnetic member 50 during a period corresponding to the pulse width $t_{p1}$. Thereby, all domain walls in the magnetic member 50 move.

For example, by the shift operation of the write sequence, the magnetic domain (magnetization) is shifted by one bit from a memory cell (e.g. a write cell MCA) on the upper end side (bit line side) of the selected memory cell unit MU to a memory cell MC on the lower end side (word line side) of the selected memory cell unit MU.

By the supply of the pulse P1, the domain wall moves into the projection portion 512 (a region between the concave portion 521 and the concave portion 522). The existence probability of the position of the domain wall in this region is as indicated by the state Q1 illustrated in FIG. 14.

For example, at time instant T4b, the shift circuit 160 stops the supply of the pulse P1. The shift circuit 160 lowers the current value of the current $|I_{BL-WL}|$ from the current value ia to the current value i1.

During the relaxation period $t_{rx}$ci, the domain wall may exist in the concave portion 521 or concave portion 522, for example, with distribution Q2a, Q2b illustrated in FIG. 15.

<Time Instants T5b and T6b>

At time instant T5b after the passage of the relaxation period $t_{rx1}$ from the stop of supply of the pulse $t_{rx1}$ P1, the pulse P2 of the shift current SP is supplied to the selected memory cell unit MU. The pulse P2 has a current value ib which is less than the current value ia. The pulse P2 has a pulse width $t_{p2}$.

By the supply of the pulse P2, the domain wall DW may exist in a region between the apex portion of the projection portion 512 of a certain memory cell MC<k> and the apex portion of the projection portion 511<k+1> of the memory cell MC<k+1> in a manner to have the existence probability distribution Q3a, Q3b illustrated in FIG. 16.

At time instant T6b, the shift circuit 160 stops the supply of the pulse P2. The shift circuit 160 lowers the current value of the current $|I_{BL-WL}|$ from the current value ib to the current value i1.

As indicated by the distribution Q4 in FIG. 17, during a certain period (relaxation period) $t_{rx2}$ from the stop of supply of the pulse P2, the position of the domain wall DW stabilizes in the concave portion 522 of a certain memory cell MC<k> (or near the concave portion 522).

Thereby, in the present embodiment, the variance of the position of the domain wall after the supply of the shift current SP is suppressed.

In this manner, the shift operation in the first write cycle of the write sequence is completed.

<Time Instants T7b and T8b>

In the write sequence, after the shift operation, a write operation is executed on the selected memory cell unit MU.

For example, at time instant T7b, the write circuit 140 supplies a write current PWR to the write line FL. The write current PWR flows in the write line FL. Thereby, a magnetic field is generated around the write line FL. The direction of the magnetic field varies depending on the direction of flow of the write current PWR.

The direction of flow of the write current PWR is set in accordance with write data ("1" data or "0" data). For example, when the write current PWR with a first polarity (e.g. write current with a positive current value) is supplied to the write line FL, "1" data is written in the write cell MCA. For example, when the write current PWR with a second polarity that is different from the first polarity (e.g. write current with a negative current value) is supplied to the write line FL, "0" data is written in the write cell MCA.

The magnetic field from the write line FL is applied to the magnetic layer 59. The direction of magnetization of the magnetic layer 59 is set to a direction corresponding to the direction of the magnetic field.

The magnetization of the magnetic layer 59 affects the magnetization (magnetic domain) of the write cell MCA (cell region 510A). The direction of magnetization of the write cell MCA is set to agree with the direction of magnetization in the magnetic layer 59. Thereby, the write data is written in the write cell MCA in the selected memory cell unit MU.

Thus, the write operation in the first write cycle of the write sequence is completed.

Following the first write cycle, a second write cycle is executed. Like the first write cycle, a shift operation in the second write cycle is executed. By the shift operation, the data in the write cell MCA is shifted to an immediately neighboring memory cell.

When the domain wall DW is moved, in the first write cycle, by the shift operation using the shift current in the present embodiment, the variance of the position of the domain wall DW in the concave portion 522 of the memory cell that retains the domain wall is small. Therefore, in the shift operation in the second write cycle, the variance of the position of the shifted domain wall DW becomes small.

As a result, in the domain wall memory of the present embodiment, the shift error in the write sequence is reduced.

In this manner, in the write sequence, the shift operation and the write operation are repeatedly executed.

<Time Instant T9b>

After a predetermined number of write cycles are executed, at time instant T9b, the current value of the current $|I_{BL\text{-}WL}|$ is set to zero. Thereby, the switching element 20 is set in the OFF state.

As a result, the selected memory cell unit is set in an inactive state (non-selected state, OFF state).

In this manner, the write data from the external device 2 is written in the selected memory cell unit in the memory cell array 100.

As described above, in the magnetic memory of the present embodiment, the write sequence is completed.

(e) Conclusion

In the shift operation of the domain wall memory, the domain wall in the magnetic member moves in the magnetic member by the shift pulse.

When the domain wall moves in the magnetic member having the constriction structure, since the domain wall has a certain width, the volume change rate of the domain wall becomes small in a portion with a maximum value of the volume in the magnetic member of the constriction structure and/or in a portion with a minimum value of the volume (and in regions near these portions).

Thus, at the time of the shift operation of the domain wall shift memory, there is a possibility that the domain wall does not exist in a target position.

As the motion distance of the domain wall by a certain pulse becomes longer, the error between the target position of the domain wall and the position of the actually shifted domain wall tends to increase.

As a result, there is a possibility that the shift error of the domain wall (magnetic domain) increases in the domain wall memory.

In the domain wall memory of the present embodiment, the magnetic member of the constriction structure includes the first projection portion and second projection portion which neighbor each other in the direction of motion of the domain wall. The first projection portion has a first dimension in the first direction crossing the direction of motion of the domain wall. The second projection portion has a second dimension in the first direction. The first dimension is greater than the second dimension. The volume of the first projection portion is greater than the volume of the second projection portion. In the magnetic member of the constriction structure, the first concave portion is provided between the first projection portion and the second projection portion. The second projection portion is provided between the first concave portion and the domain wall retention portion (second concave portion) of the memory cell.

In the present embodiment, at the time of the shift operation of the domain wall memory, the shift pulse including the first pulse and the second pulse is supplied to the magnetic member. The current value of the second pulse is less than the current value of the first pulse. At the time of the shift operation of the domain wall memory of the present embodiment, the second pulse is supplied to the magnetic member after the first pulse is supplied to the magnetic member.

By the supply of the first pulse, the domain wall is shifted into the region (concave portion) between the first projection portion and second projection portion, or into the domain wall retention portion of the memory cell.

By the supply of the second pulse, the domain wall in the first concave portion shifts from the concave portion to the domain wall retention portion via the second projection portion. In addition, even if the second pulse is supplied, the domain wall in the domain wall retention portion can exist in a region near the domain wall retention portion.

In the domain wall memory of the present embodiment, by the two-time pulse supplies, the domain wall is moved in two steps, and the domain wall is shifted to the target position. Therefore, in the domain wall memory of the present embodiment, the motion distance of the domain wall by one-time pulse supply becomes short. Thereby, in the domain wall memory of the present embodiment, the motion of the domain wall over a long distance can be suppressed.

In the present embodiment, during the relaxation period after the supply of the second pulse, the position of the domain wall stabilizes in the domain wall retention portion (or in the region near the domain wall retention portion) by the internal magnetic field of the magnetic member due to the constriction structure which the magnetic member has.

Thereby, the domain wall memory of the present embodiment can suppress the variance of the position of the domain wall at the time of the shift operation.

Therefore, the domain wall memory of the present embodiment can suppress the shift error of the domain wall.

Accordingly, the domain wall memory of this embodiment can enhance the reliability of the operation.

(2) Second Embodiment

Referring to FIG. 20, a magnetic memory of a second embodiment and a control method thereof will be described.

FIG. 20 is a waveform diagram illustrating a shift pulse used in the shift operation of the magnetic memory (e.g. domain wall memory) of the present embodiment. The abscissa axis of FIG. 20 corresponds to time, and the ordinate axis of FIG. 20 corresponds to a current value.

As illustrated in FIG. 20, a shift current SPa may have a pulse waveform with two consecutive pulses P1 and P2. In the present embodiment, the shift current SPa has a stepwise pulse shape.

The shift current SPa has a current value ia in a period TA, and has a current value ib in a period TB which is continuous with the period TA.

The pulse P1 has the current value ia in the period TA from time instant ta to time instant tb.

The pulse P2 has the current value ib in the period TB from time instant tb to time instant tc.

The magnetic memory of the present embodiment can obtain the same advantageous effects as in the first embodiment, by the shift operation using the shift current SPa of FIG. 20.

When the shift current SPa illustrated in FIG. 20 is used in the shift operation of the domain wall memory, the relaxation period between two pulses P1 and P2 during the shift operation period can be eliminated.

As a result, the domain wall memory of the present embodiment can shorten the shift operation period.

Note that, in the present embodiment, the pulse waveform of the shift current SP may be a triangular wave. In this case, the current value of the shift current SP gradually decreases from the start of supply of the current to the stop of supply of the current. For example, the shift current SP of the triangular wave has the current value is or more in a certain period from the start of supply of the shift current, and has a value which is less than the current value is and is not less than the current value ib in a period which is continuous with this period. In addition, the pulse shape of each pulse included in the shift current may be a triangular wave.

(3) Third Embodiment

Referring to FIG. 21 to FIG. 24, a magnetic memory of a third embodiment and a manufacturing method of the magnetic memory will be described.

Figure 21:
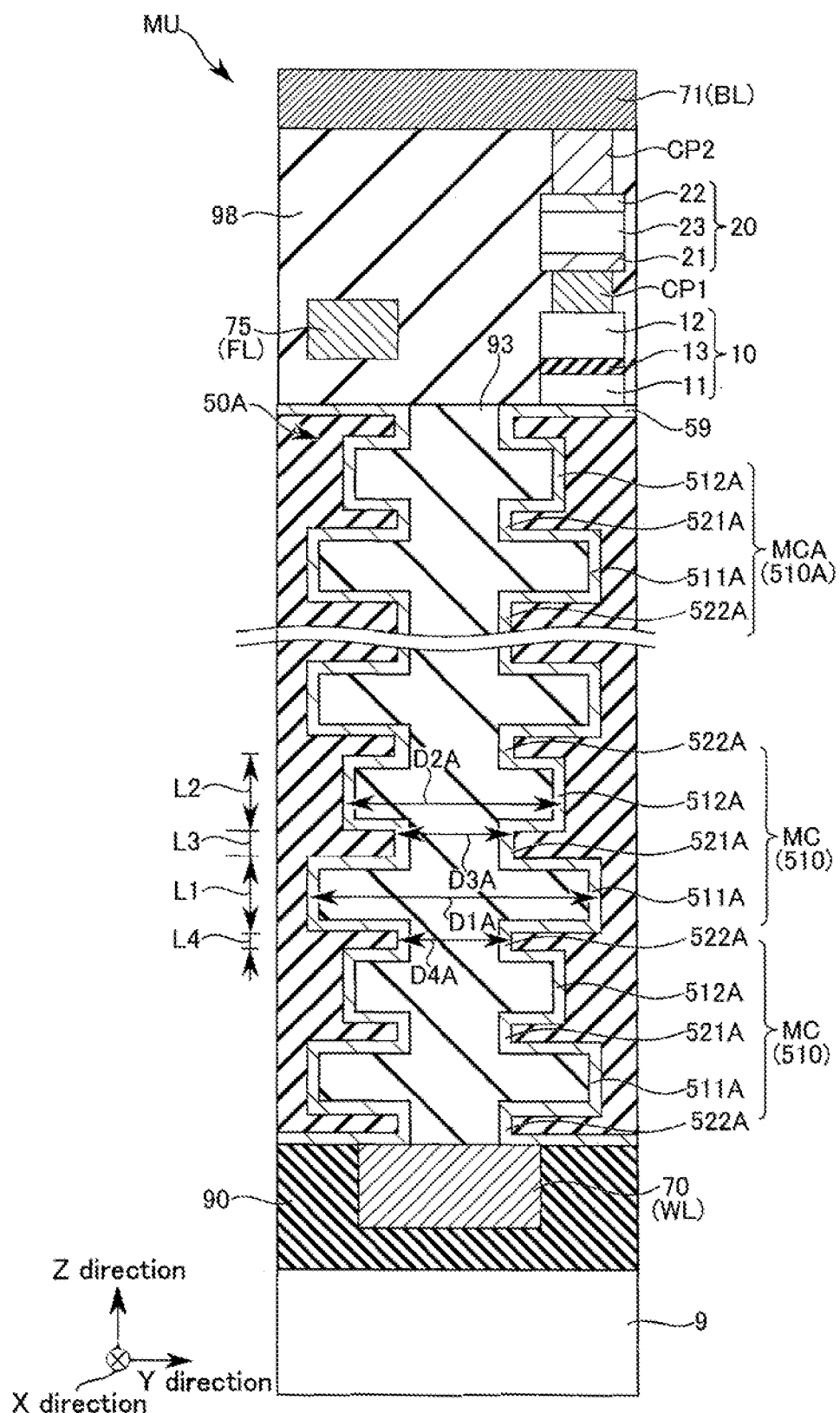
FIG. 21 is cross-sectional view illustrating a configuration example of a magnetic memory of a third embodiment.

FIG. 21 is a cross-sectional view illustrating a structure example of the magnetic memory of the present embodiment.

As illustrated in FIG. 21, in a magnetic member 50A of the memory cell unit, projection portions 511A and 512A and concave portions 521A and 522A may have rectangular cross-sectional shapes.

Like the above-described embodiments, the magnetic member 50A has a constriction structure. The dimension (diameter) of the magnetic member 50A in the parallel direction to the upper surface of the substrate 9 cyclically varies in the Z direction.

The magnetic member 50A is composed of a cylindrical magnetic layer.

The magnetic member 50A includes a plurality of projection portions 511A and 512A and a plurality of concave portions 521A and 522A.

Each memory cell MC includes two projection portions 511A and 512A in the cell region 510 thereof. The concave portion 521A is provided between the two projection portions 511A and 512A in the cell region 510. The concave portion 522A is provided at one end and the other end of the memory cell MC (cell region 510).

In the present embodiment, each of the projection portions 511A and 512A and concave portions 521A and 522A has a rectangular cross-sectional shape. For example, each of the projection portions 511A and 512A and concave portions 521A and 522A has a circular (or elliptic) planar shape as viewed in the Z direction.

A dimension (maximum dimension) D1A of the projection portion 511A in the parallel direction to the upper surface of the substrate 9 is greater than a dimension (maximum dimension) D2A of the projection portion 512A in the parallel direction to the upper surface of the substrate 9. The volume (volume of the magnetic portion) of the projection portion 511A is greater than the volume (volume of the magnetic portion) of the projection portion 512A. The cross-sectional area of a portion with the dimension D1A in the projection portion 511A is greater than the cross-sectional area of a portion with the dimension D2A in the projection portion 512A.

A dimension D3A, D4A of the concave portion 521A, 522A in the parallel direction to the upper surface of the substrate 9 is less than the dimension D1A and dimension D2A. The dimension D4A of the concave portion 522A in the parallel direction to the upper surface of the substrate 9 is substantially equal to the dimension D3A of the concave portion 521A in the parallel direction to the upper surface of the substrate 9. The volume of the concave portion 521A, 522A is less than the volume of the projection portion 512A.

At the time of the shift operation of the domain wall memory of the present embodiment, the shift current SP of FIG. 11 (or the shift current of FIG. 12, or the shift current SPa of FIG. 20) is supplied to the memory cell unit (magnetic member) with the structure of FIG. 20.

Thereby, the domain wall memory of the present embodiment, which includes the magnetic member 50A of the constriction structure of FIG. 21, can reduce the shift error.

Figure 23:
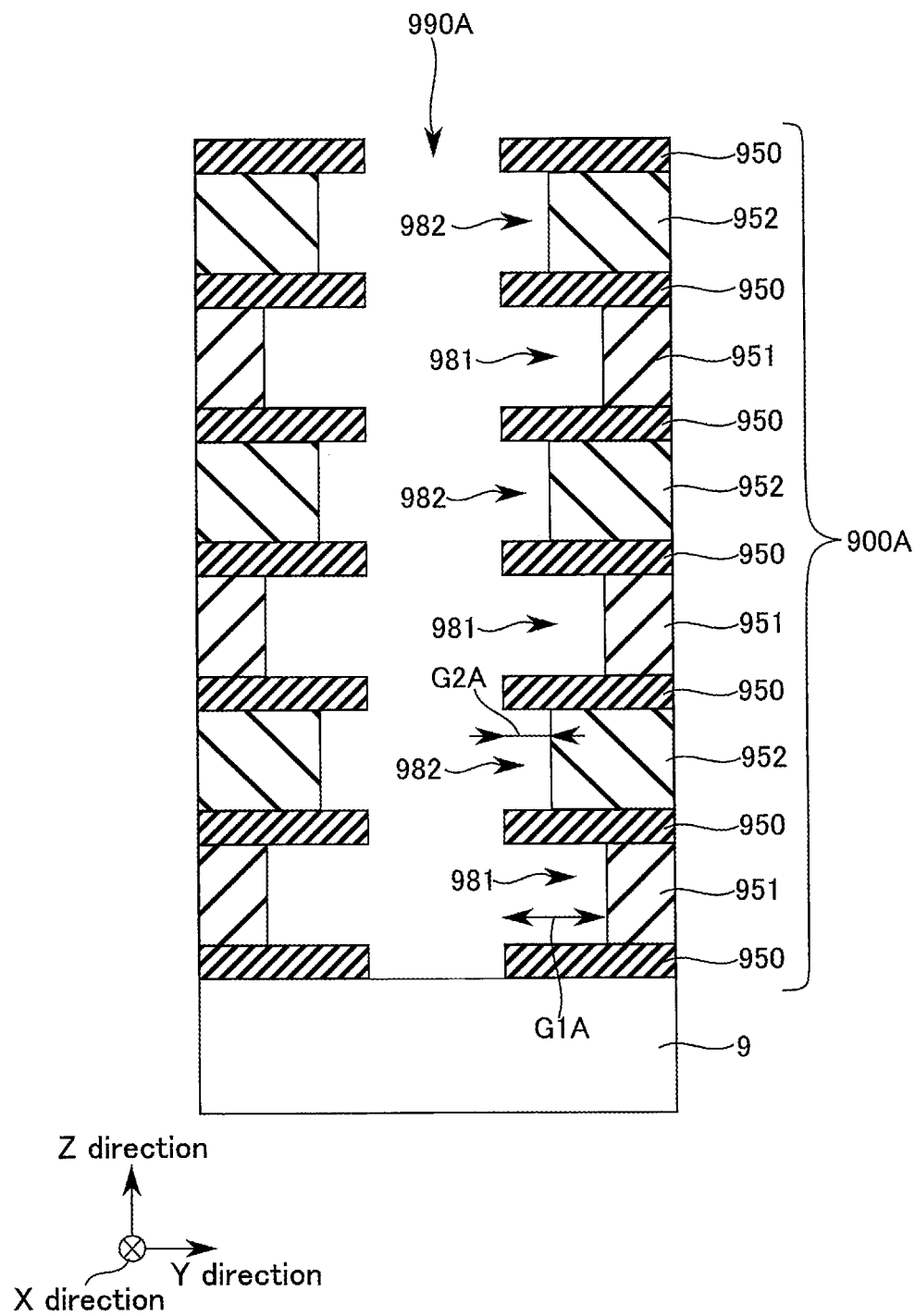

Referring to FIG. 22 to FIG. 24, a manufacturing method of the domain wall memory of the present embodiment will be described.

FIG. 22 to FIG. 24 are cross-sectional process views for describing the manufacturing method of the domain wall memory of the present embodiment.

As illustrated in FIG. 22, a plurality of layers 950, 951 and 952 are formed on the upper surface of the substrate 9, such that the layers are arranged at predetermined cycles in the Z direction. Thereby, a sacked body 900A is formed on the substrate 9.

For example, a layer 950 is formed above the upper surface of the substrate 9. A layer 951 is formed on the layer 950. A layer 950 is formed on the layer 951. A layer 952 is formed above the layer 951 via the layer 950.

In this manner, the layers 951 and layers 952 are alternately stacked above the substrate 9 in the Z direction via the layers 950.

The materials of the layers 950, 951 and 952 are different from each other. The combination of materials of the layers 950, 951 and 952 is selected such that an etching selectivity between the layers 950, 951 and 952 can be secured by etching (wet etching) which will be described later.

The materials of the layers 950 and 951 are selected such that the etching amount of the layer 951 under a certain etching condition is greater than the etching amount of the layer 950. The materials of the layers 950, 951 and 952 are selected such that the etching amount of the layer 952 under a certain etching condition is greater than the etching amount of the layer 950 and is less than the etching amount of the layer 951.

For example, the layer 950 is a silicon nitride layer (SiN layer). The layer 951 is a silicon oxide layer ($SiO_2$ layer). The layer 952 is a silicon oxynitride layer (SiON layer).

After the stacked body 900A is formed, a hole 990A is formed in the stacked body 900A by lithography and etching.

As illustrated in FIG. 23, etching (e.g. wet etching) is performed on the $SiO_2$ layers 951 and SiON layers 952 via the hole 990A.

Surfaces of the layers 951 and 952 retreat in the parallel direction to the upper surface of the substrate 9.

As a result, recesses 981 and 982 are formed in the stacked body 900A. The recesses 981 are formed at positions of the layers 951 in the stacked body 900A. The recesses 982 are formed at positions of the layers 952 in the stacked body 900A.

The etching amounts of the layers 951 and 952 for a supplied etchant (e.g. hydrofluoric acid solution) are different. A depth G1A of the recess 981 in the $SiO_2$ layer 951 is greater than a depth G2A of the recess 982 in the SiON layer 952. The SiN layers 950, for instance, are hardly etched at the time of etching the $SiO_2$ layers 951 and SiON layers 952.

Therefore, the dimensions of retreat (the depth of recesses) of the layers in the parallel direction to the upper surface of the substrate 9 vary depending on positions of the layers 950, 951 and 952.

As illustrated in FIG. 24, a magnetic layer 500A is formed on the layers 950, 951 and 952 in the hole 990A. Thereby, the projection portions 511A and 512A having rectangular cross-sectional shapes are formed at the positions of the layers 951 and 952. The concave portions 521A and 522A having rectangular cross-sectional shapes are formed at the positions of the layers 950.

The magnetic member 50A including the projection portions 511A and 512A is formed in the hole 990A. The dimension in the Y direction (and X direction) in the formed magnetic member 50A cyclically varies in the Z direction. In this manner, the magnetic member 50 having the constriction structure is formed.

Thereafter, like the above-described example, the reproducing element, switching element and various interconnects of the memory cell unit are formed above the magnetic member 50.

Thereby, the domain wall memory of the present embodiment is completed.

As described above, the magnetic memory of the present embodiment can obtain the same advantageous effects as in the above-described other embodiments.

(4) Fourth Embodiment

Figure 25:
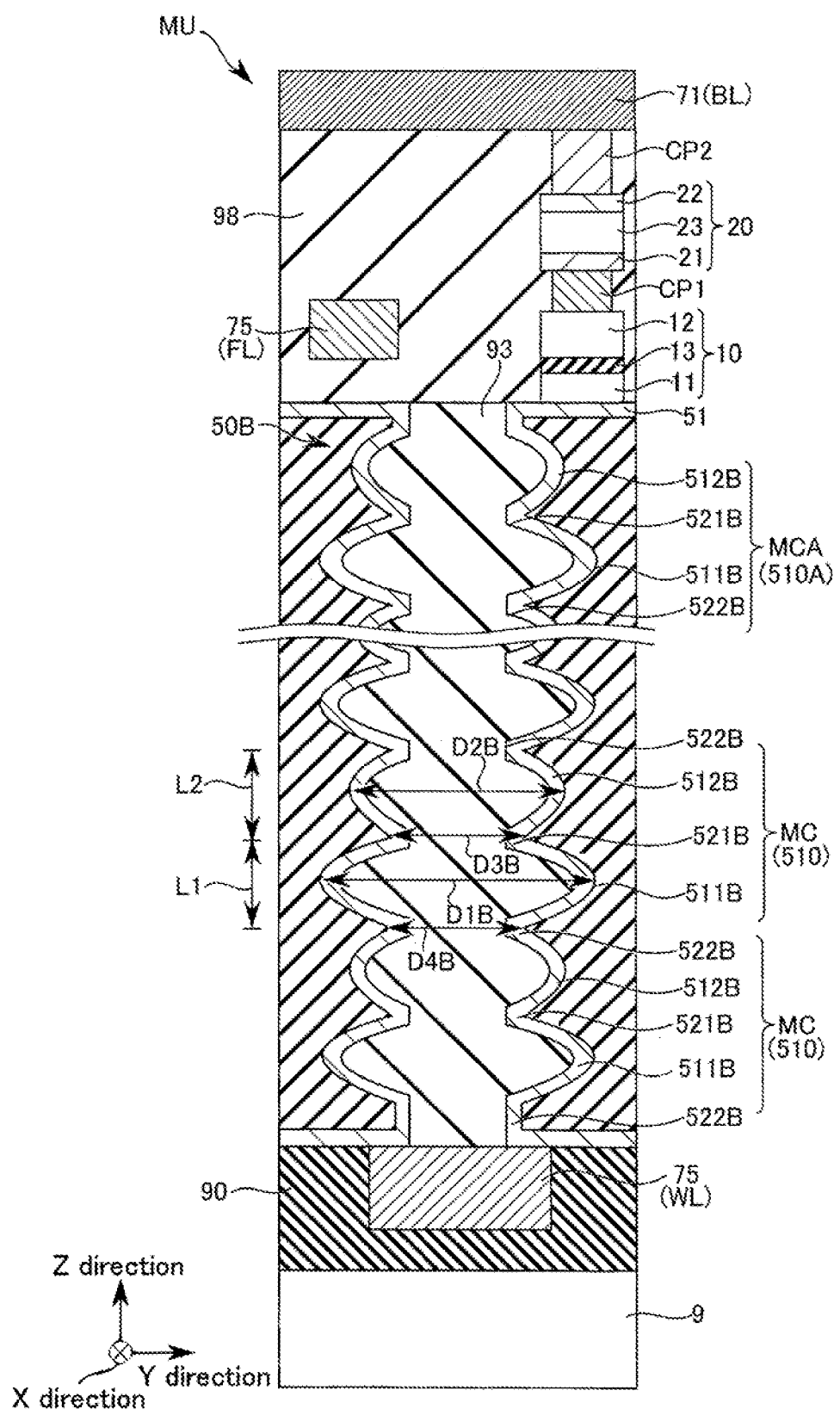
FIG. 25 is a cross-sectional view illustrating a configuration example of a magnetic memory of a fourth embodiment.

Referring to FIG. 25, a magnetic memory of a fourth embodiment will be described.

FIG. 25 is a cross-sectional view illustrating a configuration example of the magnetic memory of the present embodiment.

As illustrated in FIG. 25, in a magnetic member 50B with a constriction structure, projection portions 511B, 512B and concave portions 521B, 522B may have curved surfaces.

Like the above-described embodiments, the magnetic member SOB has the constriction structure. The dimension (diameter) of the magnetic member 50B in the parallel direction to the upper surface of the substrate 9 cyclically varies in the Z direction.

The magnetic member 50B is composed of a cylindrical magnetic layer.

The magnetic member 50B includes projection portions 511B and 512B and concave portions 521B and 522B.

Each memory cell MC includes two projection portions 511B and 512B in a cell region 510 thereof. The concave portion 521B is provided between the two projection portions 511B and 512B in the cell region 510. The concave portion 522B is provided at an end portion of the memory cell MC (cell region 510).

In the present embodiment, each of the projection portions 511B and 512B and concave portions 521B and 522B has an elliptic (or circular) cross-sectional shape as viewed in the X direction (or Y direction). For example, each of the projection portions 511B and 512B and concave portions 521B and 522B has an elliptic (or circular) plan-view shape as viewed in the Z direction.

A dimension (maximum dimension) D1B of the projection portion 511E in the parallel direction to the upper surface of the substrate 9 is greater than a dimension (maximum dimension) D2B of the projection portion 512B in the parallel direction to the upper surface of the substrate 9. The volume (volume of the magnetic portion) of the projection portion 511B is greater than the volume (volume of the magnetic portion) of the projection portion 512B.

A dimension D3B and D4B of the concave portion 521B and 522B in the parallel direction to the upper surface of the substrate 9 is less than the dimension DIB and dimension D2B. The volume of the concave portion 521B and 522B is less than the volume of the projection portion 512B.

At the time of the shift operation of the domain wall memory of the present embodiment, the shift current SP of FIG. 11 (or the shift current of FIG. 12, or the shift current SPa of FIG. 20) is supplied to the memory cell unit (magnetic member) with the structure of FIG. 20.

Thereby, the domain wall memory of the present embodiment can reduce the shift error.

Accordingly, the magnetic memory of the present embodiment can obtain the same advantageous effects as in the above-described other embodiments.

(5) Fifth Embodiment

Figure 26:
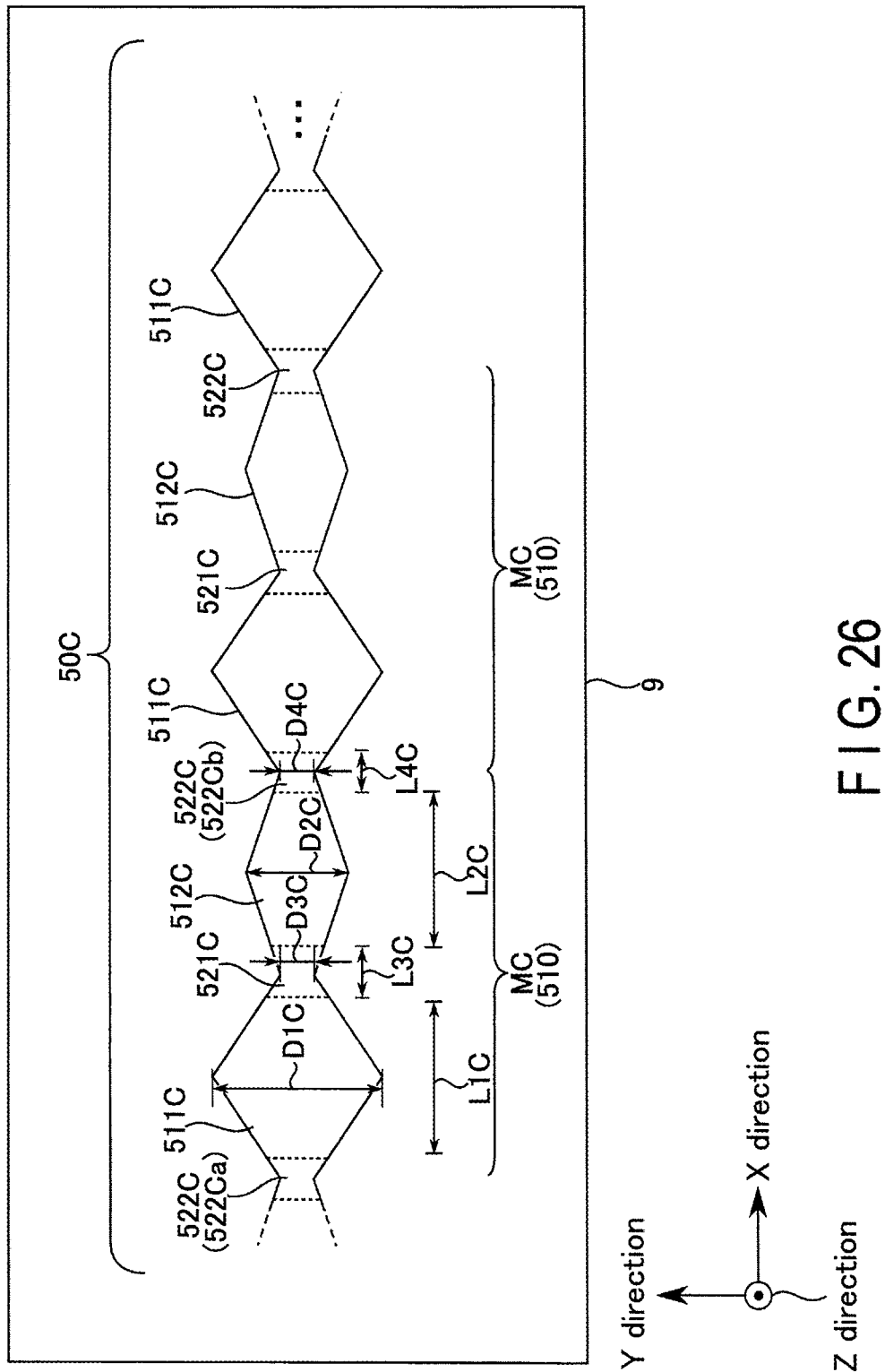
FIG. 26 is a schematic view illustrating a configuration example of a magnetic memory of a fifth embodiment.

Referring to FIG. 26, a magnetic memory of a fifth embodiment and a control method thereof will be described.

FIG. 26 is a schematic view illustrating a configuration example of the magnetic memory (e.g. a domain wall memory) of the present embodiment.

As illustrated in FIG. 26, a magnetic member 50C having a constriction structure may be a plate-shaped layer extending in the parallel direction to the upper surface of the substrate 9.

In the present embodiment, the magnetic member 50C extends, for example, in the X direction. The magnetic member 50C includes projection portions 511C and 512C and concave portions 521C and 522C (522Ca and 522Cb).

In the magnetic member 50C, the projection portions 511C and projection portions 512C are alternately arranged in the X direction.

Each of the projections 511C and 512C includes a portion projecting in the Y direction. For example, each of the projections 511C and 512C has a hexagonal plan-view shape as viewed in the Z direction. Note that the projection 511C and 512C may have an octagonal plan-view shape as viewed in the Z direction.

The projection portion 511C is provided between the concave portion 521C and concave portion 522Ca. The projection portion 512C is provided between the concave portion 521C and concave portion 522Cb. The concave portion 521C is provided between the projection portion 511C and projection portion 512C.

For example, the projection portions 511C and 512C have certain dimensions L1C and L2C, respectively, in the X direction. For example, the concave portions 521C and 522C have dimensions L3C and L4C, respectively, in the X direction.

Each memory cell MC includes the projection portion 511C and 512C and the concave portion 521C and 522C in the cell region 510 thereof. Each concave portion 522C is shared by two memory cells MC neighboring in the X direction.

A domain wall is retained in the concave portion 522 of the memory cell MC (cell region 510).

A dimension (e.g. a maximum dimension) D1C of the projection portion 511C in the Y direction is greater than a dimension (e.g. a maximum dimension) D2C of the projection portion 512C in the Y direction. The volume of the projection portion 511C is greater than the volume of the projection portion 512C.

A dimension D3C of the concave portion 521C in the Y direction is less than the dimension D1C and D2C. A dimension D4C of the concave portion 522C in the Y direction may be substantially equal to, or may be different from, the dimension D3C.

In this manner, in the present embodiment, the dimension of the plate-shaped magnetic member 50C cyclically varies in the extending direction of the magnetic member.

At the time of the shift operation of the domain wall memory of the present embodiment, the shift current SP of FIG. 11 (or the shift current SP of FIG. 12, or the shift current SPa of FIG. 20) is supplied to the memory cell unit (magnetic member) with the structure of FIG. 26.

Thereby, the domain wall memory of the present embodiment can reduce the shift error.

As a result, the magnetic memory of the present embodiment can obtain the same advantageous effects as in the above-described embodiments.

(6) Modifications

Referring to FIG. 27 to FIG. 29, modifications of the magnetic memories of the embodiments will be described.

FIG. 27 is a schematic view illustrating a modification of the magnetic memories of the embodiments.

As illustrated in FIG. 27, in the memory cell array, the write line FL for data write may be provided on the word line side.

For example, in the memory cell array including the magnetic member 50 extending in the Z direction, the write line FL is provided on the lower end side of the magnetic member 50.

A memory cell MCB, which is closest to the word line side of the magnetic member 50, is used as a write cell. In this case, the memory cell MCA, which is closest to the bit line side of the magnetic member, is used only as a read cell, without being used as a write cell.

For example, the write line FL neighbors the write cell on the lower end side of the magnetic member 50 in the Y direction.

A magnetic field due to the write current PWR supplied to the write line FL is applied to the write cell MCB. The direction of magnetization in the write cell MCB is set in accordance with the direction of the magnetic field. Thereby, data is written in the write cell MCB.

At the time of data write and at the time of data read, the data in the memory cell MC, MCA, and MCB is shifted from the word line side toward the bit line side.

For example, the domain wall memory including the memory cell unit of FIG. 27 functions as a domain wall shift memory (e.g. shift register) of a FIFO (First-in First-out) method.

FIG. 28 is a schematic diagram illustrating a modification of the domain wall memories of the embodiments. In the domain wall memory of FIG. 28, data is written in the magnetic member 50 by an STT method.

The MTJ element 10 on the magnetic layer 59 is used as a reproducing element and is used as a recording element (write element).

In this case, a write line for a magnetic field write method is not provided in the memory cell array 100.

At the time of the write operation, a write current (write pulse) PWRx is supplied to the MTJ element 10. In accordance with data to be written in the write cell, the write current PWRx flows in a direction from the bit line BL to the word line WL, or flows in a direction from the word line WL to the bit line EL.

The direction of magnetization in the storage layer 11 and magnetic layer 59 is controlled by spin torque due to the write current PWRx flowing in the MTJ element 10. The magnetization direction of the write cell MCA is set in accordance with the magnetization direction of the magnetic layer 59.

Thereby, the magnetization direction of the write cell MCA is controlled in accordance with the write data.

In this manner, by the STT method, write data is written in the memory cell unit MC.

The current value of the write current PWRx is greater than the current value of the read current PRD. In order to prevent an unintended shift operation by the write current PWRx and an unintended write operation by the shift current SP, the pulse shape (at least one of the current value and the pulse width) of the write current PWRx is set as appropriate.

For example, the domain wall memory of FIG. 28 functions as a domain wall shift memory (shift register) of the LIFO method.

FIG. 29 is a schematic view illustrating a modification of the memory cell array of the domain wall memories of the embodiments.

As illustrated in FIG. 29, an MTJ element 10W for the write by the STT method may be provided on the lower end side (word line side) of the magnetic member 50.

The MTJ element 10W is provided between the magnetic member 50 and the word line WL.

The MTJ element 10W includes a storage layer 11W, a reference layer 12W and a nonmagnetic layer (tunnel barrier layer) 13W. The storage layer 11W is provided between the word line WL and a lower end (bottom portion) of the magnetic member 50. The reference layer 12W is provided between the storage layer 11W and the word line WL. The tunnel barrier layer 13W is provided between the storage layer 11W and the reference layer 12W.

For example, the storage layer 11W is in direct contact with the magnetic member 50. However, a magnetic layer may be provided between the storage layer 11W and the magnetic member 50. When a magnetic layer (not shown) is provided between the storage layer 11W and the magnetic member 50, the magnetic layer is put in direct contact with the storage layer 11W and the magnetic member 50.

A memory cell MCB, which is closest to the word line side of the magnetic member 50, is used as a write cell. In this case, the memory cell MCA, which is closest to the bit line side of the magnetic member, is used only as a read cell.

At the time of the write operation, a write current PWRx flows between the MTJ element 10W and the magnetic member 50. The direction of flow of the write current PWRx is set in accordance with the data to be written in the write cell MCB. The direction of magnetization in the storage layer 11W is controlled by spin torque due to the write current PWRx. The magnetization direction of the write cell MCB is set in accordance with the magnetization direction of the storage layer 11W.

In order to secure the reliability of the operation, the characteristics (e.g. a magnetization switching threshold value of the storage layer) of the MTJ element 10W functioning as the recording element may be different from the characteristics of the MTJ element 10 functioning as the reproducing element.

For example, the domain wall memory of FIG. 29 functions as a domain wall shift memory (shift register) of the FIFO method.

Note that in the domain wall memories of the modifications of FIG. 27, FIG. 28 and FIG. 29, the magnetic member 50 may be a plate-shaped magnetic layer.

In the shift operations of the domain wall memories of these modifications, the above-described shift pulse (shift current) including pulses is used.

Thereby, the domain wall memories of these modifications can obtain substantially the same advantageous effects as in the above-described embodiments.

(7) Others

In the above embodiments, the magnetic memory (e.g. domain wall memory, and domain wall shift memory) is illustrated as the device utilizing the shift operation of the domain wall in the magnetic member. However, the device of each embodiment is not limited to the magnetic memory, if the device can use, in the shift operation of the domain wall in the magnetic member, the shift pulse (shift current) including the pulses described in each embodiment.

The control method of the device of each embodiment is not limited to the shift operation of the domain wall in the magnetic memory. The control method of the device of each embodiment is also applicable to control methods (operations) of devices other than the magnetic memory, if such devices utilize the shift operation of the domain wall in the magnetic member.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory comprising:
a magnetic member including a first portion with a first dimension in a first direction, a second portion spaced from the first portion in a second direction crossing the first direction and having a second dimension in the first direction, a third portion provided between the first portion and the second portion and having a third dimension in the first direction, and a fourth portion provided between the first portion and the third portion and having a fourth dimension in the first direction; and
a circuit configured to supply a shift pulse including a first pulse and a second pulse to the magnetic member, and to move a domain wall in the magnetic member in the second direction,
wherein
the third dimension is less than the first dimension, and the second dimension and the fourth dimension is less than the third dimension, and
the first pulse has a first current value, and the second pulse has a second current value which is less than the first current value.

2. The magnetic memory of claim 1, wherein
the second pulse is supplied to the magnetic member after the first pulse is supplied to the magnetic member.

3. The magnetic memory of claim 1, wherein
the first pulse moves the domain wall from the first portion toward the second portion, and
the second pulse moves the domain wall in the fourth portion into the second portion.

4. The magnetic memory of claim 1, wherein
the shift pulse includes a first period between the first pulse and the second pulse.

5. The magnetic memory of claim 4, wherein
the shift pulse has, during the first period, a third current value which is less than a threshold for moving the domain wall.

6. The magnetic memory of claim 1, wherein
the first pulse has the first current value during a first period from a first time instant to a second time instant, and
the second pulse has the second current value during a second period from the second time instant to a third time instant.

7. The magnetic memory of claim 1, wherein
a first pulse width of the first pulse is equal to a second pulse width of the second pulse.

8. The magnetic memory of claim 1, wherein
the magnetic member is provided above a substrate,
the first direction is a direction along a surface of the substrate, and
the second direction is a direction crossing the surface of the substrate.

9. The magnetic memory of claim 1, wherein
the magnetic member is provided above a substrate, and each of the first direction and the second direction is a direction along a surface of the substrate.

10. The magnetic memory of claim 1, wherein
the magnetic member has a cylindrical structure.

11. The magnetic memory of claim 1, wherein
the magnetic member has a plate-shaped structure.

12. The magnetic memory of claim 1, wherein
the magnetic member has a constriction structure.

13. The magnetic memory of claim 1, wherein
a first volume of the first portion is greater than a second volume of the third portion.

14. The magnetic memory of claim 1, wherein
the first current value has a magnitude for the domain wall to move into the fourth portion via the first portion, and
the second current value is less than the first current value and has a magnitude for the domain wall to move from the fourth portion into the second portion via the third portion.

15. The magnetic memory of claim 1, wherein
the first current value and the second current value have a relationship:

$$ia>A_L Jc>ib>A_S Jc$$

where ia is the first current value,
ib is the second current value,
Jc is a current density of a threshold current for moving the domain wall,
$A_L$ is a maximum value of a cross-sectional area of the first portion, and
$A_S$ is a maximum value of a cross-sectional area of the third portion.

16. A magnetic memory comprising:
a magnetic member including a first portion with a first dimension in a first direction, a second portion spaced from the first portion in a second direction crossing the first direction and having a second dimension in the first direction, a third portion provided between the first portion and the second portion and having a third dimension in the first direction, and a fourth portion provided between the first portion and the third portion and having a fourth dimension in the first direction; and
a circuit configured to supply a shift pulse including a first pulse and a second pulse to the magnetic member, and to move a domain wall in the magnetic member in the second direction,
wherein
a first current value of the first pulse and a second current value of the second pulse have a relationship:

$$ia>A_L Jc>ib>A_S Jc$$

where ia is the first current value,
ib is the second current value,
Jc is a current density of a threshold current for moving the domain wall,
$A_L$ is a maximum value of a cross-sectional area of the first portion, and
$A_S$ is a maximum value of a cross-sectional area of the third portion.

17. The magnetic memory of claim 16, wherein
the third dimension is less than the first dimension, and each of the second dimension and the fourth dimension is less than the third dimension.

18. The magnetic memory of claim 16, wherein
the second pulse is supplied to the magnetic member after the first pulse is supplied to the magnetic member.

19. The magnetic memory of claim 16, wherein
a first volume of the first portion is greater than a second volume of the third portion.

* * * * *

UNITED STATES PATENT AND TRADEMARK OFFICE
CERTIFICATE OF CORRECTION

PATENT NO. : 11,227,646 B2
APPLICATION NO. : 17/018332
DATED : January 18, 2022
INVENTOR(S) : Masahiro Koike et al.

It is certified that error appears in the above-identified patent and that said Letters Patent is hereby corrected as shown below:

On the Title Page

Item (57) Abstract, Line 2, "in first" should read as —in a first—.

Signed and Sealed this
Seventh Day of June, 2022

Katherine Kelly Vidal
*Director of the United States Patent and Trademark Office*